United States Patent
Oh

(10) Patent No.: US 11,122,102 B2
(45) Date of Patent: Sep. 14, 2021

(54) POINT CLOUD DATA TRANSMISSION APPARATUS, POINT CLOUD DATA TRANSMISSION METHOD, POINT CLOUD DATA RECEPTION APPARATUS AND POINT CLOUD DATA RECEPTION METHOD

(71) Applicant: LG Electronics Inc., Seoul (KR)

(72) Inventor: Sejin Oh, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/919,280

(22) Filed: Jul. 2, 2020

(65) Prior Publication Data

US 2021/0029187 A1 Jan. 28, 2021

Related U.S. Application Data

(60) Provisional application No. 62/870,664, filed on Jul. 3, 2019, provisional application No. 62/870,765, filed
(Continued)

(51) Int. Cl.
*G06F 15/16* (2006.01)
*H04L 29/06* (2006.01)
(Continued)

(52) U.S. Cl.
CPC ........ *H04L 65/607* (2013.01); *G06K 9/00597* (2013.01); *G06K 9/00671* (2013.01);
(Continued)

(58) Field of Classification Search
CPC .. H04L 65/601; H04L 65/607; H03M 7/3062; H03M 7/6005; H03M 7/6011; G06T 17/10; G06T 9/00
See application file for complete search history.

(56) References Cited

U.S. PATENT DOCUMENTS

| 2019/0080483 A1* | 3/2019 | Mammou | G06T 9/40 |
| 2019/0087978 A1* | 3/2019 | Tourapis | G06T 9/00 |

(Continued)

FOREIGN PATENT DOCUMENTS

| KR | 10-2016-0075553 A | 6/2016 |
| KR | 10-2017-0090531 A | 8/2017 |

(Continued)

OTHER PUBLICATIONS

Soros; Augmented Visualization; Dec. 10, 2010;Budapest University of Technology and Economics; 88 pages (Year: 2010).*

(Continued)

*Primary Examiner* — Richard G Keehn
(74) *Attorney, Agent, or Firm* — Dentons US LLP

(57) ABSTRACT

According to embodiments, point cloud data transmission method may include encoding point cloud data, encapsulating a bitstream that includes the encoded point cloud data and signaling data into a file, and transmitting the file, the bitstream is stored either in a single track or in multiple tracks of the file, the signaling data include at least one parameter set, and the encoded point cloud data include a geometry bitstream containing geometry data and an attribute bitstream containing attribute data.

16 Claims, 62 Drawing Sheets

Related U.S. Application Data on Jul. 4, 2019, provisional application No. 62/958,271, filed on Jan. 7, 2020.

(51) Int. Cl.
  *G06T 9/00* (2006.01)
  *H03M 7/30* (2006.01)
  *G06T 17/10* (2006.01)
  *G06K 9/00* (2006.01)
  *H03M 7/40* (2006.01)

(52) U.S. Cl.
  CPC ............... *G06T 9/00* (2013.01); *G06T 9/001* (2013.01); *G06T 17/10* (2013.01); *H03M 7/3062* (2013.01); *H03M 7/3075* (2013.01); *H03M 7/4006* (2013.01); *H03M 7/6005* (2013.01); *H03M 7/6011* (2013.01); *H04L 65/4069* (2013.01); *H04L 65/601* (2013.01); *H04L 65/602* (2013.01)

(56) References Cited

U.S. PATENT DOCUMENTS

| | | | |
|---|---|---|---|
| 2019/0087979 A1* | 3/2019 | Mammou | H04N 19/597 |
| 2020/0104976 A1* | 4/2020 | Mammou | G06T 9/00 |
| 2020/0153885 A1* | 5/2020 | Lee | G06T 9/001 |
| 2020/0302650 A1* | 9/2020 | Aksu | G06T 9/00 |
| 2020/0396471 A1* | 12/2020 | Wang | G06T 9/00 |

FOREIGN PATENT DOCUMENTS

| | | | |
|---|---|---|---|
| WO | 2017/127220 A1 | 7/2017 | |
| WO | 2019/079032 A1 | 4/2019 | |
| WO | WO-2019079032 A1 * | 4/2019 | ........... H04N 21/816 |

OTHER PUBLICATIONS

Skupin et al.; Standardization status of 360 degree video coding and delivery; Mar. 1, 2018; IEEE; 9 pages. (Year: 2018).*

Jang et al.; Video-Based Point-Cloud-Compression Standard in MPEG: From Eidence Collection to Committee Draft [Standards in a Nutshell]; Apr. 26, 2019; IEEE Signal Processing Magazine; 8 pages. (Year: 2019).*

WD of ISO/IEC 23090-10 Carriage of PC data, ISO/IEC JTC1/SC29/WG 11, MPEG 126th meeting, Geneva, N18321, w18413, Apr. 12, 2019. See p. 1, 2, 7 (Year: 2019).*

International Search Report from PCT/KR2020/008761, dated Oct. 15, 2020.

Written Opinion of the ISA from PCT/KR2020/08761, dated Oct. 15, 2020.

* cited by examiner

FIG. 6
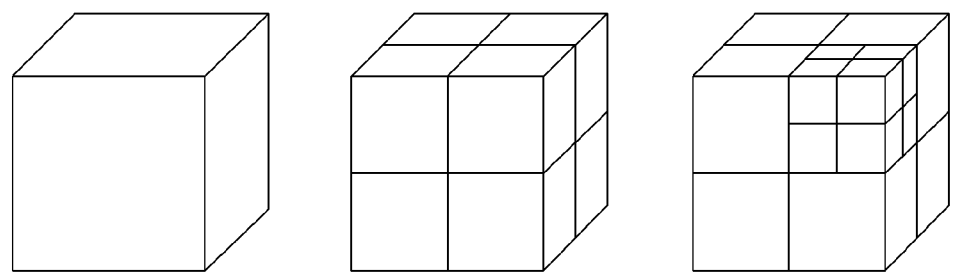
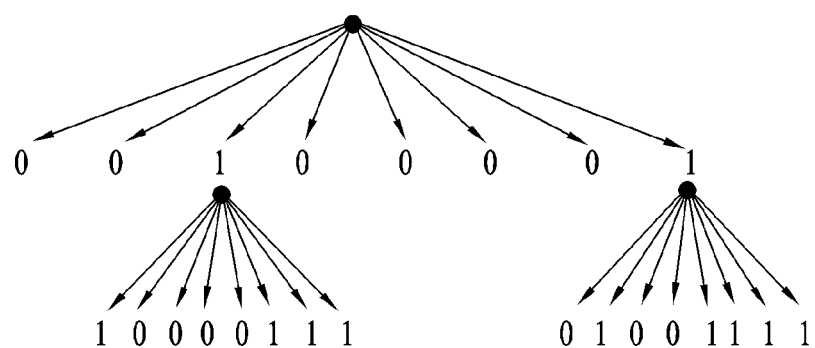

FIG. 7
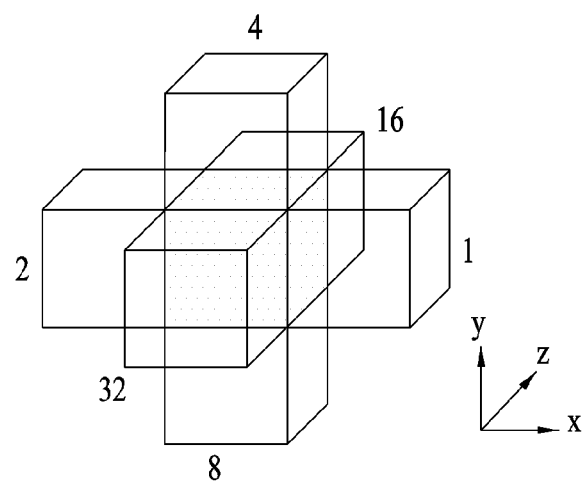
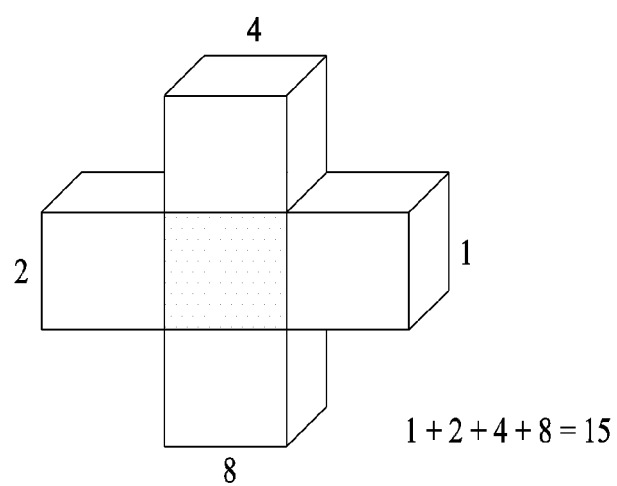
$1+2+4+8=15$

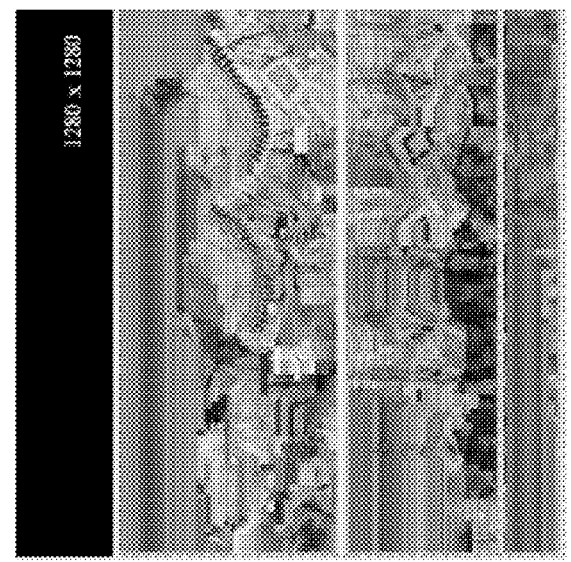
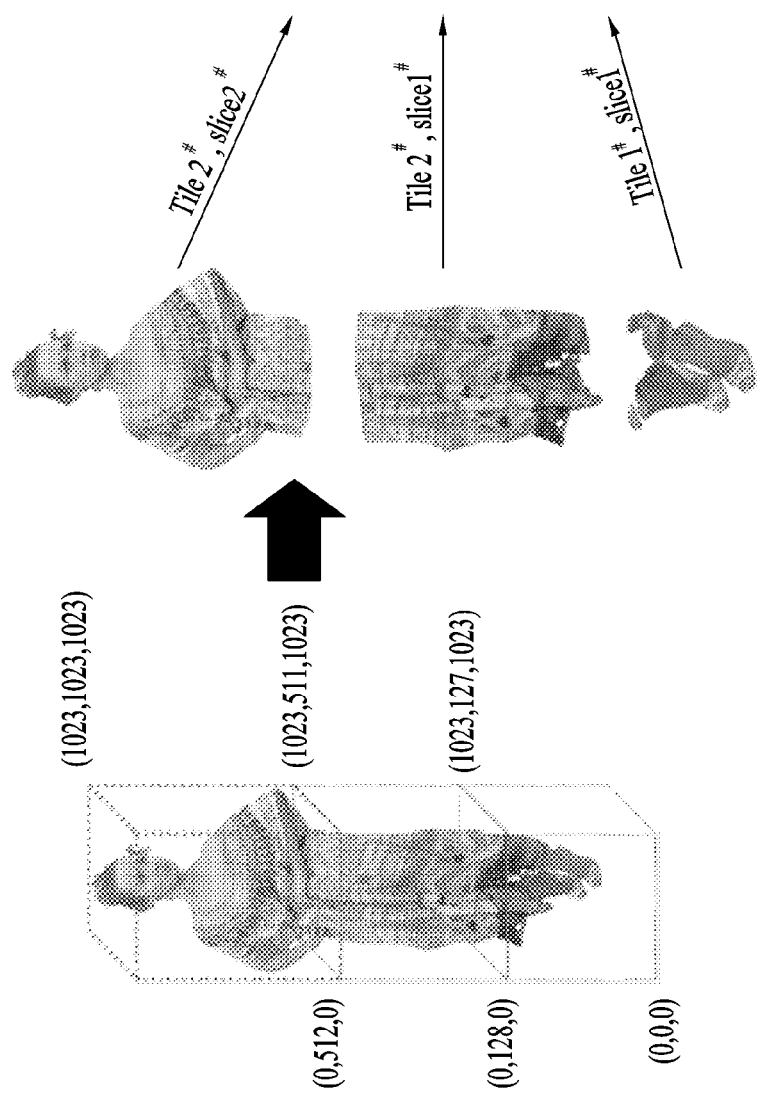
FIG. 19(c)
FIG. 19(b)
FIG. 19(a)

FIG. 24

| seq_parameter_set( ) { | Descriptor |
|---|---|
|   reserved_profile_compatibility_23bits | u(23) |
| [Ed. assign bits from this when there is a profile defined] | |
|   unique_point_positions_constraint_flag | u(1) |
|   level_idc | u(8) |
|   sps_bounding_box_present_flag | u(1) |
|   if( sps_bounding_box_present_flag ) { | |
|     sps_bounding_box_offset_x | se(v) |
|     sps_bounding_box_offset_y | se(v) |
|     sps_bounding_box_offset_z | se(v) |
|     sps_bounding_box_scale_factor | ue(v) |
|     sps_bounding_box_size_width | ue(v) |
|     sps_bounding_box_size_height | ue(v) |
|     sps_bounding_box_size_depth | ue(v) |
|   } | |
|   sps_source_scale_factor [Ed. TMC13 v7 uses float, but integer is preferred.] | u(32) |
|   sps_seq_parameter_set_id | ue(v) |
|   sps_num_attribute_sets | ue(v) |
|   for( i = 0; i< sps_num_attribute_sets; i++ ) { | |
|     attribute_dimension[ i ] | ue(v) |
|     attribute_instance_id[ i ] | ue(v) |
|     attribute_bitdepth[ i ] | ue(v) |
|     attribute_cicp_colour_primaries[ i ] | ue(v) |
|     attribute_cicp_transfer_characteristics[ i ] | ue(v) |
|     attribute_cicp_matrix_coeffs[ i ] | ue(v) |
|     attribute_cicp_video_full_range_flag[ i ] | u(1) |
|     known_attribute_label_flag[ i ] | u(1) |
|     if( known_attribute_label_flag[ i ] ) | |
|       known_attribute_label[ i ] | ue(v) |
|     else | |
|       attribute_label_four_bytes[ i ] | u(32) |
|   } | |
|   log2_max_frame_idx | u(5) |
|   axis_coding_order | u(3) |
|   sps_bypass_stream_enabled_flag | u(1) |
|   sps_extension_present_flag | u(1) |
|   if( sps_extension_present_flag ) | |
|     while( more_data_in_byte_stream( ) ) | |
|       sps_extension_data_flag | u(1) |
|   byte_alignment( ) | |
| } | |

FIG. 25

| attribute_label_four_bytes[ i ] | Attribute type |
|---|---|
| 0 | Colour |
| 1 | Reflectance |
| 2 | Frame index |
| 0xffffffff | unspecified |

FIG. 26

| axis_coding_order | X | Y | Z |
|---|---|---|---|
| 0 | 2 | 1 | 0 |
| 1 | 0 | 1 | 2 |
| 2 | 0 | 2 | 1 |
| 3 | 2 | 0 | 1 |
| 4 | 2 | 1 | 0 |
| 5 | 1 | 2 | 0 |
| 6 | 1 | 0 | 2 |
| 7 | 0 | 1 | 2 |

FIG. 27

| geometry_parameter_set( ) { | Descriptor |
|---|---|
| gps_geom_parameter_set_id | ue(v) |
| gps_seq_parameter_set_id | ue(v) |
| gps_box_present_flag | u(1) |
| if( gps_box_present_flag ){ | |
|    gps_gsh_box_log2_scale_present_flag | u(1) |
|    if( gps_gsh_box_log2_scale_present_flag == 0 ) | |
|      gps_gsh_box_log2_scale | ue(v) |
| } | |
| unique_geometry_points_flag | u(1) |
| geometry_planar_mode_flag | u(1) |
| geom_planar_mode_th_IDCM | ue(v) |
| if( geometry_planar_mode_flag ){ | |
|    geom_planar_mode_th[0] | ue(v) |
|    geom_planar_mode_th[1] | ue(v) |
|    geom_planar_mode_th[2] | ue(v) |
| } | |
| neighbour_context_restriction_flag | u(1) |
| inferred_direct_coding_mode_enabled_flag | u(1) |
| bitwise_occupancy_coding_flag | u(1) |
| adjacent_child_contextualization_enabled_flag | u(1) |
| log2_neighbour_avail_boundary | ue(v) |
| log2_intra_pred_max_node_size | ue(v) |
| log2_trisoup_node_size | ue(v) |
| geom_scaling_enabled_flag | u(1) |
| if( geom_scaling_enabled_flag ) | |
|    geom_base_qp | ue(v) |
| gps_implicit_geom_partition_flag | u(1) |
| if( gps_implicit_geom_partition_flag ) { | |
|    gps_max_num_implicit_qtbt_before_ot | ue(v) |
|    gps_min_size_implicit_qtbt | ue(v) |
| } | |
| gps_extension_present_flag | u(1) |
| if( gps_extension_present_flag ) | |
|    while( more_data_in_byte_stream( ) ) | |
|      gps_extension_data_flag | u(1) |
| byte_alignment( ) | |
| } | |

FIG. 28

| attribute_parameter_set( ) { | Descriptor |
|---|---|
|   aps_attr_parameter_set_id | ue(v) |
|   aps_seq_parameter_set_id | ue(v) |
|   attr_coding_type | ue(v) |
|   aps_attr_initial_qp | ue(v) |
|   aps_attr_chroma_qp_offset | se(v) |
|   aps_slice_qp_delta_present_flag | u(1) |
|   LodParametersPresent = ( attr_coding_type == 0 \|\| attr_coding_type == 2 ) ? 1 : 0 | |
|   if( LodParametersPresent) { | |
|     lifting_num_pred_nearest_neighbours | ue(v) |
|     lifting_search_range_minus1 | ue(v) |
|     lifting_num_detail_levels_minus1<br>[Ed. The V7.0 code use the variable without minus1. It should be aligned] | ue(v) |
|     for( k = 0; k < 3; k++ ) | |
|       lifting_neighbour_bias[ k ] | ue(v) |
|     if ( attr_coding_type == 2 ) | |
|       lifting_scalability_enabled_flag | u(1) |
|     if ( ! lifting_scalability_enabled_flag ) { | |
|       lifting_lod_regular_sampling_enabled_flag | u(1) |
|       for( idx = 0; idx <= num_detail_levels_minus1; idx++ ) { | |
|         if ( lifting_lod_decimation_enabled_flag ) | |
|         lifting_sampling_period[ idx ] | ue(v) |
|         else | |
|         lifting_sampling_distance_squared[ idx ] | ue(v) |
|       } | |
|     } | |
|     if( attr_coding_type == 0 ) { | |
|       lifting_adaptive_prediction_threshold | ue(v) |
|       lifting_intra_lod_prediction_num_layers | ue(v) |
|       lifting_max_num_direct_predictors | ue(v) |
|       inter_component_prediction_enabled_flag | u(1) |
|     } | |
|   } | |
|   if( attribute_coding_type == 1 ) { //RAHT | |
|     raht_prediction_enabled_flag | u(1) |
|     raht_depth_minus1 | ue(v) |
|   } | |
|   aps_extension_present_flag | u(1) |
|   if( aps_extension_present_flag ) | |
|     while( more_data_in_byte_stream( ) ) | |
|       aps_extension_data_flag | u(1) |
|   byte_alignment( ) | |
| } | |

FIG. 29

| attr_coding_type | coding type |
|---|---|
| 0 | Predicting Weight Lifting |
| 1 | Region Adaptive Hierarchical Transform (RAHT) |
| 2 | Fix Weight Lifting |

FIG. 30

| tile_inventory( ) { | Descriptor |
|---|---|
| num_tiles | ue(v) |
| for( i = 0; i < num_tiles; i++ ) { | |
|   tile_id[ i ] | se(v) |
|   tile_bounding_box_offset_x[ i ] | se(v) |
|   tile_bounding_box_offset_y[ i ] | se(v) |
|   tile_bounding_box_offset_z[ i ] | se(v) |
|   tile_bounding_box_size_width[ i ] | ue(v) |
|   tile_bounding_box_size_height[ i ] | ue(v) |
|   tile_bounding_box_size_depth[ i ] | ue(v) |
| } | |
| byte_alignment( ) | |
| } | |

FIG. 31

| frame_boundary_marker( ) { | Descriptor |
|---|---|
| /* this syntax structure is intentionally empty */ | |
| } | |

FIG. 32

| geometry_slice_bitstream( ) { | Descriptor |
|---|---|
| geometry_slice_header( ) | |
| geometry_slice_data( ) | |
| } | |

FIG. 33

| geometry_slice_header( ) { | Descriptor |
|---|---|
| gsh_geometry_parameter_set_id | ue(v) |
| gsh_tile_id | ue(v) |
| gsh_slice_id | ue(v) |
| frame_idx | u(n) |
| if( gps_box_present_flag ) { | |
|   if( gps_gsh_box_log2_scale_present_flag ) | |
|     gsh_box_log2_scale | ue(v) |
| gsh_box_origin_x | ue(v) |
| gsh_box_origin_y | ue(v) |
| gsh_box_origin_z | ue(v) |
| } | |
| if ( gps_implicit_geom_partition_flag ) { | |
|   gsh_log2_max_nodesize_x | ue(v) |
|   gsh_log2_max_nodesize_y_minus_x | se(v) |
|   gsh_log2_max_nodesize_z_minus_y | se(v) |
| } else { | |
|   gsh_log2_max_nodesize | ue(v) |
| } | |
| gsh_num_points | ue(v) |
| if( geom_scaling_enabled_flag ) { | |
|   [Ed: this should be last in the gsh?] | |
| geom_slice_qp_offset | se(v) |
| geom_octree_qp_offsets_enabled_flag | u(1) |
| if( geom_octree_qp_offsets_enabled_flag ) | |
|   geom_octree_qp_offsets_depth | ue(v) |
| } | |
| byte_alignment( ) | |
| } | |

FIG. 34

| geometry_slice_data( ) { | Descriptor |
|---|---|
|  for( depth = 0; depth < MaxGeometryOctreeDepth; depth++ ) { | |
|   for( nodeIdx = 0; nodeIdx < NumNodesAtDepth[ depth ]; nodeIdx++ ) { | |
|    xN = NodeX[ depth ][ nodeIdx ] | |
|    yN = NodeY[ depth ][ nodeIdx ] | |
|    zN = NodeZ[ depth ][ nodeIdx ] | |
|    geometry_node( depth, nodeIdx, xN, yN, zN ) | |
|   } | |
|  } | |
|  if ( log2_trisoup_node_size > 0 ) | |
|   geometry_trisoup_data( ) | |
| } | |

FIG. 35

| attribute_slice_bitstream( ) { | Descriptor |
|---|---|
| attribute_slice_header( ) | |
| attribute_slice_data( ) | |
| } | |

FIG. 36

| attribute_slice_header( ) { | Descriptor |
|---|---|
|   ash_attr_parameter_set_id | ue(v) |
|   ash_attr_sps_attr_idx | ue(v) |
|   ash_attr_geom_slice_id | ue(v) |
|   if ( aps_slice_qp_delta_present_flag ) { | |
|     ash_attr_qp_delta_luma | se(v) |
|     ash_attr_qp_delta_chroma | se(v) |
|   } | |
|   ash_attr_layer_qp_delta_present_flag | u(1) |
|   if ( ash_attr_layer_qp_delta_present_flag ) { | |
|     numLayers = aps.attr_encoding = = 1 ? aps.raht_depth + 1 : aps.num_detail_levels + 1 | |
|     for( i = 0; i < numLayers; i++ ){ | |
|       ash_attr_layer_qp_delta_luma[i] | se(v) |
|       ash_attr_layer_qp_delta_chroma[i] | se(v) |
|     } | |
|   } | |
|   ash_attr_region_qp_delta_present_flag | u(1) |
|   if ( ash_attr_region_qp_delta_present_flag ) { | |
|     ash_attr_qp_region_box_origin_x | ue(v) |
|     ash_attr_qp_region_box_origin_y | ue(v) |
|     ash_attr_qp_region_box_origin_z | ue(v) |
|     ash_attr_qp_region_box_width | ue(v) |
|     ash_attr_qp_region_box_height | ue(v) |
|     ash_attr_qp_region_box_depth | ue(v) |
|     ash_attr_region_qp_delta | se(v) |
|   } | |
|   byte_alignment( ) | |
| } | |

FIG. 37

| attribute_slice_data( ) { | Descriptor |
|---|---|
|     dimension = attribute_dimension[ ash_attr_sps_attr_idx ] | |
|     zerorun | ae(v) |
|     for( i = 0; i < pointCount; i++ ) { | |
|         if( attr_coding_type == 0 && <br>            maxPredDiff[ i ] > lifting_adaptive_prediction_threshold && <br>            MaxNumPredictors > 1 ) { | |
|             predIndex[ i ] | ae(v) |
|         } | |
|         if( zerorun > 0 ) { | |
|             for( k = 0; k < dimension ; k++ ) | |
|                 values[ k ][ i ] = 0 | |
|             zerorun -= 1 | |
|         } | |
|         else { | |
|             attribute_coding( dimension, i ) | ae(v) |
|             zerorun | ae(v) |
|         } | |
|     } | |
|     byte_alignment( ) | |
| } | |

FIG. 38

| metadata_slice_bitstream( ) { | Descriptor |
|---|---|
|     metadata_slice_header( ) | |
|     metadata_slice_data( ) | |
| } | |

FIG. 39

| metadata_slice_header( ) { | Descriptor |
|---|---|
| msh_slice_id | ue(v) |
| msh_geom_slice_id | ue(v) |
| msh_attr_id | ue(v) |
| msh_attr_slice_id | ue(v) |
| } | |

FIG. 40

| metadata_slice_data( ) { | Descriptor |
|---|---|
| metadata_bitstream( ) | |
| } | |

FIG. 42

| tlv_encapsulation( ) { | Descriptor |
|---|---|
| tlv_type | u(8) |
| tlv_num_payload_bytes | u(32) |
| for( i = 0; i < tlv_num_payload_bytes; i++ ) | |
| tlv_payload_byte[ i ] | u(8) |
| } | |

FIG. 43

| tlv_type | Description |
|---|---|
| 0 | Sequence parameter set |
| 1 | Geometry parameter set |
| 2 | Geometry Slice |
| 3 | Attribute parameter set |
| 4 | Attribute Slice |
| 5 | Tile inventory |
| 6 | Frame boundary marker |
| 7 | Metadata Slice |

FIG. 45

| TLV encapsulation structure (Parameter Set #1, if present) | ... | TLV encapsulation structure (Parameter Set #M, if present) | TLV encapsulation structure (Geometry Slice) | TLV encapsulation structure (Attribute Slice #1, if present) | ... | TLV encapsulation structure (Attribute Slice #N, if present) |

Sample

FIG. 48

| gpcc_type value | Description |
|---|---|
| 1 | Reserved |
| 2 | Geometry Data |
| 3 | Reserved |
| 4 | Attribute Data |
| 5..31 | Reserved. |

FIG. 50

| gpcc_unit() { | Descriptor |
|---|---|
| gpcc_unit_header_not_included | u(1) |
| if(!gpcc_unit_header_not_included)<br>gpcc_unit_header( ) | |
| gpcc_unit_payload( ) | |
| } | |

FIG. 51

| gpcc_unit_header( ) { | Descriptor |
|---|---|
| gpcc_unit_type | u(5) |
| if(gpcc_unit_type == GPCC_AS){ | |
| attribute_id | u(16) |
| reserved | u(12) |
| } else{ | |
| reserved | u(28) |
| } | |
| } | |

FIG. 52

| gpcc_unit_type | Identifier | G-PCC Unit Type |
|---|---|---|
| 0 | GPCC_SPS | Sequence parameter set |
| 1 | GPCC_GPS | Geometry parameter set |
| 2 | GPCC_APS | Attribute parameter set |
| 3 | GPCC_TPS | Tile parameter set |
| 4 | GPCC_GS | Geometry Slice |
| 5 | GPCC_AS | Attribute Slice |
| 6 | GPCC_MS | Metadata Slice |
| 7...31 | GPCC_RSVD | Reserved |

FIG. 53

| gpcc_unit_payload( ) {                          | Descriptor |
|---|---|
|     if( gpcc_unit_type == GPCC_SPS )     |            |
| sequence_parameter_set( )                       |            |
|     else if( gpcc_unit_type == GPCC_GPS )|            |
| geometry_parameter_set( )                       |            |
|     else if( gpcc_unit_type == GPCC_APS )|            |
| attribue_parameter_set( )                       |            |
|     else if( gpcc_unit_type == GPCC_TPS )|            |
| tile_parameter_set( )                           |            |
|     else if( gpcc_unit_type == GPCC_GS ) |            |
| geometry_slice_bitstream( )                     |            |
|     else if( gpcc_unit_type == GPCC_AS ) |            |
| attribute_slice_bitstream( )                    |            |
|     else if( gpcc_unit_type == GPCC_MS ) |            |
| metadata_slice_bitstream( )                     |            |
| }                                               |            |

FIG. 54

| sample_stream_gpcc_unit() { | Descriptor |
|---|---|
| ss_gpcc_unit_size | u(v) |
| gpcc_unit() | |
| } | |

//POINT CLOUD DATA TRANSMISSION APPARATUS, POINT CLOUD DATA TRANSMISSION METHOD, POINT CLOUD DATA RECEPTION APPARATUS AND POINT CLOUD DATA RECEPTION METHOD

Pursuant to 35 U.S.C. § 119(e), this application claims the benefit of earlier filing date and right of priority to U.S. Provisional Applications Nos. 62/870,664, 62/870,765 and 62/958,271, filed on Jul. 3, Jul. 4, 2019 and Jan. 7, 2020, the contents of which are hereby incorporated by reference herein in their entirety.

TECHNICAL FIELD

Embodiments relate to a method and apparatus for processing point cloud content.

BACKGROUND ART

Point cloud content is content represented by a point cloud, which is a set of points belonging to a coordinate system representing a three-dimensional space. The point cloud content may express media configured in three dimensions, and is used to provide various services such as virtual reality (VR), augmented reality (AR), mixed reality (MR), XR (Extended Reality), and self-driving services. However, tens of thousands to hundreds of thousands of point data are required to represent point cloud content. Therefore, there is a need for a method for efficiently processing a large amount of point data.

DISCLOSURE

Technical Problem

An object of the present disclosure devised to solve the above-described problems is to provide a point cloud data transmission device, a point cloud data transmission method, a point cloud data reception device, and a point cloud data reception method for efficiently transmitting and receiving a point cloud.

Another object of the present disclosure is to provide a point cloud data transmission device, a point cloud data transmission method, a point cloud data reception device, and a point cloud data reception method for addressing latency and encoding/decoding complexity.

Another object of the present disclosure is to provide a point cloud data transmission device, a point cloud data transmission method, a point cloud data reception device, and a point cloud data reception method for efficiently transmitting and receiving a geometry-point cloud compression (G-PCC) bitstream.

Another object of the present disclosure is to provide a point cloud data transmission device, a point cloud data transmission method, a point cloud data reception device, and a point cloud data reception method for efficiently storing a G-PCC bitstream in a single track in a file and efficiently accessing the stored G-PCC bitstream.

Another object of the present disclosure is to provide a point cloud data transmission device, a point cloud data transmission method, a point cloud data reception device, and a point cloud data reception method for efficiently storing a G-PCC bitstream in multiple tracks in a file and efficiently accessing the stored G-PCC bitstream.

Objects of the present disclosure are not limited to the aforementioned objects, and other objects of the present disclosure which are not mentioned above will become apparent to those having ordinary skill in the art upon examination of the following description.

Technical Solution

To achieve these objects and other advantages and in accordance with the purpose of the disclosure, as embodied and broadly described herein, a method of transmitting point cloud data may include encoding point cloud data, encapsulating a bitstream that includes the encoded point cloud data and signaling data into a file, and transmitting the file. According to embodiments, the bitstream may be stored either in a single track or in multiple tracks of the file, the signaling data may include at least one parameter set, and the encoded point cloud data may include a geometry bitstream containing geometry data and an attribute bitstream containing attribute data.

According to embodiments, the bitstream may be comprised of data units, each data unit may include type information, length information and a payload.

According to embodiments, the type information may indicate a type of data in the payload, the length information may indicate a length of the payload and the payload may include one of the at least one parameter set, the geometry bitstream, and the attribute bitstream.

According to embodiments, when the bitstream comprised of the data units is stored in the single track, the geometry bitstream and the attribute bitstream may be stored in a sample of the single track and the at least one parameter set may be stored in at least one of a sample entry and the sample of the single track.

According to embodiments, when the sample stores multiple data units, each data unit may be stored as each sub-sample and the sample entry may include information for indicating a type of each sub-sample.

According to embodiments, when the bitstream comprised of the data units is stored in the multiple tracks, the geometry bitstream and the attribute bitstream may be stored in a sample of a separate track, respectively, and the at least one parameter set may be stored in at least one of a sample entry and the sample of the separate track, respectively.

According to embodiments, a point cloud data transmission apparatus may include an encoder to encode point cloud data, an encapsulator to encapsulate a bitstream that includes the encoded point cloud data and signaling data into a file, and a transmitter to transmit the file.

According to embodiments, the bitstream may be stored either in a single track or in multiple tracks of the file, the signaling data may include at least one parameter set, and the encoded point cloud data may include a geometry bitstream containing geometry data and an attribute bitstream containing attribute data.

According to embodiments, the bitstream may be comprised of data units and each data unit may include type information, length information and a payload.

According to embodiments, the type information may indicate a type of data in the payload, the length information may indicate a length of the payload and the payload may include one of the at least one parameter set, the geometry bitstream, and the attribute bitstream.

According to embodiments, when the bitstream comprised of the data units is stored in the single track, the geometry bitstream and the attribute bitstream may be stored in a sample of the single track and the at least one parameter set may be stored in at least one of a sample entry and the sample of the single track.

According to embodiments, when the sample stores multiple data units, each data unit may be stored as each sub-sample and the sample entry may include information for indicating a type of each sub-sample.

According to embodiments, when the bitstream comprised of the data units is stored in the multiple tracks, the geometry bitstream and the attribute bitstream may be stored in a sample of a separate track, respectively, and the at least one parameter set may be stored in at least one of a sample entry and the sample of the separate track, respectively.

According to embodiments, a point cloud data reception method may include receiving a file, decapsulating a bitstream that is stored either in a single track or in multiple tracks of the file, the bitstream including point cloud data and signaling data, and decoding the point cloud data.

According to embodiments, the signaling data may include at least one parameter set, and the point cloud data may include a geometry bitstream containing geometry data and an attribute bitstream containing attribute data.

According to embodiments, a point cloud data reception apparatus may include a receiver to receive a file, a decapsulator to decapsulate a bitstream that is stored either in a single track or in multiple tracks of the file, the bitstream including point cloud data and signaling data, and a decoder to decode the point cloud data.

According to embodiments, the signaling data may include at least one parameter set, and the point cloud data may include a geometry bitstream containing geometry data and an attribute bitstream containing attribute data.

Advantageous Effects

A point cloud data transmission method, a point cloud data transmission device, a point cloud data reception method, and a point cloud data reception device according to embodiments may provide a good-quality point cloud service.

A point cloud data transmission method, a point cloud data transmission device, a point cloud data reception method, and a point cloud data reception device according to embodiments may achieve various video codec methods.

A point cloud data transmission method, a point cloud data transmission device, a point cloud data reception method, and a point cloud data reception device according to embodiments may provide universal point cloud content such as an autonomous driving service.

A point cloud data transmission method, a point cloud data transmission device, a point cloud data reception method, and a point cloud data reception device according to embodiments may perform space-adaptive partition of point cloud data for independent encoding and decoding of the point cloud data, thereby improving parallel processing and providing scalability.

A point cloud data transmission method, a point cloud data transmission device, a point cloud data reception method, and a point cloud data reception device according to embodiments may perform encoding and decoding by spatially partitioning the point cloud data in units of tiles and/or slices, and signal necessary data therefor, thereby improving encoding and decoding performance of the point cloud.

With a point cloud data transmission method, a point cloud data transmission device, a point cloud data reception method, and a point cloud data reception device according to embodiments, a G-PCC bitstream composed of Type-Length-Value (TLV) encapsulation structures including geometry, attributes, and signaling information may be stored in a single track or multiple tracks in a file, and the stored G-PCC bitstream may be efficiently accessed. Accordingly, performance of encoding and decoding of a point cloud may be improved.

With a point cloud data transmission method, a point cloud data transmission device, a point cloud data reception method, and a point cloud data reception device according to embodiments, a G-PCC bitstream composed of G-PCC units including geometry, attributes, and signaling information may be stored in a single track or multiple tracks in a file, the stored G-PCC bitstream may be efficiently accessed. Accordingly, performance of encoding and decoding of a point cloud may be improved.

With a point cloud data transmission method, a point cloud data transmission device, a point cloud data reception method, and a point cloud data reception device according to embodiments, when one sample is composed of multiple TLV encapsulation structures, each of the multiple TLV encapsulation structures may be stored as a subsample. Thereby, efficient access to the stored G-PCC bitstream may be supported.

With a point cloud data transmission method, a point cloud data transmission device, a point cloud data reception method, and a point cloud data reception device according to embodiments, when one sample is composed of multiple G-PCC units, each of the multiple G-PCC units may be stored as a subsample. Thereby, efficient access to the stored G-PCC bitstream may be supported.

A point cloud data transmission method, a point cloud data transmission device, a point cloud data reception method, and a point cloud data reception device according to embodiments may enable effective multiplexing of a G-PCC bitstream, and support efficient access to the G-PCC bitstream on a G-PCC access unit basis.

A point cloud data transmission method, a point cloud data transmission device, a point cloud data reception method, and a point cloud data reception device according to embodiments may allow metadata for data processing and rendering in the G-PCC bitstream to be transmitted in the bitstream.

With a point cloud data transmission method, a point cloud data transmission device, a point cloud data reception method, and a point cloud data reception device according to embodiments, a G-PCC bitstream may be partitioned and stored in one or more tracks in a file and signaled. In addition, signaling may be performed to indicate the relationship between the stored G-PCC bitstream and the one or more tracks, and a file containing a point cloud bitstream may be efficiently stored and transmitted through an indication of an alternative G-PCC track stored in the file.

DESCRIPTION OF DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 6 illustrates an example of octree and occupancy code according to embodiments.

FIG. 7 illustrates an example of a neighbor node pattern according to embodiments.

FIG. 19(a) to FIG. 19(c) illustrate an embodiment of partitioning a bounding box into one or more tiles.

FIG. 24 illustrates an embodiment of a syntax structure of a sequence parameter set according to embodiments.

FIG. 25 illustrates a table showing an example of attribute types allocated to attribute_label_four_bytes field according to embodiments.

FIG. 26 illustrates a table showing an example of X, Y, and Z axis values allocated to the axis_coding_order field according to embodiments.

FIG. 27 illustrates an embodiment of a syntax structure of a geometry parameter set according to embodiments.

FIG. 28 illustrates an embodiment of a syntax structure of an attribute parameter set according to embodiments.

FIG. 29 illustrates a table showing an example of attribute coding types allocated to attr_coding_type field according to embodiments.

FIG. 30 illustrates an embodiment of a syntax structure of a tile inventory according to embodiments.

FIG. 31 illustrates an embodiment of a syntax structure of a frame boundary marker according to embodiments.

FIG. 32 illustrates an embodiment of a syntax structure of geometry slice bitstream( ) according to embodiments.

FIG. 33 illustrates an embodiment of a syntax structure of geometry slice header according to embodiments.

FIG. 34 illustrates an embodiment of a syntax structure of geometry slice data according to embodiments.

FIG. 35 illustrates an embodiment of a syntax structure of attribute slice bitstream( ) according to embodiments.

FIG. 36 illustrates an embodiment of a syntax structure of attribute slice header according to embodiments.

FIG. 37 illustrates an embodiment of a syntax structure of attribute slice data according to embodiments.

FIG. 38 illustrates an embodiment of a syntax structure of metadata slice bitstream( ) according to embodiments.

FIG. 39 illustrates an embodiment of a syntax structure of metadata slice header according to embodiments.

FIG. 40 illustrates an embodiment of a syntax structure of metadata slice data according to embodiments.

FIG. 42 illustrates an exemplary syntax structure of type-length-value (TLV) encapsulation( ) according to embodiments.

FIG. 43 illustrates a table showing an example of tlv types allocated to tlv_type field according to embodiments.

FIG. 45 is a diagram illustrating an exemplary sample structure when a bitstream composed of TLV encapsulation structures is stored in a single track of a file according to embodiments.

FIG. 48 illustrates a table showing an example of component types allocated to gpcc_type field according to embodiments.

FIG. 50 illustrates an exemplary syntax structure of each G-PCC unit according to embodiments.

FIG. 51 illustrates an exemplary syntax structure of a G-PCC unit header according to embodiments.

FIG. 52 illustrates a table showing an example of G-PCC unit types allocated to gpcc_unit_type field according to embodiments.

FIG. 53 illustrates an exemplary syntax structure of a G-PCC unit payload according to embodiments.

FIG. 54 illustrates an exemplary syntax structure of sample_stream_gpcc_unit( ) according to embodiments.

FIG. 56 is a diagram illustrating an exemplary sample structure when a G-PCC bitstream composed of G-PCC units is stored in a single track according to embodiments.

FIG. 57 is a diagram illustrating an exemplary sub-sample structure when a G-PCC bitstream composed of G-PCC units is stored in a single track according to embodiments.

BEST MODE

Figure 1:
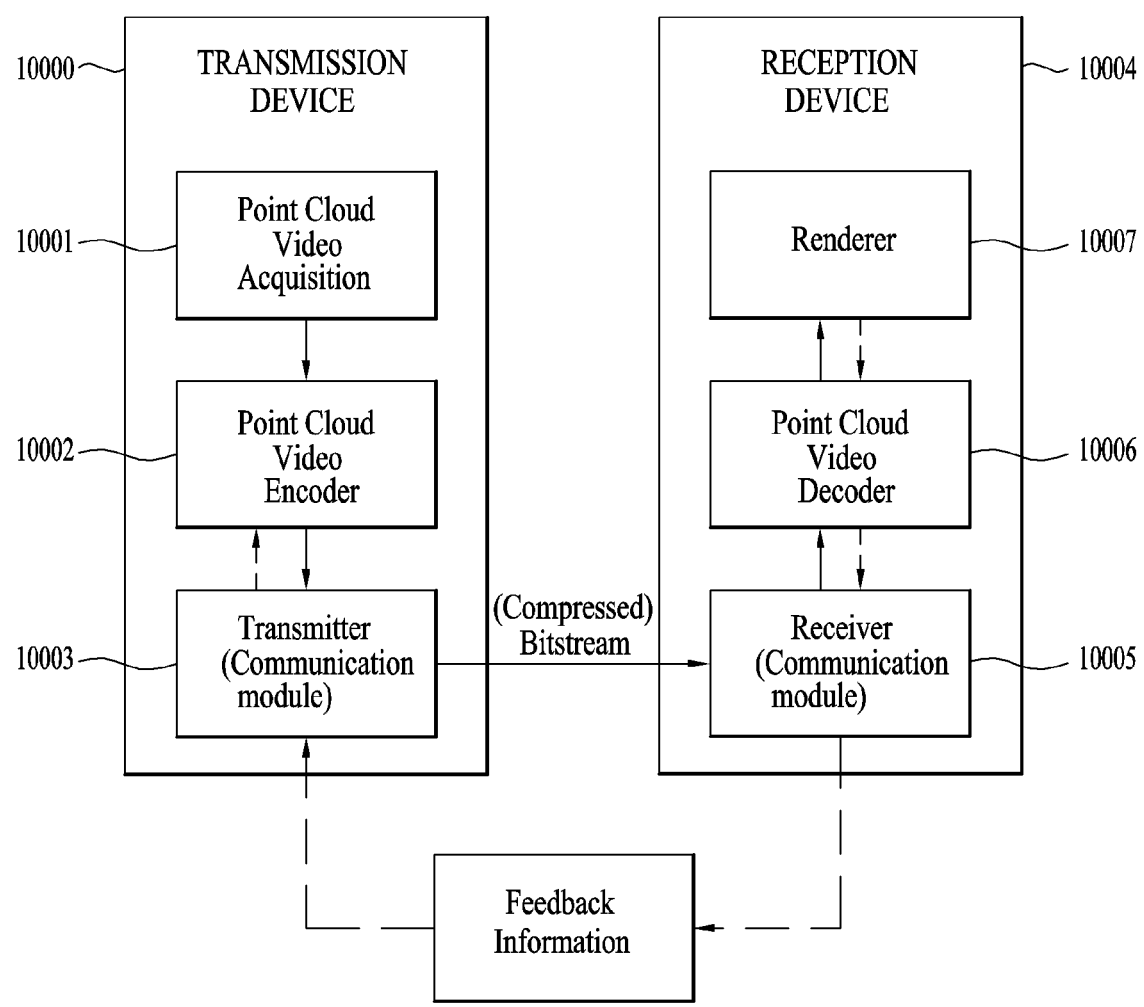
FIG. 1 illustrates an exemplary point cloud content providing system according to embodiments.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. It should be noted that the following examples are only for embodying the present disclosure and do not limit the scope of the present disclosure. What can be easily inferred by an expert in the technical field to which the present invention belongs from the detailed description and examples of the present disclosure is to be interpreted as being within the scope of the present disclosure.

The detailed description in this present specification should be construed in all aspects as illustrative and not restrictive. The scope of the disclosure should be determined by the appended claims and their legal equivalents, and all changes coming within the meaning and equivalency range of the appended claims are intended to be embraced therein.

Reference will now be made in detail to the preferred embodiments of the present disclosure, examples of which are illustrated in the accompanying drawings. The detailed description, which will be given below with reference to the accompanying drawings, is intended to explain exemplary embodiments of the present disclosure, rather than to show the only embodiments that can be implemented according to the present disclosure. The following detailed description includes specific details in order to provide a thorough understanding of the present disclosure. However, it will be apparent to those skilled in the art that the present disclosure may be practiced without such specific details. Although most terms used in this specification have been selected from general ones widely used in the art, some terms have been arbitrarily selected by the applicant and their meanings are explained in detail in the following description as needed. Thus, the present disclosure should be understood based upon the intended meanings of the terms rather than their simple names or meanings. In addition, the following drawings and detailed description should not be construed as being limited to the specifically described embodiments, but should be construed as including equivalents or substitutes of the embodiments described in the drawings and detailed description.

FIG. 1 shows an exemplary point cloud content providing system according to embodiments.

The point cloud content providing system illustrated in FIG. 1 may include a transmission device 10000 and a reception device 10004. The transmission device 10000 and the reception device 10004 are capable of wired or wireless communication to transmit and receive point cloud data.

The point cloud data transmission device 10000 according to the embodiments may secure and process point cloud video (or point cloud content) and transmit the same. According to embodiments, the transmission device 10000 may include a fixed station, a base transceiver system (BTS), a network, an artificial intelligence (AI) device and/or system, a robot, an AR/VR/XR device and/or server. According to embodiments, the transmission device 10000 may include a device, a robot, a vehicle, an AR/VR/XR device, a portable device, a home appliance, an Internet of Thing (IoT) device, and an AI device/server which are configured to perform communication with a base station and/or other wireless devices using a radio access technology (e.g., 5G New RAT (NR), Long Term Evolution (LTE)).

The transmission device 10000 according to the embodiments includes a point cloud video acquisition unit 10001, a point cloud video encoder 10002, and/or a transmitter (or communication module) 10003.

The point cloud video acquisition unit 10001 according to the embodiments acquires a point cloud video through a processing process such as capture, synthesis, or generation. The point cloud video is point cloud content represented by a point cloud, which is a set of points positioned in a 3D space, and may be referred to as point cloud video data. The point cloud video according to the embodiments may include one or more frames. One frame represents a still image/picture. Therefore, the point cloud video may include a point cloud image/frame/picture, and may be referred to as a point cloud image, frame, or picture.

The point cloud video encoder 10002 according to the embodiments encodes the acquired point cloud video data. The point cloud video encoder 10002 may encode the point cloud video data based on point cloud compression coding. The point cloud compression coding according to the embodiments may include geometry-based point cloud compression (G-PCC) coding and/or video-based point cloud compression (V-PCC) coding or next-generation coding. The point cloud compression coding according to the embodiments is not limited to the above-described embodiment. The point cloud video encoder 10002 may output a bitstream containing the encoded point cloud video data. The bitstream may contain not only the encoded point cloud video data, but also signaling information related to encoding of the point cloud video data.

The transmitter 10003 according to the embodiments transmits the bitstream containing the encoded point cloud video data. The bitstream according to the embodiments is encapsulated in a file or segment (for example, a streaming segment), and is transmitted over various networks such as a broadcasting network and/or a broadband network. Although not shown in the figure, the transmission device 10000 may include an encapsulator (or an encapsulation module) configured to perform an encapsulation operation. According to embodiments, the encapsulator may be included in the transmitter 10003. According to embodiments, the file or segment may be transmitted to the reception device 10004 over a network, or stored in a digital storage medium (e.g., USB, SD, CD, DVD, Blu-ray, HDD, SSD, etc.). The transmitter 10003 according to the embodiments is capable of wired/wireless communication with the reception device 10004 (or the receiver 10005) over a network of 4G, 5G, 6G, etc. In addition, the transmitter may perform a necessary data processing operation according to the network system (e.g., a 4G, 5G or 6G communication network system). The transmission device 10000 may transmit the encapsulated data in an on-demand manner.

The reception device 10004 according to the embodiments includes a receiver 10005, a point cloud video decoder 10006, and/or a renderer 10007. According to embodiments, the reception device 10004 may include a device, a robot, a vehicle, an AR/VR/XR device, a portable device, a home appliance, an Internet of Things (IoT) device, and an AI device/server which are configured to perform communication with a base station and/or other wireless devices using a radio access technology (e.g., 5G New RAT (NR), Long Term Evolution (LTE)).

The receiver 10005 according to the embodiments receives the bitstream containing the point cloud video data or the file/segment in which the bitstream is encapsulated from the network or storage medium. The receiver 10005 may perform necessary data processing according to the network system (for example, a communication network system of 4G, 5G, 6G, etc.). The receiver 10005 according to the embodiments may decapsulate the received file/segment and output a bitstream. According to embodiments, the receiver 10005 may include a decapsulator (or a decapsulation module) configured to perform a decapsulation operation. The decapsulator may be implemented as an element (or component) separate from the receiver 10005.

The point cloud video decoder 10006 decodes the bitstream containing the point cloud video data. The point cloud video decoder 10006 may decode the point cloud video data according to the method by which the point cloud video data is encoded (for example, in a reverse process of the operation of the point cloud video encoder 10002). Accordingly, the point cloud video decoder 10006 may decode the point cloud video data by performing point cloud decompression coding, which is the inverse process of the point cloud compression. The point cloud decompression coding includes G-PCC coding.

The renderer 10007 renders the decoded point cloud video data. The renderer 10007 may output point cloud content by rendering not only the point cloud video data but also audio data. According to embodiments, the renderer 10007 may include a display configured to display the point cloud content. According to embodiments, the display may be implemented as a separate device or component rather than being included in the renderer 10007.

The arrows indicated by dotted lines in the drawing represent a transmission path of feedback information acquired by the reception device 10004. The feedback information is information for reflecting interactivity with a user who consumes the point cloud content, and includes information about the user (e.g., head orientation information, viewport information, and the like). In particular, when the point cloud content is content for a service (e.g., self-driving service, etc.) that requires interaction with the user, the feedback information may be provided to the content transmitting side (e.g., the transmission device 10000) and/or the service provider. According to embodiments, the feedback information may be used in the reception device 10004 as well as the transmission device 10000, or may not be provided.

The head orientation information according to embodiments is information about the user's head position, orientation, angle, motion, and the like. The reception device 10004 according to the embodiments may calculate the viewport information based on the head orientation information. The viewport information may be information about a region of a point cloud video that the user is viewing. A viewpoint is a point through which the user is viewing the point cloud video, and may refer to a center point of the viewport region. That is, the viewport is a region centered on the viewpoint, and the size and shape of the region may be determined by a field of view (FOV). Accordingly, the reception device 10004 may extract the viewport information based on a vertical or horizontal FOV supported by the device in addition to the head orientation information. Also, the reception device 10004 performs gaze analysis or the like to check the way the user consumes a point cloud, a region that the user gazes at in the point cloud video, a gaze time, and the like. According to embodiments, the reception device 10004 may transmit feedback information including the result of the gaze analysis to the transmission device 10000. The feedback information according to the embodiments may be acquired in the rendering and/or display process. The feedback information according to the embodiments may be secured by one or more sensors included in the reception device 10004. According to embodiments, the feedback information may be secured by the renderer 10007 or a separate external element (or device, component, or the like). The dotted lines in FIG. 1 represent a process of transmitting the feedback information secured by the renderer 10007. The point cloud content providing system may process (encode/decode) point cloud data based on the feedback information. Accordingly, the point cloud video decoder 10006 may perform a decoding operation based on the feedback information. The reception device 10004 may transmit the feedback information to the transmission device 10000. The transmission device 10000 (or the point cloud video encoder 10002) may perform an encoding operation based on the feedback information. Accordingly, the point cloud content providing system may efficiently process necessary data (e.g., point cloud data corresponding to the user's head position) based on the feedback information rather than processing (encoding/decoding) the entire point cloud data, and provide point cloud content to the user.

According to embodiments, the transmission device 10000 may be called an encoder, a transmitting device, a transmitter, a transmission system, or the like, and the reception device 10004 may be called a decoder, a receiving device, a receiver, a reception system, or the like.

The point cloud data processed in the point cloud content providing system of FIG. 1 according to embodiments (through a series of processes of acquisition/encoding/transmission/decoding/rendering) may be referred to as point cloud content data or point cloud video data. According to embodiments, the point cloud content data may be used as a concept covering metadata or signaling information related to the point cloud data.

The elements of the point cloud content providing system illustrated in FIG. 1 may be implemented by hardware, software, a processor, and/or a combination thereof.

Figure 2:
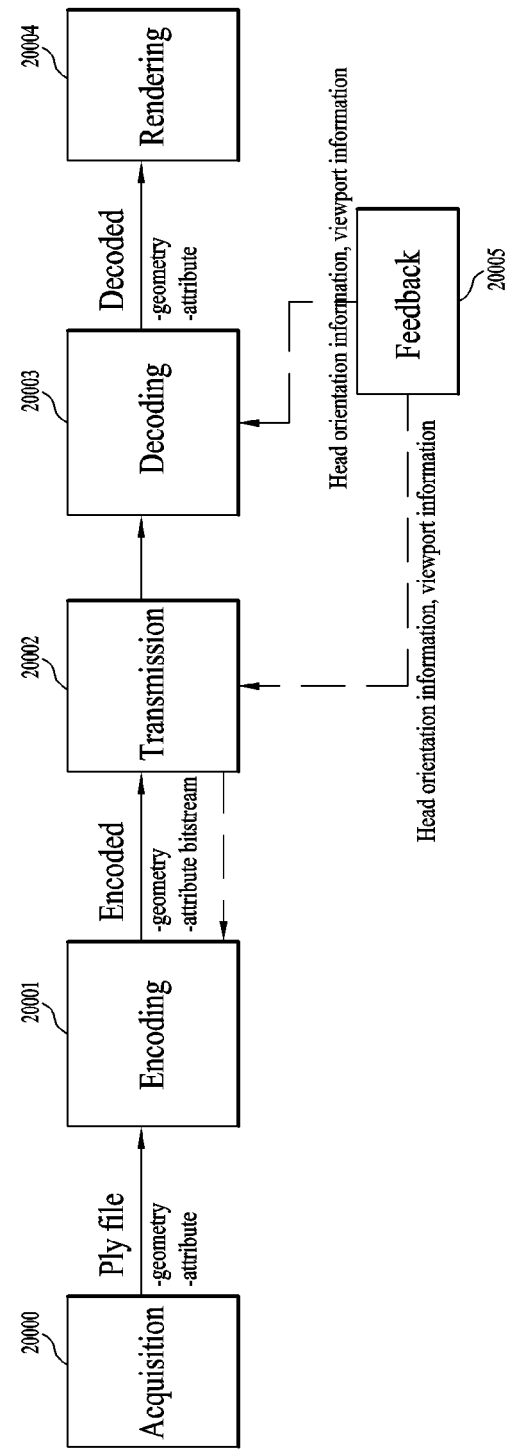
FIG. 2 is a block diagram illustrating a point cloud content providing operation according to embodiments.

FIG. 2 is a block diagram illustrating a point cloud content providing operation according to embodiments.

The block diagram of FIG. 2 shows the operation of the point cloud content providing system described in FIG. 1. As described above, the point cloud content providing system may process point cloud data based on point cloud compression coding (e.g., G-PCC).

The point cloud content providing system according to the embodiments (for example, the point cloud transmission device 10000 or the point cloud video acquisition unit 10001) may acquire a point cloud video (20000). The point cloud video is represented by a point cloud belonging to a coordinate system for expressing a 3D space. The point cloud video according to the embodiments may include a Ply (Polygon File format or the Stanford Triangle format) file. When the point cloud video has one or more frames, the acquired point cloud video may include one or more Ply files. The Ply files contain point cloud data, such as point geometry and/or attributes. The geometry includes positions of points. The position of each point may be represented by parameters (for example, values of the X, Y, and Z axes) representing a three-dimensional coordinate system (e.g., a coordinate system composed of X, Y and Z axes). The attributes include attributes of points (e.g., information about texture, color (in YCbCr or RGB), reflectance r, transparency, etc. of each point). A point has one or more attributes. For example, a point may have an attribute that is a color, or two attributes that are color and reflectance. According to embodiments, the geometry may be called positions, geometry information, geometry data, or the like, and the attribute may be called attributes, attribute information, attribute data, or the like. The point cloud content providing system (for example, the point cloud transmission device 10000 or the point cloud video acquisition unit 10001) may secure point cloud data from information (e.g., depth information, color information, etc.) related to the acquisition process of the point cloud video.

The point cloud content providing system (for example, the transmission device 10000 or the point cloud video encoder 10002) according to the embodiments may encode the point cloud data (20001). The point cloud content providing system may encode the point cloud data based on point cloud compression coding. As described above, the point cloud data may include the geometry and attributes of a point. Accordingly, the point cloud content providing system may perform geometry encoding of encoding the geometry and output a geometry bitstream. The point cloud content providing system may perform attribute encoding of encoding attributes and output an attribute bitstream. According to embodiments, the point cloud content providing system may perform the attribute encoding based on the geometry encoding. The geometry bitstream and the attribute bitstream according to the embodiments may be multiplexed and output as one bitstream. The bitstream according to the embodiments may further contain signaling information related to the geometry encoding and attribute encoding.

The point cloud content providing system (for example, the transmission device 10000 or the transmitter 10003) according to the embodiments may transmit the encoded point cloud data (20002). As illustrated in FIG. 1, the encoded point cloud data may be represented by a geometry bitstream and an attribute bitstream. In addition, the encoded point cloud data may be transmitted in the form of a bitstream together with signaling information related to encoding of the point cloud data (for example, signaling information related to the geometry encoding and the attribute encoding). The point cloud content providing system may encapsulate a bitstream that carries the encoded point cloud data and transmit the same in the form of a file or segment.

The point cloud content providing system (for example, the reception device 10004 or the receiver 10005) according to the embodiments may receive the bitstream containing the encoded point cloud data. In addition, the point cloud content providing system (for example, the reception device 10004 or the receiver 10005) may demultiplex the bitstream.

The point cloud content providing system (e.g., the reception device 10004 or the point cloud video decoder 10005) may decode the encoded point cloud data (e.g., the geometry bitstream, the attribute bitstream) transmitted in the bitstream. The point cloud content providing system (for example, the reception device 10004 or the point cloud video decoder 10005) may decode the point cloud video data based on the signaling information related to encoding of the point cloud video data contained in the bitstream. The point cloud content providing system (for example, the reception device 10004 or the point cloud video decoder 10005) may decode the geometry bitstream to reconstruct the positions (geometry) of points. The point cloud content providing system may reconstruct the attributes of the points by decoding the attribute bitstream based on the reconstructed geometry. The point cloud content providing system (for example, the reception device 10004 or the point cloud video decoder 10005) may reconstruct the point cloud video based on the positions according to the reconstructed geometry and the decoded attributes.

The point cloud content providing system according to the embodiments (for example, the reception device 10004 or the renderer 10007) may render the decoded point cloud data (20004). The point cloud content providing system (for example, the reception device 10004 or the renderer 10007) may render the geometry and attributes decoded through the decoding process, using various rendering methods. Points in the point cloud content may be rendered to a vertex having a certain thickness, a cube having a specific minimum size centered on the corresponding vertex position, or a circle centered on the corresponding vertex position. All or part of the rendered point cloud content is provided to the user through a display (e.g., a VR/AR display, a general display, etc.).

The point cloud content providing system (for example, the reception device 10004) according to the embodiments may secure feedback information (20005). The point cloud content providing system may encode and/or decode point cloud data based on the feedback information. The feedback information and the operation of the point cloud content providing system according to the embodiments are the same as the feedback information and the operation described with reference to FIG. 1, and thus detailed description thereof is omitted.

Figure 3:
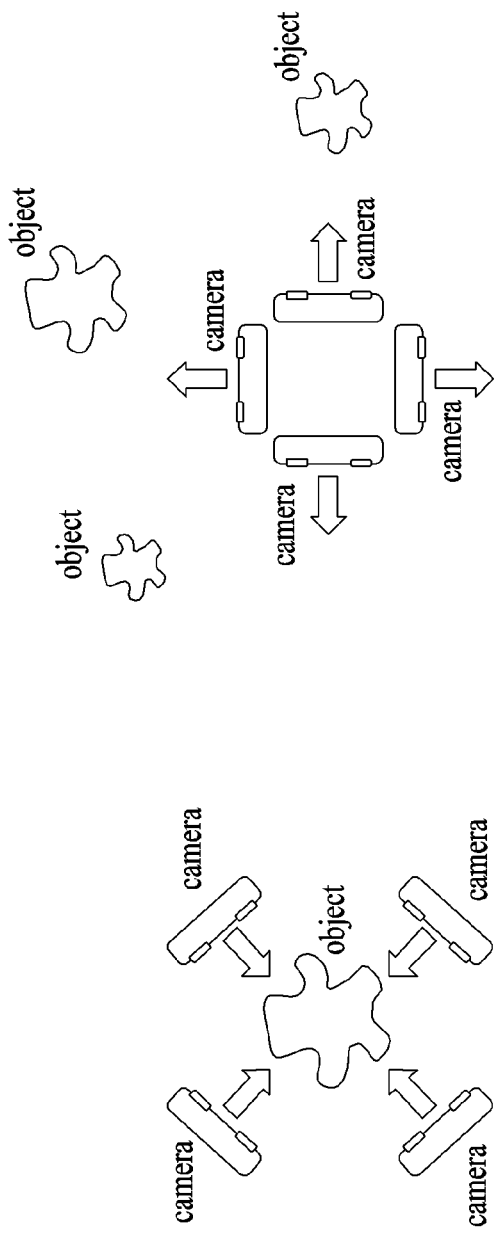
FIG. 3 illustrates an exemplary process of capturing a point cloud video according to embodiments.

FIG. 3 illustrates an exemplary process of capturing a point cloud video according to embodiments.

FIG. 3 illustrates an exemplary point cloud video capture process of the point cloud content providing system described with reference to FIGS. 1 to 2.

Point cloud content includes a point cloud video (images and/or videos) representing an object and/or environment located in various 3D spaces (e.g., a 3D space representing a real environment, a 3D space representing a virtual environment, etc.). Accordingly, the point cloud content providing system according to the embodiments may capture a point cloud video using one or more cameras (e.g., an infrared camera capable of securing depth information, an RGB camera capable of extracting color information corresponding to the depth information, etc.), a projector (e.g., an infrared pattern projector to secure depth information), a LiDAR, or the like. The point cloud content providing system according to the embodiments may extract the shape of geometry composed of points in a 3D space from the depth information and extract the attributes of each point from the color information to secure point cloud data. An image and/or video according to the embodiments may be captured based on at least one of the inward-facing technique and the outward-facing technique.

The left part of FIG. 3 illustrates the inward-facing technique. The inward-facing technique refers to a technique of capturing images a central object with one or more cameras (or camera sensors) positioned around the central object. The inward-facing technique may be used to generate point cloud content providing a 360-degree image of a key object to the user (e.g., VR/AR content providing a 360-degree image of an object (e.g., a key object such as a character, player, object, or actor) to the user).

The right part of FIG. 3 illustrates the outward-facing technique. The outward-facing technique refers to a technique of capturing images an environment of a central object rather than the central object with one or more cameras (or camera sensors) positioned around the central object. The outward-facing technique may be used to generate point cloud content for providing a surrounding environment that appears from the user's point of view (e.g., content representing an external environment that may be provided to a user of a self-driving vehicle).

As shown in the figure, the point cloud content may be generated based on the capturing operation of one or more cameras. In this case, the coordinate system may differ among the cameras, and accordingly the point cloud content providing system may calibrate one or more cameras to set a global coordinate system before the capturing operation. In addition, the point cloud content providing system may generate point cloud content by synthesizing an arbitrary image and/or video with an image and/or video captured by the above-described capture technique. The point cloud content providing system may not perform the capturing operation described in FIG. 3 when it generates point cloud content representing a virtual space. The point cloud content providing system according to the embodiments may perform post-processing on the captured image and/or video. In other words, the point cloud content providing system may remove an unwanted area (for example, a background), recognize a space to which the captured images and/or videos are connected, and, when there is a spatial hole, perform an operation of filling the spatial hole.

The point cloud content providing system may generate one piece of point cloud content by performing coordinate transformation on points of the point cloud video secured from each camera. The point cloud content providing system may perform coordinate transformation on the points based on the coordinates of the position of each camera. Accordingly, the point cloud content providing system may generate content representing one wide range, or may generate point cloud content having a high density of points.

Figure 4:
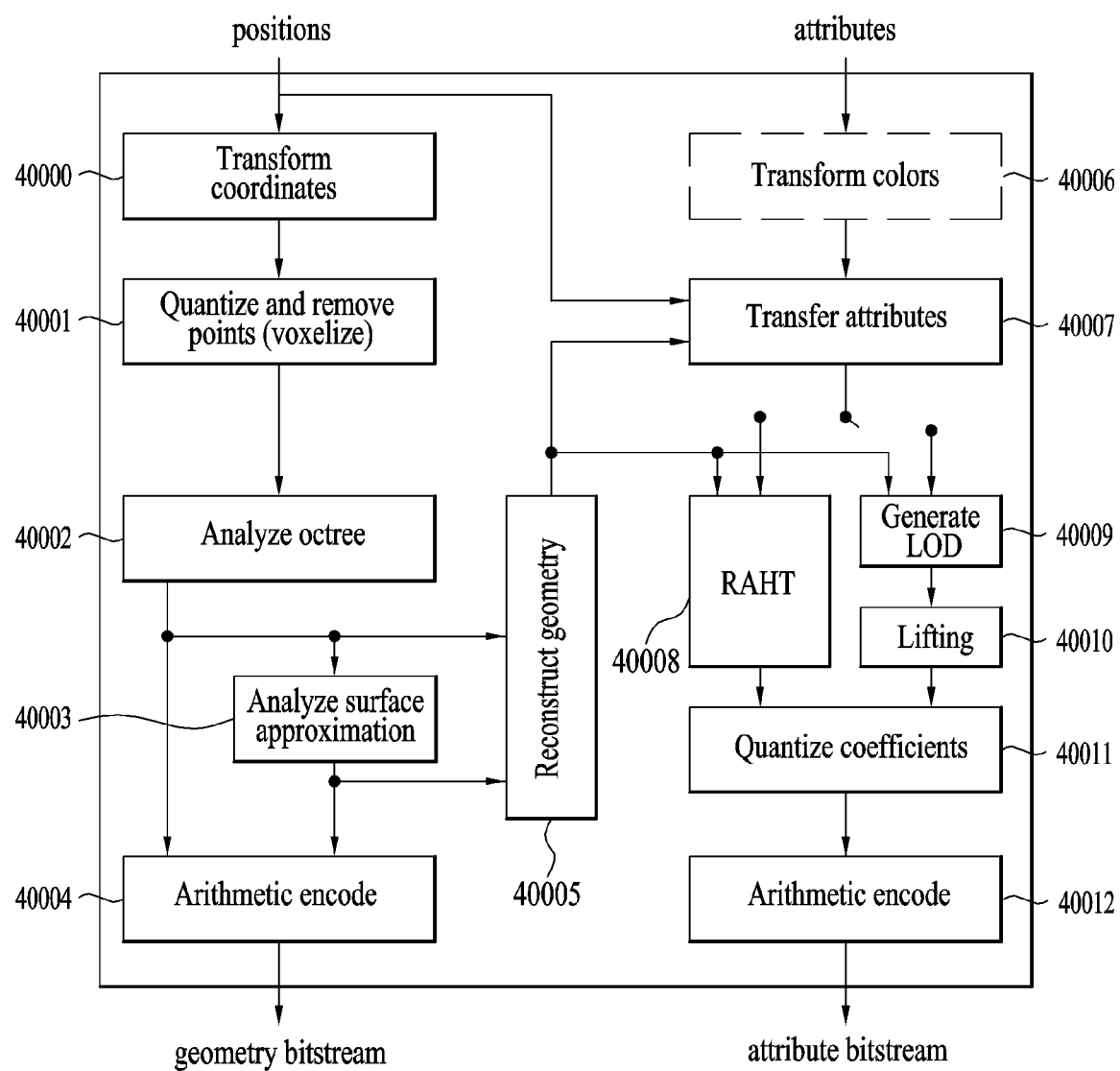
FIG. 4 illustrates an exemplary block diagram of point cloud video encoder according to embodiments.

FIG. 4 illustrates an exemplary point cloud video encoder according to embodiments.

FIG. 4 shows an example of the point cloud video encoder 10002 of FIG. 1. The point cloud video encoder reconstructs and encodes point cloud data (e.g., positions and/or attributes of the points) to adjust the quality of the point cloud content (to, for example, lossless, lossy, or near-lossless) according to the network condition or applications. When the overall size of the point cloud content is large (e.g., point cloud content of 60 Gbps is given for 30 fps), the point cloud content providing system may fail to stream the content in real time. Accordingly, the point cloud content providing system may reconstruct the point cloud content based on the maximum target bitrate to provide the same in accordance with the network environment or the like.

As described with reference to FIGS. 1 to 2, the point cloud video encoder may perform geometry encoding and attribute encoding. The geometry encoding is performed before the attribute encoding.

The point cloud video encoder according to the embodiments includes a coordinate transformer (Transform coordinates) 40000, a quantizer (Quantize and remove points (voxelize)) 40001, an octree analyzer (Analyze octree) 40002, and a surface approximation analyzer (Analyze surface approximation) 40003, an arithmetic encoder (Arithmetic encode) 40004, a geometric reconstructor (Reconstruct geometry) 40005, a color transformer (Transform colors) 40006, an attribute transformer (Transform attributes) 40007, a RAHT transformer (RAHT) 40008, an LOD generator (Generate LOD) 40009, a lifting transformer (Lifting) 40010, a coefficient quantizer (Quantize coefficients) 40011, and/or an arithmetic encoder (Arithmetic encode) 40012.

The coordinate transformer 40000, the quantizer 40001, the octree analyzer 40002, the surface approximation analyzer 40003, the arithmetic encoder 40004, and the geometry reconstructor 40005 may perform geometry encoding. The geometry encoding according to the embodiments may include octree geometry coding, direct coding, trisoup geometry encoding, and entropy encoding. The direct coding and trisoup geometry encoding are applied selectively or in combination. The geometry encoding is not limited to the above-described example.

As shown in the figure, the coordinate transformer 40000 according to the embodiments receives positions and transforms the same into coordinates. For example, the positions may be transformed into position information in a three-dimensional space (for example, a three-dimensional space represented by an XYZ coordinate system). The position information in the three-dimensional space according to the embodiments may be referred to as geometry information.

The quantizer 40001 according to the embodiments quantizes the geometry. For example, the quantizer 40001 may quantize the points based on a minimum position value of all points (for example, a minimum value on each of the X, Y, and Z axes). The quantizer 40001 performs a quantization operation of multiplying the difference between the minimum position value and the position value of each point by a preset quantization scale value and then finding the nearest integer value by rounding the value obtained through the multiplication. Thus, one or more points may have the same quantized position (or position value). The quantizer 40001 according to the embodiments performs voxelization based on the quantized positions to reconstruct quantized points. The voxelization means a minimum unit representing position information in 3D spacePoints of point cloud content (or 3D point cloud video) according to the embodiments may be included in one or more voxels. The term voxel, which is a compound of volume and pixel, refers to a 3D cubic space generated when a 3D space is divided into units (unit=1.0) based on the axes representing the 3D space (e.g., X-axis, Y-axis, and Z-axis). The quantizer 40001 may match groups of points in the 3D space with voxels. According to embodiments, one voxel may include only one point. According to embodiments, one voxel may include one or more points. In order to express one voxel as one point, the position of the center point of a voxel may be set based on the positions of one or more points included in the voxel. In this case, attributes of all positions included in one voxel may be combined and assigned to the voxel.

The octree analyzer 40002 according to the embodiments performs octree geometry coding (or octree coding) to present voxels in an octree structure. The octree structure represents points matched with voxels, based on the octal tree structure.

The surface approximation analyzer 40003 according to the embodiments may analyze and approximate the octree. The octree analysis and approximation according to the embodiments is a process of analyzing a region containing a plurality of points to efficiently provide octree and voxelization.

The arithmetic encoder 40004 according to the embodiments performs entropy encoding on the octree and/or the approximated octree. For example, the encoding scheme includes arithmetic encoding. As a result of the encoding, a geometry bitstream is generated.

The color transformer 40006, the attribute transformer 40007, the RAHT transformer 40008, the LOD generator 40009, the lifting transformer 40010, the coefficient quantizer 40011, and/or the arithmetic encoder 40012 perform attribute encoding. As described above, one point may have one or more attributes. The attribute encoding according to the embodiments is equally applied to the attributes that one point has. However, when an attribute (e.g., color) includes one or more elements, attribute encoding is independently applied to each element. The attribute encoding according to the embodiments includes color transform coding, attribute transform coding, region adaptive hierarchical transform (RAHT) coding, interpolation-based hierarchical nearest-neighbor prediction (prediction transform) coding, and interpolation-based hierarchical nearest-neighbor prediction with an update/lifting step (lifting transform) coding. Depending on the point cloud content, the RAHT coding, the prediction transform coding and the lifting transform coding described above may be selectively used, or a combination of one or more of the coding schemes may be used. The attribute encoding according to the embodiments is not limited to the above-described example.

The color transformer 40006 according to the embodiments performs color transform coding of transforming color values (or textures) included in the attributes. For example, the color transformer 40006 may transform the format of color information (for example, from RGB to YCbCr). The operation of the color transformer 40006 according to embodiments may be optionally applied according to the color values included in the attributes.

The geometry reconstructor 40005 according to the embodiments reconstructs (decompresses) the octree and/or the approximated octree. The geometry reconstructor 40005 reconstructs the octree/voxels based on the result of analyzing the distribution of points. The reconstructed octree/voxels may be referred to as reconstructed geometry (restored geometry).

The attribute transformer 40007 according to the embodiments performs attribute transformation to transform the attributes based on the reconstructed geometry and/or the positions on which geometry encoding is not performed. As described above, since the attributes are dependent on the geometry, the attribute transformer 40007 may transform the attributes based on the reconstructed geometry information. For example, based on the position value of a point included in a voxel, the attribute transformer 40007 may transform the attribute of the point at the position. As described above, when the position of the center of a voxel is set based on the positions of one or more points included in the voxel, the attribute transformer 40007 transforms the attributes of the one or more points. When the trisoup geometry encoding is performed, the attribute transformer 40007 may transform the attributes based on the trisoup geometry encoding.

The attribute transformer 40007 may perform the attribute transformation by calculating the average of attributes or attribute values of neighboring points (e.g., color or reflectance of each point) within a specific position/radius from the position (or position value) of the center of each voxel. The attribute transformer 40007 may apply a weight according to the distance from the center to each point in calculating the average. Accordingly, each voxel has a position and a calculated attribute (or attribute value).

The attribute transformer 40007 may search for neighboring points existing within a specific position/radius from the position of the center of each voxel based on the K-D tree or the Morton code. The K-D tree is a binary search tree and supports a data structure capable of managing points based on the positions such that nearest neighbor search (NNS) can be performed quickly. The Morton code is generated by presenting coordinates (e.g., (x, y, z)) representing 3D positions of all points as bit values and mixing the bits. For example, when the coordinates representing the position of a point are (5, 9, 1), the bit values for the coordinates are (0101, 1001, 0001). Mixing the bit values according to the bit index in order of z, y, and x yields 010001000111. This value is expressed as a decimal number of 1095. That is, the Morton code value of the point having coordinates (5, 9, 1) is 1095. The attribute transformer 40007 may order the points based on the Morton code values and perform NNS through a depth-first traversal process. After the attribute transformation operation, the K-D tree or the Morton code is used when the NNS is needed in another transformation process for attribute coding.

As shown in the figure, the transformed attributes are input to the RAHT transformer 40008 and/or the LOD generator 40009.

The RAHT transformer 40008 according to the embodiments performs RAHT coding for predicting attribute information based on the reconstructed geometry information. For example, the RAHT transformer 40008 may predict attribute information of a node at a higher level in the octree based on the attribute information associated with a node at a lower level in the octree.

The LOD generator 40009 according to the embodiments generates a level of detail (LOD). The LOD according to the embodiments is a degree of detail of point cloud content. As the LOD value decrease, it indicates that the detail of the point cloud content is degraded. As the LOD value increases, it indicates that the detail of the point cloud content is enhanced. Points may be classified by the LOD.

The lifting transformer 40010 according to the embodiments performs lifting transform coding of transforming the attributes a point cloud based on weights. As described above, lifting transform coding may be optionally applied.

The coefficient quantizer 40011 according to the embodiments quantizes the attribute-coded attributes based on coefficients.

The arithmetic encoder 40012 according to the embodiments encodes the quantized attributes based on arithmetic coding.

Although not shown in the figure, the elements of the point cloud video encoder of FIG. 4 may be implemented by hardware including one or more processors or integrated circuits configured to communicate with one or more memories included in the point cloud content providing apparatus, software, firmware, or a combination thereof. The one or more processors may perform at least one of the operations and/or functions of the elements of the point cloud video encoder of FIG. 4 described above. Additionally, the one or more processors may operate or execute a set of software programs and/or instructions for performing the operations and/or functions of the elements of the point cloud video encoder of FIG. 4. The one or more memories according to the embodiments may include a high speed random access memory, or include a non-volatile memory (e.g., one or more magnetic disk storage devices, flash memory devices, or other non-volatile solid-state memory devices).

Figure 5:
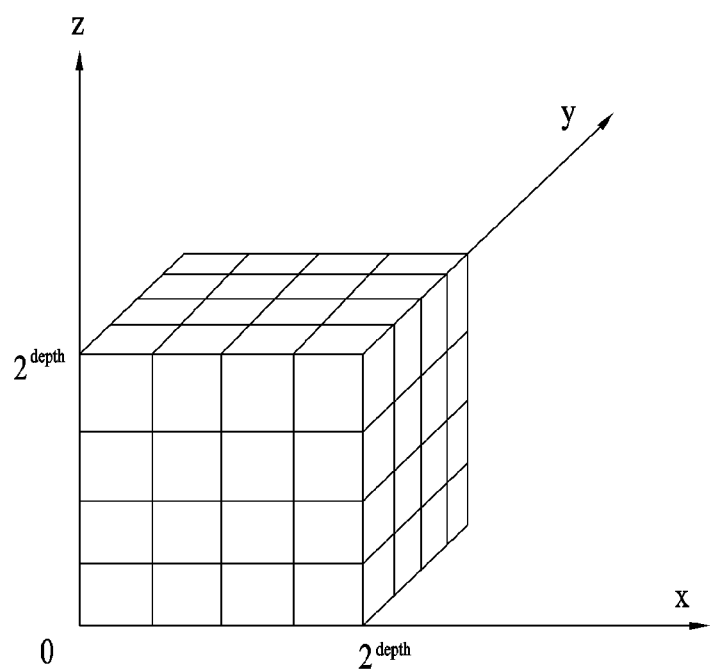
FIG. 5 illustrates an example of voxels in a 3D space according to embodiments.

FIG. 5 shows an example of voxels according to embodiments.

FIG. 5 shows voxels positioned in a 3D space represented by a coordinate system composed of three axes, which are the X-axis, the Y-axis, and the Z-axis. As described with reference to FIG. 4, the point cloud video encoder (e.g., the quantizer 40001) may perform voxelization. Voxel refers to a 3D cubic space generated when a 3D space is divided into units (unit=1.0) based on the axes representing the 3D space (e.g., X-axis, Y-axis, and Z-axis). FIG. 5 shows an example of voxels generated through an octree structure in which a cubical axis-aligned bounding box defined by two poles (0, 0, 0) and $(2^d, 2^d, 2^d)$ is recursively subdivided. One voxel includes at least one point. The spatial coordinates of a voxel may be estimated from the positional relationship with a voxel group. As described above, a voxel has an attribute (such as color or reflectance) like pixels of a 2D image/video. The details of the voxel are the same as those described with reference to FIG. 4, and therefore a description thereof is omitted.

FIG. 6 shows an example of an octree and occupancy code according to embodiments. As described with reference to FIGS. 1 to 4, the point cloud content providing system (point cloud video encoder 10002) or the octree analyzer 40002 of the point cloud video encoder performs octree geometry coding (or octree coding) based on an octree structure to efficiently manage the region and/or position of the voxel.

The upper part of FIG. 6 shows an octree structure. The 3D space of the point cloud content according to the embodiments is represented by axes (e.g., X-axis, Y-axis, and Z-axis) of the coordinate system. The octree structure is created by recursive subdividing of a cubical axis-aligned bounding box defined by two poles (0, 0, 0) and $(2^d, 2^d, 2^d)$. Here, $2^d$ may be set to a value constituting the smallest bounding box surrounding all points of the point cloud content (or point cloud video). Here, d denotes the depth of the octree. The value of d is determined in Equation 1. In Equation 1, $(x^{int}_n, y^{int}_n, z^{int}_n)$ denotes the positions (or position values) of quantized points.

$$d=\text{Ceil}(\text{Log } 2(\text{Max}(x_n^{int}, y_n^{int}, z_n^{int}, n=1, \ldots, N)+1))$$

As shown in the middle of the upper part of FIG. 6, the entire 3D space may be divided into eight spaces according to partition. Each divided space is represented by a cube with six faces. As shown in the upper right of FIG. 6, each of the eight spaces is divided again based on the axes of the coordinate system (e.g., X-axis, Y-axis, and Z-axis). Accordingly, each space is divided into eight smaller spaces. The divided smaller space is also represented by a cube with six faces. This partitioning scheme is applied until the leaf node of the octree becomes a voxel.

The lower part of FIG. 6 shows an octree occupancy code. The occupancy code of the octree is generated to indicate whether each of the eight divided spaces generated by dividing one space contains at least one point. Accordingly, a single occupancy code is represented by eight child nodes. Each child node represents the occupancy of a divided space, and the child node has a value in 1 bit. Accordingly, the occupancy code is represented as an 8-bit code. That is, when at least one point is contained in the space corresponding to a child node, the node is assigned a value of 1. When no point is contained in the space corresponding to the child node (the space is empty), the node is assigned a value of 0. Since the occupancy code shown in FIG. 6 is 00100001, it indicates that the spaces corresponding to the third child node and the eighth child node among the eight child nodes each contain at least one point. As shown in the figure, each of the third child node and the eighth child node has eight child nodes, and the child nodes are represented by an 8-bit occupancy code. The figure shows that the occupancy code of the third child node is 10000111, and the occupancy code of the eighth child node is 01001111. The point cloud video encoder (for example, the arithmetic encoder 40004) according to the embodiments may perform entropy encoding on the occupancy codes. In order to increase the compression efficiency, the point cloud video encoder may perform intra/inter-coding on the occupancy codes. The reception device (for example, the reception device 10004 or the point cloud video decoder 10006) according to the embodiments reconstructs the octree based on the occupancy codes.

The point cloud video encoder (for example, the octree analyzer 40002) according to the embodiments may perform voxelization and octree coding to store the positions of points. However, points are not always evenly distributed in the 3D space, and accordingly there may be a specific region in which fewer points are present. Accordingly, it is inefficient to perform voxelization for the entire 3D space. For example, when a specific region contains few points, voxelization does not need to be performed in the specific region.

Accordingly, for the above-described specific region (or a node other than the leaf node of the octree), the point cloud video encoder according to the embodiments may skip voxelization and perform direct coding to directly code the positions of points included in the specific region. The coordinates of a direct coding point according to the embodiments are referred to as direct coding mode (DCM). The point cloud video encoder according to the embodiments may also perform trisoup geometry encoding, which is to reconstruct the positions of the points in the specific region (or node) based on voxels, based on a surface model. The trisoup geometry encoding is geometry encoding that represents an object as a series of triangular meshes. Accordingly, the point cloud video decoder may generate a point cloud from the mesh surface. The direct coding and trisoup geometry encoding according to the embodiments may be selectively performed. In addition, the direct coding and trisoup geometry encoding according to the embodiments may be performed in combination with octree geometry coding (or octree coding).

To perform direct coding, the option to use the direct mode for applying direct coding should be activated. A node to which direct coding is to be applied is not a leaf node, and points less than a threshold should be present within a specific node. In addition, the total number of points to which direct coding is to be applied should not exceed a preset threshold. When the conditions above are satisfied, the point cloud video encoder (or the arithmetic encoder 40004) according to the embodiments may perform entropy coding on the positions (or position values) of the points.

The point cloud video encoder (for example, the surface approximation analyzer 40003) according to the embodiments may determine a specific level of the octree (a level less than the depth d of the octree), and the surface model may be used staring with that level to perform trisoup geometry encoding to reconstruct the positions of points in the region of the node based on voxels (Trisoup mode). The point cloud video encoder according to the embodiments may specify a level at which trisoup geometry encoding is to be applied. For example, when the specific level is equal to the depth of the octree, the point cloud video encoder does not operate in the trisoup mode. In other words, the point cloud video encoder according to the embodiments may operate in the trisoup mode only when the specified level is less than the value of depth of the octree. The 3D cube region of the nodes at the specified level according to the embodiments is called a block. One block may include one or more voxels. The block or voxel may correspond to a brick. Geometry is represented as a surface within each block. The surface according to embodiments may intersect with each edge of a block at most once.

One block has 12 edges, and accordingly there are at least 12 intersections in one block. Each intersection is called a vertex (or apex). A vertex present along an edge is detected when there is at least one occupied voxel adjacent to the edge among all blocks sharing the edge. The occupied voxel according to the embodiments refers to a voxel containing a point. The position of the vertex detected along the edge is the average position along the edge of all voxels adjacent to the edge among all blocks sharing the edge.

Once the vertex is detected, the point cloud video encoder according to the embodiments may perform entropy encoding on the starting point (x, y, z) of the edge, the direction vector (Δx, Δy, Δz) of the edge, and the vertex position value (relative position value within the edge). When the trisoup geometry encoding is applied, the point cloud video encoder according to the embodiments (for example, the geometry reconstructor 40005) may generate restored geometry (reconstructed geometry) by performing the triangle reconstruction, up-sampling, and voxelization processes.

The vertices positioned at the edge of the block determine a surface that passes through the block. The surface according to the embodiments is a non-planar polygon. In the triangle reconstruction process, a surface represented by a triangle is reconstructed based on the starting point of the edge, the direction vector of the edge, and the position values of the vertices. The triangle reconstruction process is performed according to Equation 2 by: i) calculating the centroid value of each vertex, ii) subtracting the center value from each vertex value, and iii) estimating the sum of the squares of the values obtained by the subtraction.

$$① \begin{bmatrix} \mu_x \\ \mu_y \\ \mu_z \end{bmatrix} = \frac{1}{n} \sum_{i=1}^{n} \begin{bmatrix} x_i \\ y_i \\ z_i \end{bmatrix}$$

$$② \begin{bmatrix} \overline{x}_i \\ \overline{y}_i \\ \overline{z}_i \end{bmatrix} = \begin{bmatrix} x_i \\ y_i \\ z_i \end{bmatrix} - \begin{bmatrix} \mu_x \\ \mu_y \\ \mu_z \end{bmatrix}$$

$$③ \begin{bmatrix} \sigma_x^2 \\ \sigma_y^2 \\ \sigma_z^2 \end{bmatrix} = \sum_{i=1}^{n} \begin{bmatrix} \overline{x}_i^2 \\ \overline{y}_i^2 \\ \overline{z}_i^2 \end{bmatrix}$$

[Equation 2]

Then, the minimum value of the sum is estimated, and the projection process is performed according to the axis with the minimum value. For example, when the element x is the minimum, each vertex is projected on the x-axis with respect to the center of the block, and projected on the (y, z) plane. When the values obtained through projection on the (y, z) plane are (ai, bi), the value of θ is estimated through a tan 2(bi, ai), and the vertices are ordered based on the value of θ. The table 1 below shows a combination of vertices for creating a triangle according to the number of the vertices. The vertices are ordered from 1 to n. The table 1 below shows that for four vertices, two triangles may be constructed according to combinations of vertices. The first triangle may consist of vertices 1, 2, and 3 among the ordered vertices, and the second triangle may consist of vertices 3, 4, and 1 among the ordered vertices.

TABLE 1

Triangles formed from vertices ordered 1, . . . , n

| n | Triangles |
|---|---|
|  | (1, 2, 3) |
|  | (1, 2, 3), (3, 4, 1) |
|  | (1, 2, 3), (3, 4, 5), (5, 1, 3) |

TABLE 1-continued

Triangles formed from vertices ordered 1, . . . , n

| n | Triangles |
|---|---|
|  | (1, 2, 3), (3, 4, 5), (5, 6, 1), (1, 3, 5) |
|  | (1, 2, 3), (3, 4, 5), (5, 6, 7), (7, 1, 3), (3, 5, 7) |
|  | (1, 2, 3), (3, 4, 5), (5, 6, 7), (7, 8, 1), (1, 3, 5), (5, 7, 1) |
|  | (1, 2, 3), (3, 4, 5), (5, 6, 7), (7, 8, 9), (9, 1, 3), (3, 5, 7), (7, 9, 3) |
| 0 | (1, 2, 3), (3, 4, 5), (5, 6, 7), (7, 8, 9), (9, 10, 1), (1, 3, 5), (5, 7, 9), (9, 1, 5) |
| 1 | (1, 2, 3), (3, 4, 5), (5, 6, 7), (7, 8, 9), (9, 10, 11), (11, 1, 3), (3, 5, 7), (7, 9, 11), (11, 3, 7) |
| 2 | (1, 2, 3), (3, 4, 5), (5, 6, 7), (7, 8, 9), (9, 10, 11), (11, 12, 1), (1, 3, 5), (5, 7, 9), (9, 11, 1), (1, 5, 9) |

The upsampling process is performed to add points in the middle along the edge of the triangle and perform voxelization. The added points are generated based on the upsampling factor and the width of the block. The added points are called refined vertices. The point cloud video encoder according to the embodiments may voxelize the refined vertices. In addition, the point cloud video encoder may perform attribute encoding based on the voxelized positions (or position values).

FIG. 7 shows an example of a neighbor node pattern according to embodiments.

In order to increase the compression efficiency of the point cloud video, the point cloud video encoder according to the embodiments may perform entropy coding based on context adaptive arithmetic coding.

As described with reference to FIGS. 1 to 6, the point cloud content providing system or the point cloud video encoder 10002 of FIG. 1, or the point cloud video encoder or arithmetic encoder 40004 of FIG. 4 may perform entropy coding on the occupancy code immediately. In addition, the point cloud content providing system or the point cloud video encoder may perform entropy encoding (intra encoding) based on the occupancy code of the current node and the occupancy of neighboring nodes, or perform entropy encoding (inter encoding) based on the occupancy code of the previous frame. A frame according to embodiments represents a set of point cloud videos generated at the same time. The compression efficiency of intra encoding/inter encoding according to the embodiments may depend on the number of neighboring nodes that are referenced. When the bits increase, the operation becomes complicated, but the encoding may be biased to one side, which may increase the compression efficiency. For example, when a 3-bit context is given, coding needs to be performed using 23=8 methods. The part divided for coding affects the complexity of implementation. Accordingly, it is necessary to meet an appropriate level of compression efficiency and complexity.

FIG. 7 illustrates a process of obtaining an occupancy pattern based on the occupancy of neighbor nodes. The point cloud video encoder according to the embodiments determines occupancy of neighbor nodes of each node of the octree and obtains a value of a neighbor pattern. The neighbor node pattern is used to infer the occupancy pattern of the node. The up part of FIG. 7 shows a cube corresponding to a node (a cube positioned in the middle) and six cubes (neighbor nodes) sharing at least one face with the cube. The nodes shown in the figure are nodes of the same depth. The numbers shown in the figure represent weights (1, 2, 4, 8, 16, and 32) associated with the six nodes, respectively. The weights are assigned sequentially according to the positions of neighboring nodes.

The down part of FIG. 7 shows neighbor node pattern values. A neighbor node pattern value is the sum of values multiplied by the weight of an occupied neighbor node (a neighbor node having a point). Accordingly, the neighbor node pattern values are 0 to 63. When the neighbor node pattern value is 0, it indicates that there is no node having a point (no occupied node) among the neighbor nodes of the node. When the neighbor node pattern value is 63, it indicates that all neighbor nodes are occupied nodes. As shown in the figure, since neighbor nodes to which weights 1, 2, 4, and 8 are assigned are occupied nodes, the neighbor node pattern value is 15, the sum of 1, 2, 4, and 8. The point cloud video encoder may perform coding according to the neighbor node pattern value (for example, when the neighbor node pattern value is 63, 64 kinds of coding may be performed). According to embodiments, the point cloud video encoder may reduce coding complexity by changing a neighbor node pattern value (for example, based on a table by which 64 is changed to 10 or 6).

Figure 8:
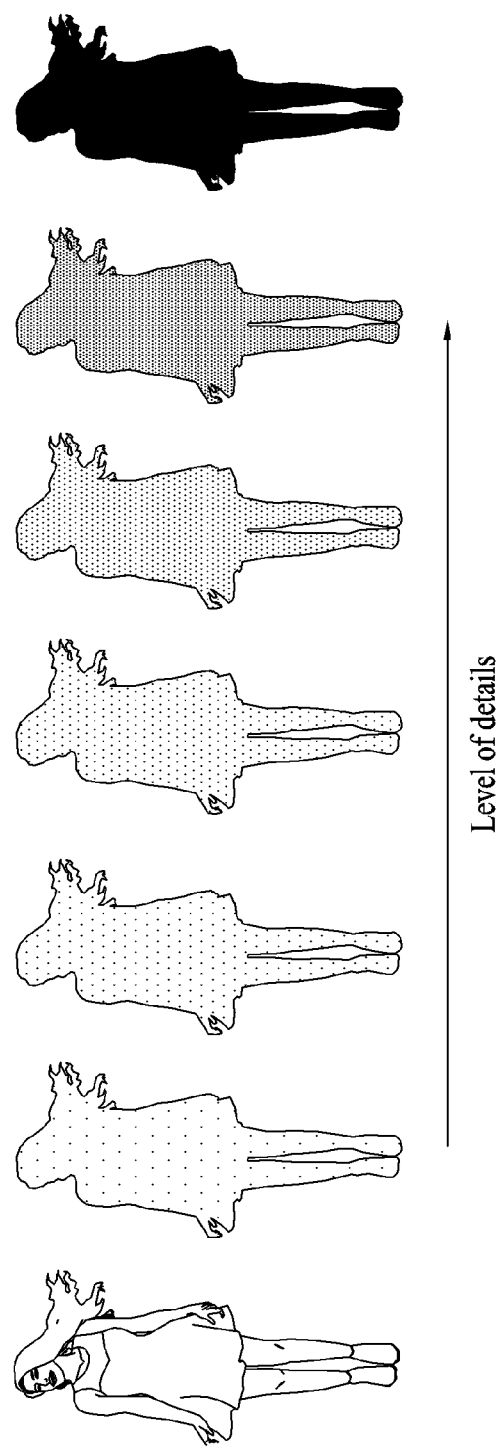
FIG. 8 illustrates an example of point configuration of a point cloud content for each LOD according to embodiments.

FIG. 8 illustrates an example of point configuration in each LOD according to embodiments.

As described with reference to FIGS. 1 to 7, encoded geometry is reconstructed (decompressed) before attribute encoding is performed. When direct coding is applied, the geometry reconstruction operation may include changing the placement of direct coded points (e.g., placing the direct coded points in front of the point cloud data). When trisoup geometry encoding is applied, the geometry reconstruction process is performed through triangle reconstruction, up-sampling, and voxelization. Since the attribute depends on the geometry, attribute encoding is performed based on the reconstructed geometry.

The point cloud video encoder (for example, the LOD generator 40009) may classify (reorganize) points by LOD. The figure shows the point cloud content corresponding to LODs. The leftmost picture in the figure represents original point cloud content. The second picture from the left of the figure represents distribution of the points in the lowest LOD, and the rightmost picture in the figure represents distribution of the points in the highest LOD. That is, the points in the lowest LOD are sparsely distributed, and the points in the highest LOD are densely distributed. That is, as the LOD rises in the direction pointed by the arrow indicated at the bottom of the figure, the space (or distance) between points is narrowed.

Figure 9:
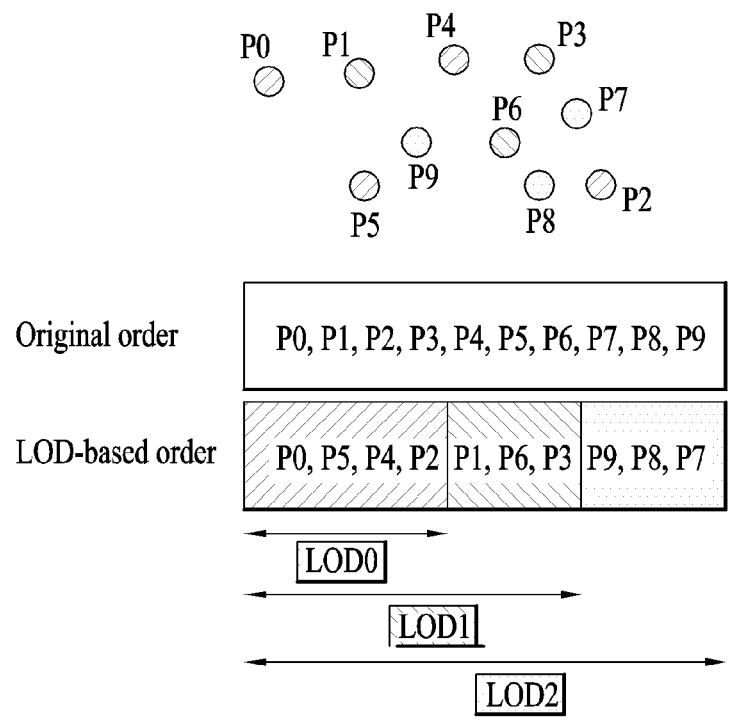
FIG. 9 illustrates an example of point configuration of a point cloud content for each LOD according to embodiments.

FIG. 9 illustrates an example of point configuration for each LOD according to embodiments.

As described with reference to FIGS. 1 to 8, the point cloud content providing system, or the point cloud video encoder (for example, the point cloud video encoder 10002 of FIG. 1, the point cloud video encoder of FIG. 4, or the LOD generator 40009) may generates an LOD. The LOD is generated by reorganizing the points into a set of refinement levels according to a set LOD distance value (or a set of Euclidean distances). The LOD generation process is performed not only by the point cloud video encoder, but also by the point cloud video decoder.

The upper part of FIG. 9 shows examples (P0 to P9) of points of the point cloud content distributed in a 3D space. In FIG. 9, the original order represents the order of points P0 to P9 before LOD generation. In FIG. 9, the LOD based order represents the order of points according to the LOD generation. Points are reorganized by LOD. Also, a high LOD contains the points belonging to lower LODs. As shown in FIG. 9, LOD0 contains P0, P5, P4 and P2. LOD1 contains the points of LOD0, P1, P6 and P3. LOD2 contains the points of LOD0, the points of LOD1, P9, P8 and P7.

As described with reference to FIG. 4, the point cloud video encoder according to the embodiments may perform prediction transform coding based on LOD, lifting transform coding based on LOD, and RAHT transform coding selectively or in combination.

The point cloud video encoder according to the embodiments may generate a predictor for points to perform prediction transform coding based on LOD for setting a predicted attribute (or predicted attribute value) of each point. That is, N predictors may be generated for N points. The predictor according to the embodiments may calculate a weight (=1/distance) based on the LOD value of each point, indexing information about neighboring points present within a set distance for each LOD, and a distance to the neighboring points.

The predicted attribute (or attribute value) according to the embodiments is set to the average of values obtained by multiplying the attributes (or attribute values) (e.g., color, reflectance, etc.) of neighbor points set in the predictor of each point by a weight (or weight value) calculated based on the distance to each neighbor point. The point cloud video encoder according to the embodiments (for example, the coefficient quantizer 40011) may quantize and inversely quantize the residual of each point (which may be called residual attribute, residual attribute value, attribute prediction residual value or prediction error attribute value and so on) obtained by subtracting a predicted attribute (or attribute value) each point from the attribute (i.e., original attribute value) of each point. The quantization process performed for a residual attribute value in a transmission device is configured as shown in table 2. The inverse quantization process performed for a residual attribute value in a reception device is configured as shown in table 3.

TABLE 2

```
int PCCQuantization(int value, int quantStep) {
if( value >=0) {
return floor(value / quantStep + 1.0 / 3.0);
} else {
return -floor(-value / quantStep + 1.0 / 3.0);
}
}
```

TABLE 3

```
int PCCInverseQuantization(int value, int quantStep) {
if( quantStep ==0) {
return value;
} else {
return value * quantStep;
}
}
```

When the predictor of each point has neighbor points, the point cloud video encoder (e.g., the arithmetic encoder 40012) according to the embodiments may perform entropy coding on the quantized and inversely quantized residual values as described above. When the predictor of each point has no neighbor point, the point cloud video encoder according to the embodiments (for example, the arithmetic encoder 40012) may perform entropy coding on the attributes of the corresponding point without performing the above-described operation.

The point cloud video encoder according to the embodiments (for example, the lifting transformer 40010) may generate a predictor of each point, set the calculated LOD and register neighbor points in the predictor, and set weights according to the distances to neighbor points to perform lifting transform coding. The lifting transform coding according to the embodiments is similar to the above-described prediction transform coding, but differs therefrom in that weights are cumulatively applied to attribute values. The process of cumulatively applying weights to the attribute values according to embodiments is configured as follows.

1) Create an array Quantization Weight (QW) for storing the weight value of each point. The initial value of all elements of QW is 1.0. Multiply the QW values of the predictor indexes of the neighbor nodes registered in the predictor by the weight of the predictor of the current point, and add the values obtained by the multiplication.

2) Lift prediction process: Subtract the value obtained by multiplying the attribute value of the point by the weight from the existing attribute value to calculate a predicted attribute value.

3) Create temporary arrays called updateweight and update and initialize the temporary arrays to zero.

4) Cumulatively add the weights calculated by multiplying the weights calculated for all predictors by a weight stored in the QW corresponding to a predictor index to the updateweight array as indexes of neighbor nodes. Cumulatively add, to the update array, a value obtained by multiplying the attribute value of the index of a neighbor node by the calculated weight.

5) Lift update process: Divide the attribute values of the update array for all predictors by the weight value of the updateweight array of the predictor index, and add the existing attribute value to the values obtained by the division.

6) Calculate predicted attributes by multiplying the attribute values updated through the lift update process by the weight updated through the lift prediction process (stored in the QW) for all predictors. The point cloud video encoder (e.g., coefficient quantizer 40011) according to the embodiments quantizes the predicted attribute values. In addition, the point cloud video encoder (e.g., the arithmetic encoder 40012) performs entropy coding on the quantized attribute values.

The point cloud video encoder (for example, the RAHT transformer 40008) according to the embodiments may perform RAHT transform coding in which attributes of nodes of a higher level are predicted using the attributes associated with nodes of a lower level in the octree. RAHT transform coding is an example of attribute intra coding through an octree backward scan. The point cloud video encoder according to the embodiments scans the entire region from the voxel and repeats the merging process of merging the voxels into a larger block at each step until the root node is reached. The merging process according to the embodiments is performed only on the occupied nodes. The merging process is not performed on the empty node. The merging process is performed on an upper node immediately above the empty node.

Equation 3 below represents a RAHT transformation matrix. In Equation 3, $g_{l_{x,y,z}}$ denotes the average attribute value of voxels at level l. $g_{l_{x,y,z}}$ may be calculated based on $g_{l+1_{2x,y,z}}$ and $g_{l+1_{2x+1,y,z}}$. The weights for $g_{l_{2x,y,z}}$ and $g_{l_{2x+1,y,z}}$ are $w1 = w_{l_{2x,y,z}}$ and $w2 = w_{l_{2x+1,y,z}}$.

$$\begin{bmatrix} g_{l-1_{x,y,z}} \\ h_{l-1_{x,y,z}} \end{bmatrix} = T_{w1w2} \begin{bmatrix} g_{l_{2x,y,z}} \\ g_{l_{2x+1,y,z}} \end{bmatrix}$$ [Equation 3]

$$T_{w1w2} = \frac{1}{\sqrt{w1+w2}} \begin{bmatrix} \sqrt{w1} & \sqrt{w2} \\ -\sqrt{w2} & \sqrt{w1} \end{bmatrix}$$

Here, $g_{l-1_{x,y,z}}$ is a low-pass value and is used in the merging process at the next higher level. $h_{l-1_{x,y,z}}$ denotes high-pass coefficients. The high-pass coefficients at each step are quantized and subjected to entropy coding (for example, encoding by the arithmetic encoder 400012). The weights are calculated as $w_{l-1_{x,y,z}} = w_{l_{2x,y,z}} + w_{l_{2x+1,y,z}}$. The root node is created through the $g_{l_{0,0,0}}$ and $g_{l_{0,0,1}}$ Equation 4.

$$\begin{bmatrix} gDC \\ h_{0_{0,0,0}} \end{bmatrix} = T_{w1000w1001} \begin{bmatrix} g_{1_{0,0,0z}} \\ g_{1_{0,0,1}} \end{bmatrix}$$ [Equation 4]

The value of gDC is also quantized and subjected to entropy coding like the high-pass coefficients.

Figure 10:
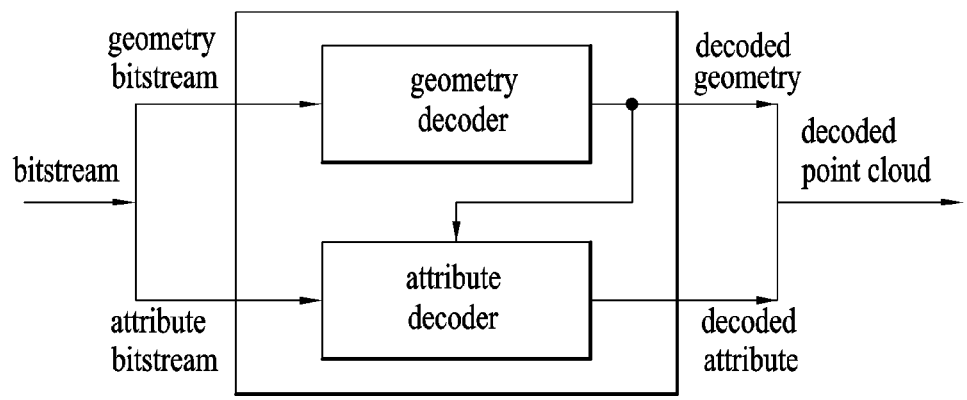
FIG. 10 illustrates an example of a block diagram of a point cloud video decoder according to embodiments.

FIG. 10 illustrates a point cloud video decoder according to embodiments.

The point cloud video decoder illustrated in FIG. 10 is an example of the point cloud video decoder 10006 described in FIG. 1, and may perform the same or similar operations as the operations of the point cloud video decoder 10006 illustrated in FIG. 1. As shown in the figure, the point cloud video decoder may receive a geometry bitstream and an attribute bitstream contained in one or more bitstreams. The point cloud video decoder includes a geometry decoder and an attribute decoder. The geometry decoder performs geometry decoding on the geometry bitstream and outputs decoded geometry. The attribute decoder performs attribute decoding on the attribute bitstream based on the decoded geometry, and outputs decoded attributes. The decoded geometry and decoded attributes are used to reconstruct point cloud content (a decoded point cloud).

Figure 11:
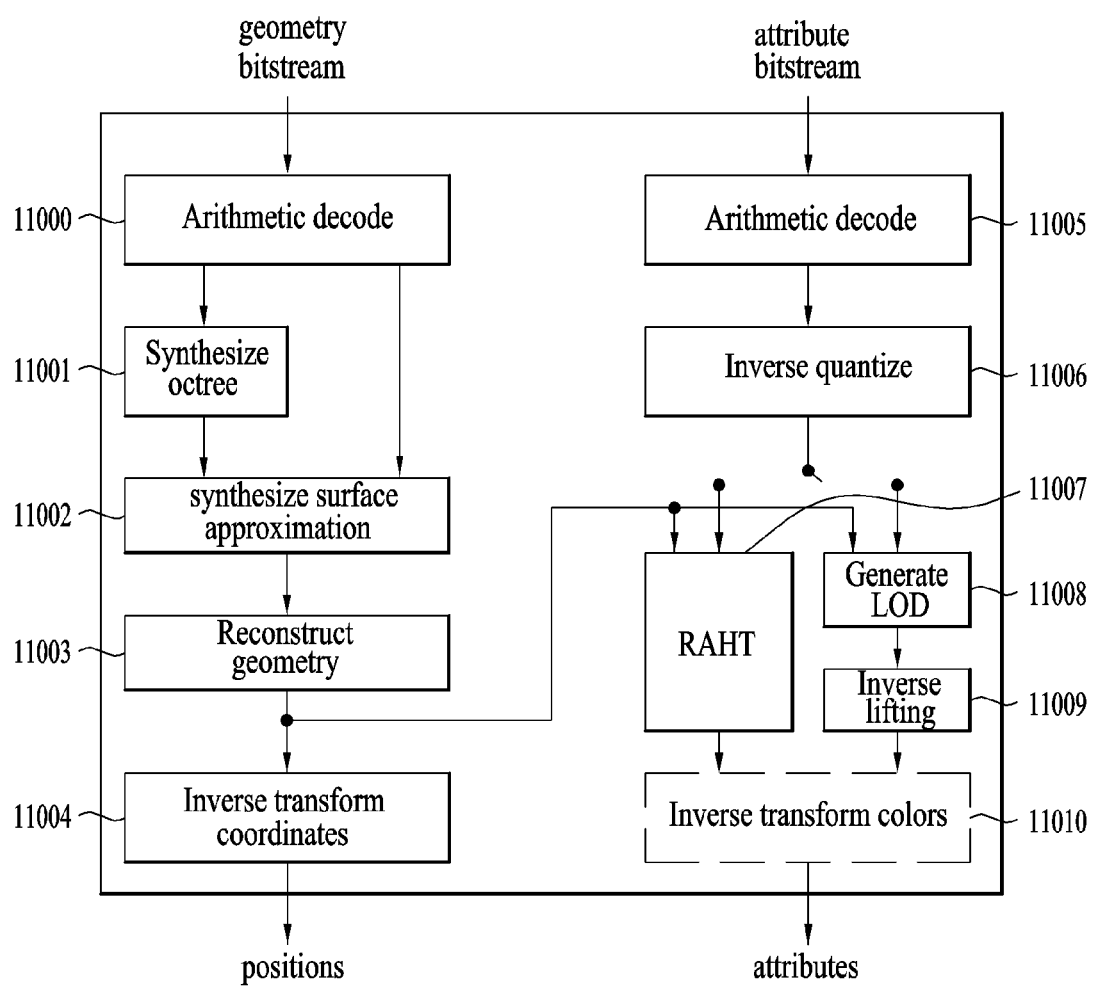
FIG. 11 illustrates an example of a point cloud video decoder according to embodiments.

FIG. 11 illustrates a point cloud video decoder according to embodiments.

The point cloud video decoder illustrated in FIG. 11 is an example of the point cloud video decoder illustrated in FIG. 10, and may perform a decoding operation, which is an inverse process of the encoding operation of the point cloud video encoder illustrated in FIGS. 1 to 9.

As described with reference to FIGS. 1 and 10, the point cloud video decoder may perform geometry decoding and attribute decoding. The geometry decoding is performed before the attribute decoding.

The point cloud video decoder according to the embodiments includes an arithmetic decoder (Arithmetic decode) 11000, an octree synthesizer (Synthesize octree) 11001, a surface approximation synthesizer (Synthesize surface approximation) 11002, and a geometry reconstructor (Reconstruct geometry) 11003, a coordinate inverse transformer (Inverse transform coordinates) 11004, an arithmetic decoder (Arithmetic decode) 11005, an inverse quantizer (Inverse quantize) 11006, a RAHT transformer 11007, an LOD generator (Generate LOD) 11008, an inverse lifter (inverse lifting) 11009, and/or a color inverse transformer (Inverse transform colors) 11010.

The arithmetic decoder 11000, the octree synthesizer 11001, the surface approximation synthesizer 11002, and the geometry reconstructor 11003, and the coordinate inverse transformer 11004 may perform geometry decoding. The geometry decoding according to the embodiments may include direct decoding and trisoup geometry decoding. The direct decoding and trisoup geometry decoding are selectively applied. The geometry decoding is not limited to the above-described example, and is performed as an inverse process of the geometry encoding described with reference to FIGS. 1 to 9.

The arithmetic decoder 11000 according to the embodiments decodes the received geometry bitstream based on the arithmetic coding. The operation of the arithmetic decoder 11000 corresponds to the inverse process of the arithmetic encoder 40004.

The octree synthesizer 11001 according to the embodiments may generate an octree by acquiring an occupancy code from the decoded geometry bitstream (or information on the geometry secured as a result of decoding). The occupancy code is configured as described in detail with reference to FIGS. 1 to 9.

When the trisoup geometry encoding is applied, the surface approximation synthesizer 11002 according to the embodiments may synthesize a surface based on the decoded geometry and/or the generated octree.

The geometry reconstructor 11003 according to the embodiments may regenerate geometry based on the surface and/or the decoded geometry. As described with reference to FIGS. 1 to 9, direct coding and trisoup geometry encoding are selectively applied. Accordingly, the geometry reconstructor 11003 directly imports and adds position information about the points to which direct coding is applied. When the trisoup geometry encoding is applied, the geometry reconstructor 11003 may reconstruct the geometry by performing the reconstruction operations of the geometry reconstructor 40005, for example, triangle reconstruction, up-sampling, and voxelization. Details are the same as those described with reference to FIG. 6, and thus description thereof is omitted. The reconstructed geometry may include a point cloud picture or frame that does not contain attributes.

The coordinate inverse transformer 11004 according to the embodiments may acquire positions of the points by transforming the coordinates based on the reconstructed geometry.

The arithmetic decoder 11005, the inverse quantizer 11006, the RAHT transformer 11007, the LOD generator 11008, the inverse lifter 11009, and/or the color inverse transformer 11010 may perform the attribute decoding described with reference to FIG. 10. The attribute decoding according to the embodiments includes region adaptive hierarchical transform (RAHT) decoding, interpolation-based hierarchical nearest-neighbor prediction (prediction transform) decoding, and interpolation-based hierarchical nearest-neighbor prediction with an update/lifting step (lifting transform) decoding. The three decoding schemes described above may be used selectively, or a combination of one or more decoding schemes may be used. The attribute decoding according to the embodiments is not limited to the above-described example.

The arithmetic decoder 11005 according to the embodiments decodes the attribute bitstream by arithmetic coding.

The inverse quantizer 11006 according to the embodiments inversely quantizes the information about the decoded attribute bitstream or attributes secured as a result of the decoding, and outputs the inversely quantized attributes (or attribute values). The inverse quantization may be selectively applied based on the attribute encoding of the point cloud video encoder.

According to embodiments, the RAHT transformer 11007, the LOD generator 11008, and/or the inverse lifter 11009 may process the reconstructed geometry and the inversely quantized attributes. As described above, the RAHT transformer 11007, the LOD generator 11008, and/or the inverse lifter 11009 may selectively perform a decoding operation corresponding to the encoding of the point cloud video encoder.

The color inverse transformer 11010 according to the embodiments performs inverse transform coding to inversely transform a color value (or texture) included in the decoded attributes. The operation of the color inverse transformer 11010 may be selectively performed based on the operation of the color transformer 40006 of the point cloud video encoder.

Although not shown in the figure, the elements of the point cloud video decoder of FIG. 11 may be implemented by hardware including one or more processors or integrated circuits configured to communicate with one or more memories included in the point cloud content providing apparatus, software, firmware, or a combination thereof. The one or more processors may perform at least one or more of the operations and/or functions of the elements of the point cloud video decoder of FIG. 11 described above. Additionally, the one or more processors may operate or execute a set of software programs and/or instructions for performing the operations and/or functions of the elements of the point cloud video decoder of FIG. 11.

Figure 12:
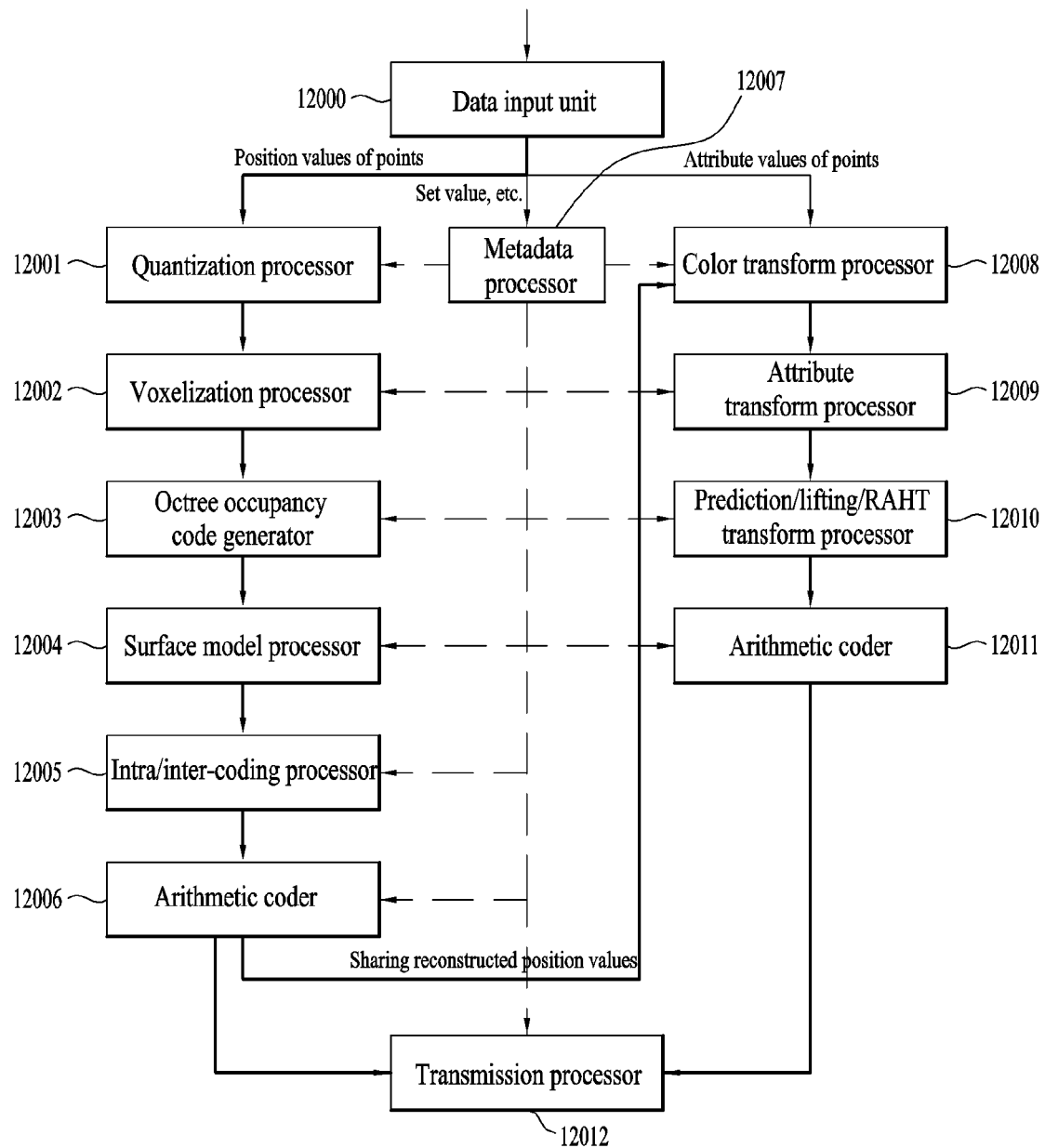
FIG. 12 illustrates a configuration for point cloud video encoding of a transmission device according to embodiments.

FIG. 12 illustrates a transmission device according to embodiments.

The transmission device shown in FIG. 12 is an example of the transmission device 10000 of FIG. 1 (or the point cloud video encoder of FIG. 4). The transmission device illustrated in FIG. 12 may perform one or more of the operations and methods the same as or similar to those of the point cloud video encoder described with reference to FIGS. 1 to 9. The transmission device according to the embodiments may include a data input unit 12000, a quantization processor 12001, a voxelization processor 12002, an octree occupancy code generator 12003, a surface model processor 12004, an intra/inter-coding processor 12005, an arithmetic coder 12006, a metadata processor 12007, a color transform processor 12008, an attribute transform processor 12009, a prediction/lifting/RAHT transform processor 12010, an arithmetic coder 12011 and/or a transmission processor 12012.

The data input unit 12000 according to the embodiments receives or acquires point cloud data. The data input unit 12000 may perform an operation and/or acquisition method the same as or similar to the operation and/or acquisition method of the point cloud video acquisition unit 10001 (or the acquisition process 20000 described with reference to FIG. 2).

The data input unit 12000, the quantization processor 12001, the voxelization processor 12002, the octree occupancy code generator 12003, the surface model processor 12004, the intra/inter-coding processor 12005, and the arithmetic coder 12006 perform geometry encoding. The geometry encoding according to the embodiments is the same as or similar to the geometry encoding described with reference to FIGS. 1 to 9, and thus a detailed description thereof is omitted.

The quantization processor 12001 according to the embodiments quantizes geometry (e.g., position values of points). The operation and/or quantization of the quantization processor 12001 is the same as or similar to the operation and/or quantization of the quantizer 40001 described with reference to FIG. 4. Details are the same as those described with reference to FIGS. 1 to 9.

The voxelization processor 12002 according to the embodiments voxelizes the quantized position values of the points. The voxelization processor 120002 may perform an operation and/or process the same or similar to the operation and/or the voxelization process of the quantizer 40001 described with reference to FIG. 4. Details are the same as those described with reference to FIGS. 1 to 9.

The octree occupancy code generator 12003 according to the embodiments performs octree coding on the voxelized positions of the points based on an octree structure. The octree occupancy code generator 12003 may generate an occupancy code. The octree occupancy code generator 12003 may perform an operation and/or method the same as or similar to the operation and/or method of the point cloud video encoder (or the octree analyzer 40002) described with reference to FIGS. 4 and 6. Details are the same as those described with reference to FIGS. 1 to 9.

The surface model processor 12004 according to the embodiments may perform trigsoup geometry encoding based on a surface model to reconstruct the positions of points in a specific region (or node) on a voxel basis. The surface model processor 12004 may perform an operation and/or method the same as or similar to the operation and/or method of the point cloud video encoder (for example, the surface approximation analyzer 40003) described with reference to FIG. 4. Details are the same as those described with reference to FIGS. 1 to 9.

The intra/inter-coding processor 12005 according to the embodiments may perform intra/inter-coding on point cloud data. The intra/inter-coding processor 12005 may perform coding the same as or similar to the intra/inter-coding described with reference to FIG. 7. Details are the same as those described with reference to FIG. 7. According to embodiments, the intra/inter-coding processor 12005 may be included in the arithmetic coder 12006.

The arithmetic coder 12006 according to the embodiments performs entropy encoding on an octree of the point cloud data and/or an approximated octree. For example, the encoding scheme includes arithmetic encoding. The arithmetic coder 12006 performs an operation and/or method the same as or similar to the operation and/or method of the arithmetic encoder 40004.

The metadata processor 12007 according to the embodiments processes metadata about the point cloud data, for example, a set value, and provides the same to a necessary processing process such as geometry encoding and/or attribute encoding. Also, the metadata processor 12007 according to the embodiments may generate and/or process signaling information related to the geometry encoding and/or the attribute encoding. The signaling information according to the embodiments may be encoded separately from the geometry encoding and/or the attribute encoding. The signaling information according to the embodiments may be interleaved.

The color transform processor 12008, the attribute transform processor 12009, the prediction/lifting/RAHT transform processor 12010, and the arithmetic coder 12011 perform the attribute encoding. The attribute encoding according to the embodiments is the same as or similar to the attribute encoding described with reference to FIGS. 1 to 9, and thus a detailed description thereof is omitted.

The color transform processor 12008 according to the embodiments performs color transform coding to transform color values included in attributes. The color transform processor 12008 may perform color transform coding based on the reconstructed geometry. The reconstructed geometry is the same as described with reference to FIGS. 1 to 9. Also, it performs an operation and/or method the same as or similar to the operation and/or method of the color transformer 40006 described with reference to FIG. 4 is performed. The detailed description thereof is omitted.

The attribute transform processor 12009 according to the embodiments performs attribute transformation to transform the attributes based on the reconstructed geometry and/or the positions on which geometry encoding is not performed. The attribute transform processor 12009 performs an operation and/or method the same as or similar to the operation and/or method of the attribute transformer 40007 described with reference to FIG. 4. The detailed description thereof is omitted. The prediction/lifting/RAHT transform processor 12010 according to the embodiments may code the transformed attributes by any one or a combination of RAHT coding, prediction transform coding, and lifting transform coding. The prediction/lifting/RAHT transform processor 12010 performs at least one of the operations the same as or similar to the operations of the RAHT transformer 40008, the LOD generator 40009, and the lifting transformer 40010 described with reference to FIG. 4. In addition, the prediction transform coding, the lifting transform coding, and the RAHT transform coding are the same as those described with reference to FIGS. 1 to 9, and thus a detailed description thereof is omitted.

The arithmetic coder 12011 according to the embodiments may encode the coded attributes based on the arithmetic coding. The arithmetic coder 12011 performs an operation and/or method the same as or similar to the operation and/or method of the arithmetic encoder 400012.

The transmission processor 12012 according to the embodiments may transmit each bitstream containing encoded geometry and/or encoded attributes and metadata information, or transmit one bitstream configured with the encoded geometry and/or the encoded attributes and the metadata information. When the encoded geometry and/or the encoded attributes and the metadata information according to the embodiments are configured into one bitstream, the bitstream may include one or more sub-bitstreams. The bitstream according to the embodiments may contain signaling information including a sequence parameter set (SPS) for signaling of a sequence level, a geometry parameter set (GPS) for signaling of geometry information coding, an attribute parameter set (APS) for signaling of attribute information coding, and a tile parameter set (TPS or tile inventory) for signaling of a tile level, and slice data. The slice data may include information about one or more slices. One slice according to embodiments may include one geometry bitstream Geom0⁰ and one or more attribute bitstreams Attr0⁰ and Attr1⁰. The TPS according to the embodiments may include information about each tile (for example, coordinate information and height/size information about a bounding box) for one or more tiles. The geometry bitstream may contain a header and a payload. The header of the geometry bitstream according to the embodiments may contain a parameter set identifier (geom_parameter_set_id), a tile identifier (geom_tile_id) and a slice identifier (geom_slice_id) included in the GPS, and information about the data contained in the payload. As described above, the metadata processor 12007 according to the embodiments may generate and/or process the signaling information and transmit the same to the transmission processor 12012. According to embodiments, the elements to perform geometry encoding and the elements to perform attribute encoding may share data/information with each other as indicated by dotted lines. The transmission processor 12012 according to the embodiments may perform an operation and/or transmission method the same as or similar to the operation and/or transmission method of the transmitter 10003. Details are the same as those described with reference to FIGS. 1 and 2, and thus a description thereof is omitted.

Figure 13:
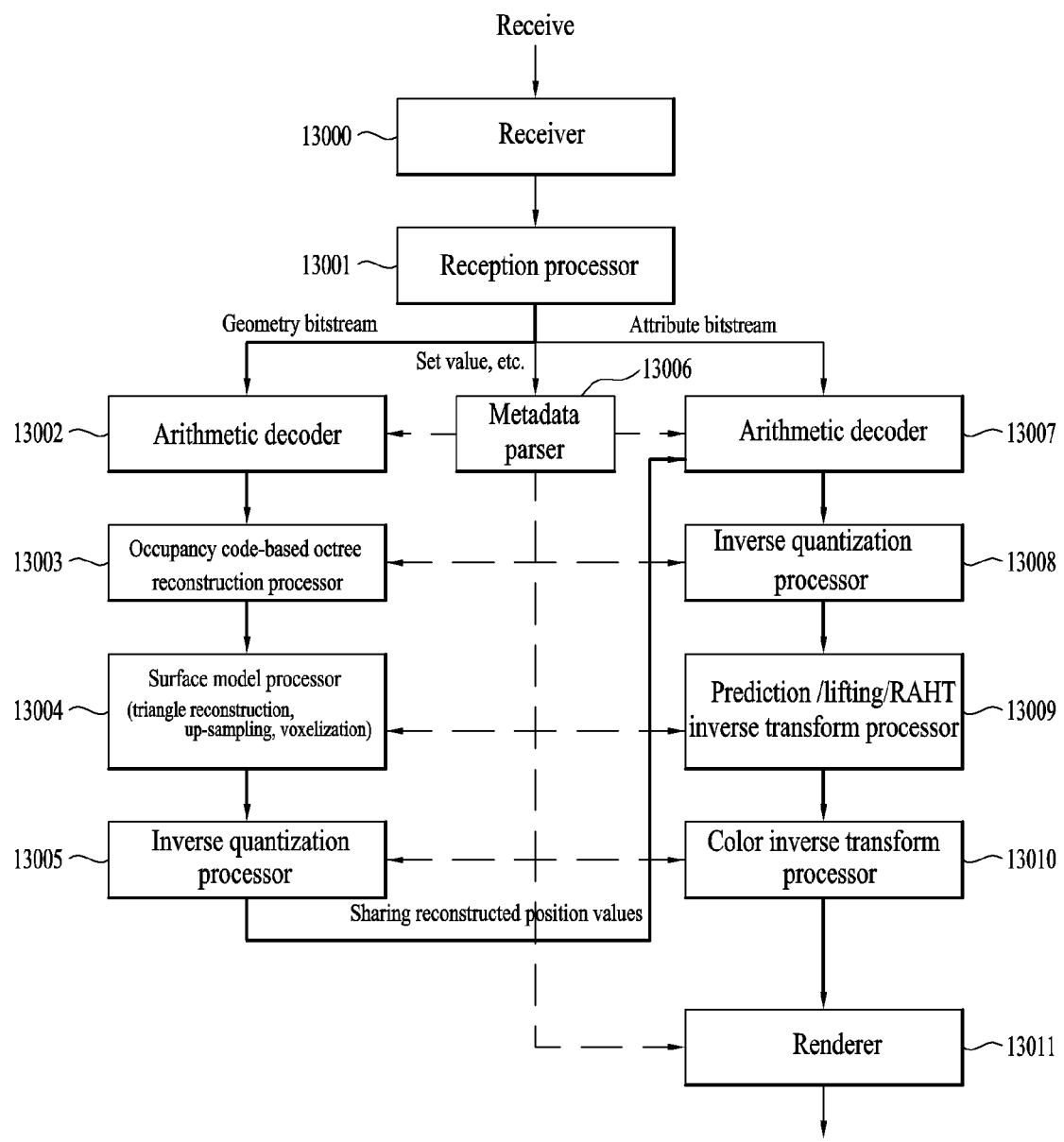
FIG. 13 illustrates a configuration for point cloud video decoding of a reception device according to embodiments.

FIG. 13 illustrates a reception device according to embodiments.

The reception device illustrated in FIG. 13 is an example of the reception device 10004 of FIG. 1 (or the point cloud video decoder of FIGS. 10 and 11). The reception device illustrated in FIG. 13 may perform one or more of the operations and methods the same as or similar to those of the point cloud video decoder described with reference to FIGS. 1 to 11.

The reception device according to the embodiment includes a receiver 13000, a reception processor 13001, an arithmetic decoder 13002, an occupancy code-based octree reconstruction processor 13003, a surface model processor (triangle reconstruction, up-sampling, voxelization) 13004, an inverse quantization processor 13005, a metadata parser 13006, an arithmetic decoder 13007, an inverse quantization processor 13008, a prediction/lifting/RAHT inverse transform processor 13009, a color inverse transform processor 13010, and/or a renderer 13011. Each element for decoding according to the embodiments may perform an inverse process of the operation of a corresponding element for encoding according to the embodiments.

The receiver 13000 according to the embodiments receives point cloud data. The receiver 13000 may perform an operation and/or reception method the same as or similar to the operation and/or reception method of the receiver 10005 of FIG. 1. The detailed description thereof is omitted.

The reception processor 13001 according to the embodiments may acquire a geometry bitstream and/or an attribute bitstream from the received data. The reception processor 13001 may be included in the receiver 13000.

The arithmetic decoder 13002, the occupancy code-based octree reconstruction processor 13003, the surface model processor 13004, and the inverse quantization processor 1305 may perform geometry decoding. The geometry decoding according to embodiments is the same as or similar to the geometry decoding described with reference to FIGS. 1 to 10, and thus a detailed description thereof is omitted.

The arithmetic decoder 13002 according to the embodiments may decode the geometry bitstream based on arithmetic coding. The arithmetic decoder 13002 performs an operation and/or coding the same as or similar to the operation and/or coding of the arithmetic decoder 11000.

The occupancy code-based octree reconstruction processor 13003 according to the embodiments may reconstruct an octree by acquiring an occupancy code from the decoded geometry bitstream (or information about the geometry secured as a result of decoding). The occupancy code-based octree reconstruction processor 13003 performs an operation and/or method the same as or similar to the operation and/or octree generation method of the octree synthesizer 11001. When the trisoup geometry encoding is applied, the surface model processor 1302 according to the embodiments may perform trisoup geometry decoding and related geometry reconstruction (for example, triangle reconstruction, up-sampling, voxelization) based on the surface model method. The surface model processor 1302 performs an operation the same as or similar to that of the surface approximation synthesizer 11002 and/or the geometry reconstructor 11003.

The inverse quantization processor 1305 according to the embodiments may inversely quantize the decoded geometry.

The metadata parser 1306 according to the embodiments may parse metadata contained in the received point cloud data, for example, a set value. The metadata parser 1306 may pass the metadata to geometry decoding and/or attribute decoding. The metadata is the same as that described with reference to FIG. 12, and thus a detailed description thereof is omitted.

The arithmetic decoder 13007, the inverse quantization processor 13008, the prediction/lifting/RAHT inverse transform processor 13009 and the color inverse transform processor 13010 perform attribute decoding. The attribute decoding is the same as or similar to the attribute decoding described with reference to FIGS. 1 to 10, and thus a detailed description thereof is omitted.

The arithmetic decoder 13007 according to the embodiments may decode the attribute bitstream by arithmetic coding. The arithmetic decoder 13007 may decode the attribute bitstream based on the reconstructed geometry. The arithmetic decoder 13007 performs an operation and/or coding the same as or similar to the operation and/or coding of the arithmetic decoder 11005.

The inverse quantization processor 13008 according to the embodiments may inversely quantize the decoded attribute bitstream. The inverse quantization processor 13008 performs an operation and/or method the same as or similar to the operation and/or inverse quantization method of the inverse quantizer 11006.

The prediction/lifting/RAHT inverse transformer 13009 according to the embodiments may process the reconstructed geometry and the inversely quantized attributes. The prediction/lifting/RAHT inverse transform processor 1301 performs one or more of operations and/or decoding the same as or similar to the operations and/or decoding of the RAHT transformer 11007, the LOD generator 11008, and/or the inverse lifter 11009. The color inverse transform processor 13010 according to the embodiments performs inverse transform coding to inversely transform color values (or textures) included in the decoded attributes. The color inverse transform processor 13010 performs an operation and/or inverse transform coding the same as or similar to the operation and/or inverse transform coding of the color inverse transformer 11010. The renderer 13011 according to the embodiments may render the point cloud data.

Figure 14:
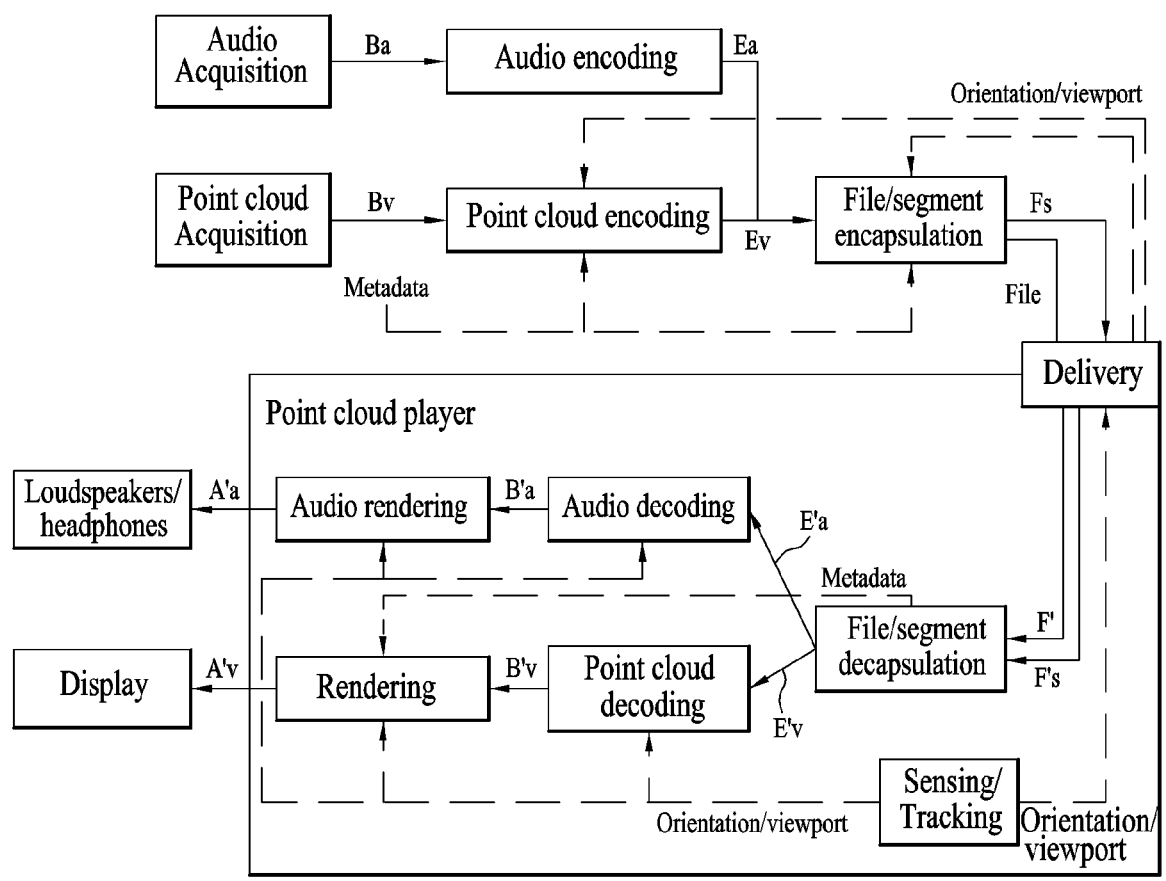
FIG. 14 illustrates an architecture for storing and streaming of G-PCC-based point cloud data according to embodiments.

FIG. 14 illustrates an architecture for G-PCC-based point cloud content streaming according to embodiments.

The upper part of FIG. 14 shows a process of processing and transmitting point cloud content by the transmission device described in FIGS. 1 to 13 (for example, the transmission device 10000, the transmission device of FIG. 12, etc.).

As described with reference to FIGS. 1 to 13, the transmission device may acquire audio Ba of the point cloud content (Audio Acquisition), encode the acquired audio (Audio Encoding), and output an audio bitstream Ea. In addition, the transmission device may acquire a point cloud (or point cloud video) By of the point cloud content (Point Acquisition), and perform point cloud video encoding on the acquired point cloud to output a point cloud video bitstream Ev. The point cloud video encoding of the transmission device is the same as or similar to the point cloud video encoding described with reference to FIGS. 1 to 13 (for example, the encoding of the point cloud video encoder of FIG. 4), and thus a detailed description thereof will be omitted.

The transmission device may encapsulate the generated audio bitstream and video bitstream into a file and/or a segment (File/segment encapsulation). The encapsulated file and/or segment Fs, File may include a file in a file format such as ISOBMFF or a dynamic adaptive streaming over HTTP (DASH) segment. Point cloud-related metadata according to embodiments may be contained in the encapsulated file format and/or segment. The metadata may be contained in boxes of various levels on the ISO International Standards Organization Base Media File Format (ISOBMFF) file format, or may be contained in a separate track within the file. According to an embodiment, the transmission device may encapsulate the metadata into a separate file. The transmission device according to the embodiments may deliver the encapsulated file format and/or segment over a network. The processing method for encapsulation and transmission by the transmission device is the same as that described with reference to FIGS. 1 to 13 (for example, the transmitter 10003, the transmission step 20002 of FIG. 2, etc.), and thus a detailed description thereof will be omitted.

The lower part of FIG. 14 shows a process of processing and outputting point cloud content by the reception device (for example, the reception device 10004, the reception device of FIG. 13, etc.) described with reference to FIGS. 1 to 13.

According to embodiments, the reception device may include devices configured to output final audio data and final video data (e.g., loudspeakers, headphones, a display), and a point cloud player configured to process point cloud content (a point cloud player). The final data output devices and the point cloud player may be configured as separate physical devices. The point cloud player according to the embodiments may perform geometry-based point cloud compression (G-PCC) coding, video-based point cloud compression (V-PCC) coding and/or next-generation coding.

The reception device according to the embodiments may secure a file and/or segment F', Fs' contained in the received data (for example, a broadcast signal, a signal transmitted over a network, etc.) and decapsulate the same (File/segment decapsulation). The reception and decapsulation methods of the reception device is the same as those described with reference to FIGS. 1 to 13 (for example, the receiver 10005, the reception unit 13000, the reception processing unit 13001, etc.), and thus a detailed description thereof will be omitted.

The reception device according to the embodiments secures an audio bitstream E'a and a video bitstream E'v contained in the file and/or segment. As shown in the figure, the reception device outputs decoded audio data B'a by performing audio decoding on the audio bitstream, and renders the decoded audio data (audio rendering) to output final audio data A'a through loudspeakers or headphones.

Also, the reception device performs point cloud video decoding on the video bitstream E'v and outputs decoded video data B'v. The point cloud video decoding according to the embodiments is the same as or similar to the point cloud video decoding described with reference to FIGS. 1 to 13 (for example, decoding of the point cloud video decoder of FIG. 11), and thus a detailed description thereof will be omitted. The reception device may render the decoded video data and output final video data through the display.

The reception device according to the embodiments may perform at least one of decapsulation, audio decoding, audio rendering, point cloud video decoding, and point cloud video rendering based on the transmitted metadata. The details of the metadata are the same as those described with reference to FIGS. 12 to 13, and thus a description thereof will be omitted.

As indicated by a dotted line shown in the figure, the reception device according to the embodiments (for example, a point cloud player or a sensing/tracking unit in the point cloud player) may generate feedback information (orientation, viewport). According to embodiments, the feedback information may be used in a decapsulation process, a point cloud video decoding process and/or a rendering process of the reception device, or may be delivered to the transmission device. Details of the feedback information are the same as those described with reference to FIGS. 1 to 13, and thus a description thereof will be omitted.

Figure 15:
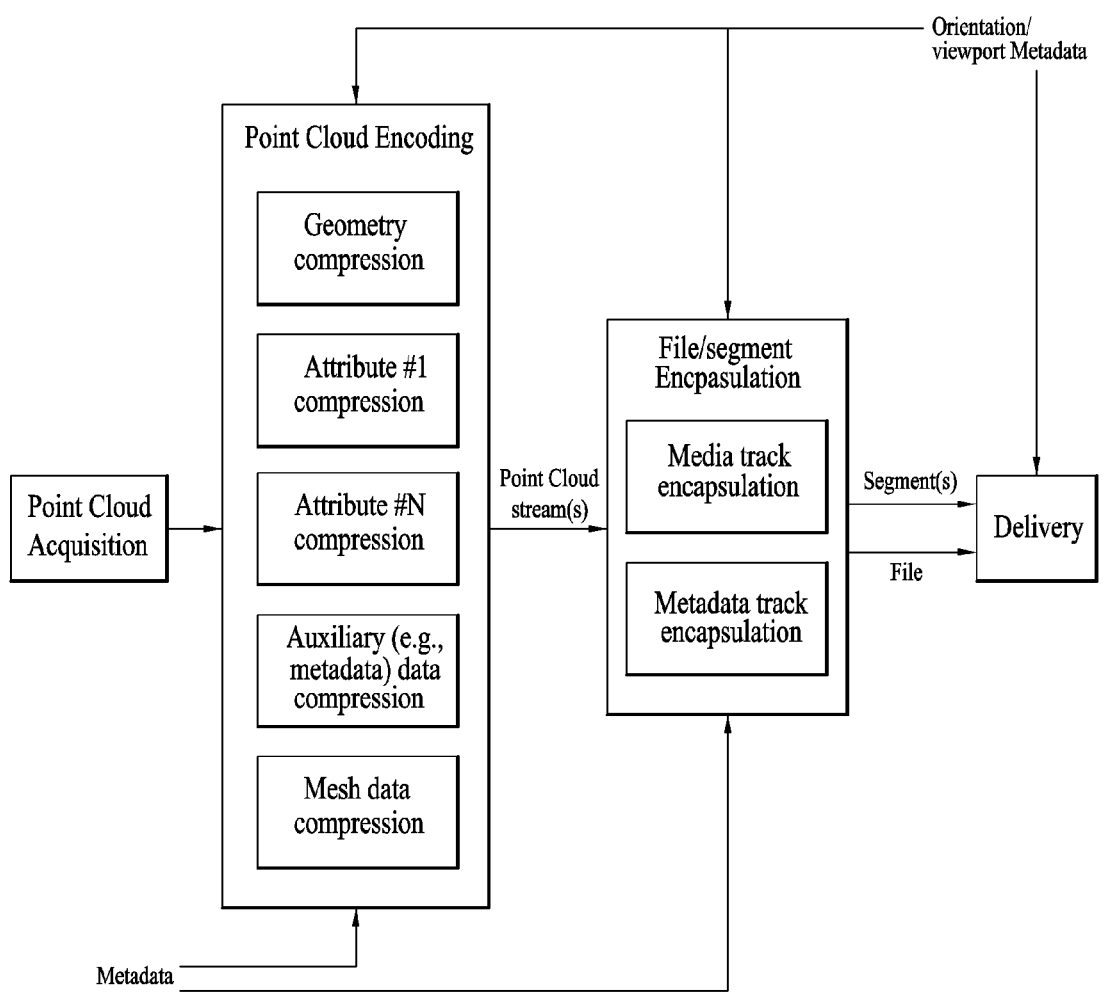
FIG. 15 illustrates an example of storage and transmission of point cloud data according to embodiments.

FIG. 15 shows an exemplary transmission device according to embodiments.

The transmission device of FIG. 15 is a device configured to transmit point cloud content, and corresponds to an example of the transmission device described with reference to FIGS. 1 to 14 (e.g., the transmission device 10000 of FIG. 1, the point cloud video encoder of FIG. 4, the transmission device of FIG. 12, the transmission device of FIG. 14). Accordingly, the transmission device of FIG. 15 performs an operation that is identical or similar to that of the transmission device described with reference to FIGS. 1 to 14.

The transmission device according to the embodiments may perform one or more of point cloud acquisition, point cloud video encoding, file/segment encapsulation and delivery.

Since the operation of point cloud acquisition and delivery illustrated in the figure is the same as the operation described with reference to FIGS. 1 to 14, a detailed description thereof will be omitted.

As described above with reference to FIGS. 1 to 14, the transmission device according to the embodiments may perform geometry encoding and attribute encoding. The geometry encoding may be referred to as geometry compression, and the attribute encoding may be referred to as attribute compression. As described above, one point may have one geometry and one or more attributes. Accordingly, the transmission device performs attribute encoding on each attribute. The figure illustrates that the transmission device performs one or more attribute compressions (attribute #1 compression, . . . , attribute #N compression). In addition, the transmission device according to the embodiments may perform auxiliary compression. The auxiliary compression is performed on the metadata. Details of the metadata are the same as those described with reference to FIGS. 1 to 14, and thus a description thereof will be omitted. The transmission device may also perform mesh data compression. The mesh data compression according to the embodiments may include the trisoup geometry encoding described with reference to FIGS. 1 to 14.

The transmission device according to the embodiments may encapsulate bitstreams (e.g., point cloud streams) output according to point cloud video encoding into a file and/or a segment. According to embodiments, the transmission device may perform media track encapsulation for carrying data (for example, media data) other than the metadata, and perform metadata track encapsulation for carrying metadata. According to embodiments, the metadata may be encapsulated into a media track.

As described with reference to FIGS. 1 to 14, the transmission device may receive feedback information (orientation/viewport metadata) from the reception device, and perform at least one of the point cloud video encoding, file/segment encapsulation, and delivery operations based on the received feedback information. Details are the same as those described with reference to FIGS. 1 to 14, and thus a description thereof will be omitted.

Figure 16:
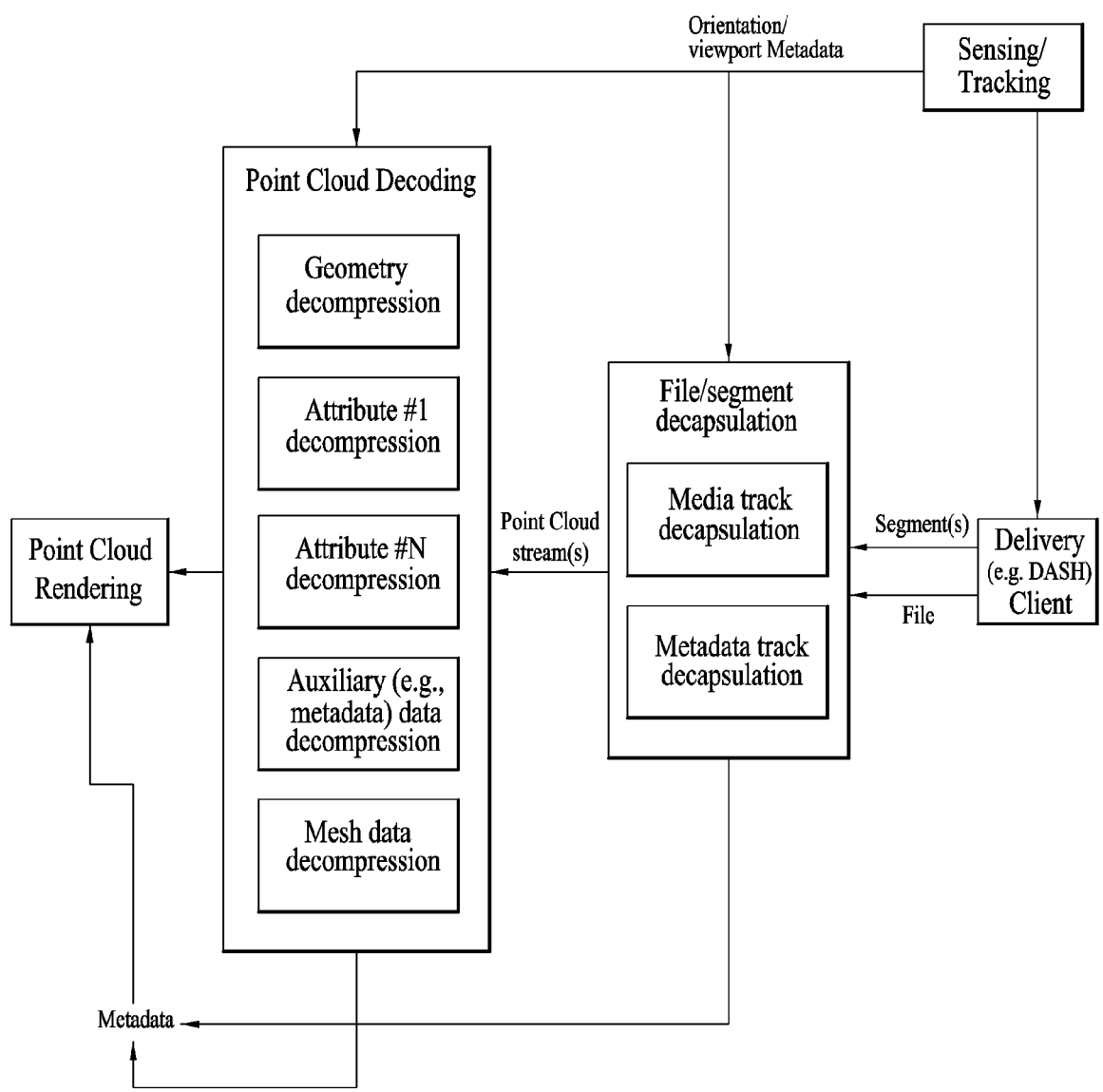
FIG. 16 illustrates an example of a reception device according to embodiments.

FIG. 16 shows an exemplary reception device according to embodiments.

The reception device of FIG. 16 is a device for receiving point cloud content, and corresponds to an example of the reception device described with reference to FIGS. 1 to 14 (for example, the reception device 10004 of FIG. 1, the point cloud video decoder of FIG. 11, and the reception device of FIG. 13, the reception device of FIG. 14). Accordingly, the reception device of FIG. 16 performs an operation that is identical or similar to that of the reception device described with reference to FIGS. 1 to 14. The reception device of FIG. 16 may receive a signal transmitted from the transmission device of FIG. 15, and perform a reverse process of the operation of the transmission device of FIG. 15.

The reception device according to the embodiments may perform at least one of delivery, file/segment decapsulation, point cloud video decoding, and point cloud rendering.

Since the point cloud reception and point cloud rendering operations illustrated in the figure are the same as those described with reference to FIGS. 1 to 14, a detailed description thereof will be omitted.

As described with reference to FIGS. 1 to 14, the reception device according to the embodiments decapsulate the file and/or segment acquired from a network or a storage device. According to embodiments, the reception device may perform media track decapsulation for carrying data (for example, media data) other than the metadata, and perform metadata track decapsulation for carrying metadata. According to embodiments, in the case where the metadata is encapsulated into a media track, the metadata track decapsulation is omitted.

As described with reference to FIGS. 1 to 14, the reception device may perform geometry decoding and attribute decoding on bitstreams (e.g., point cloud streams) secured through decapsulation. The geometry decoding may be referred to as geometry decompression, and the attribute decoding may be referred to as attribute decompression. As described above, one point may have one geometry and one or more attributes, each of which is encoded by the transmission device. Accordingly, the reception device performs attribute decoding on each attribute. The figure illustrates that the reception device performs one or more attribute decompressions (attribute #1 decompression, . . . , attribute #N decompression). The reception device according to the embodiments may also perform auxiliary decompression. The auxiliary decompression is performed on the metadata. Details of the metadata are the same as those described with reference to FIGS. 1 to 14, and thus a disruption thereof will be omitted. The reception device may also perform mesh data decompression. The mesh data decompression according to the embodiments may include the trisoup geometry decoding described with reference to FIGS. 1 to 14. The reception device according to the embodiments may render the point cloud data that is output according to the point cloud video decoding.

As described with reference to FIGS. 1 to 14, the reception device may secure orientation/viewport metadata using a separate sensing/tracking element, and transmit feedback information including the same to a transmission device (for example, the transmission device of FIG. 15). In addition, the reception device may perform at least one of a reception operation, file/segment decapsulation, and point cloud video decoding based on the feedback information. Details are the same as those described with reference to FIGS. 1 to 14, and thus a description thereof will be omitted.

Figure 17:
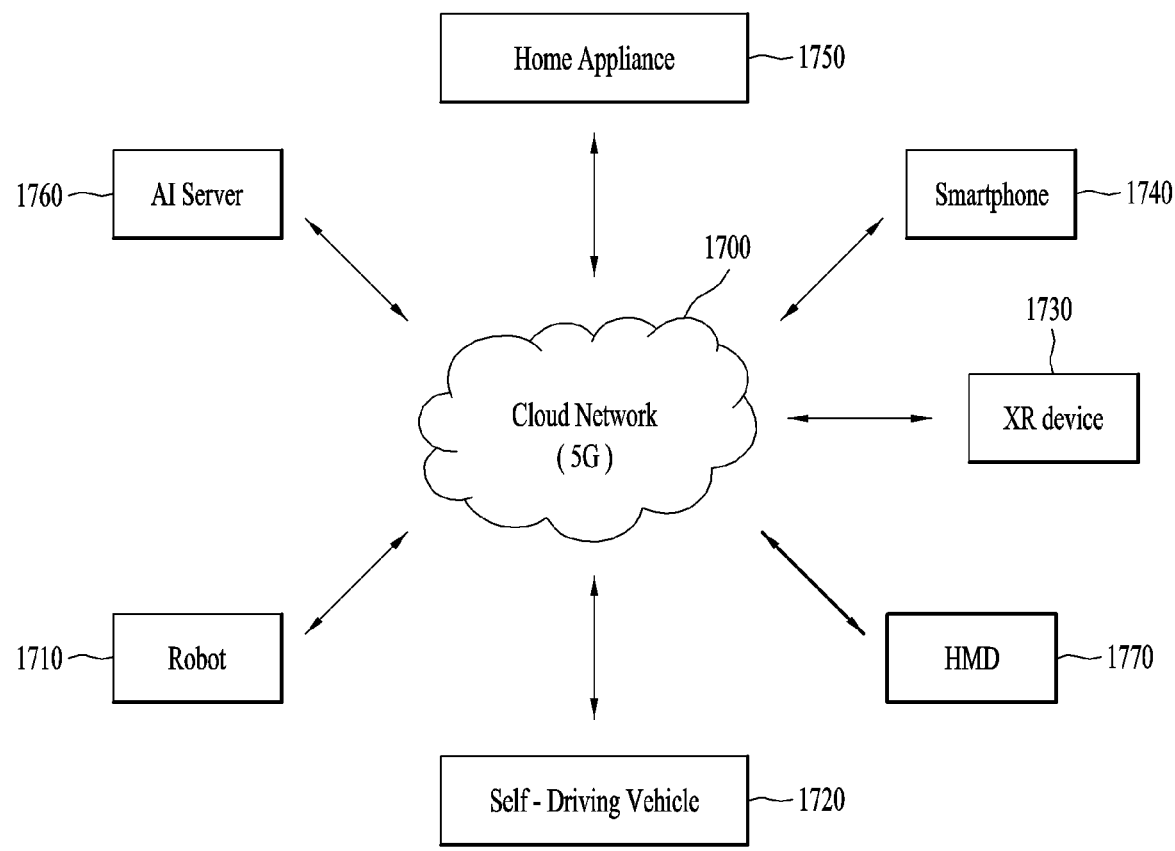
FIG. 17 illustrates an exemplary structure operatively connectable with a method/device for transmitting and receiving point cloud data according to embodiments.

FIG. 17 shows an exemplary structure operatively connectable with a method/device for transmitting and receiving point cloud data according to embodiments.

The structure of FIG. 17 represents a configuration in which at least one of a server 1760, a robot 1710, a self-driving vehicle 1720, an XR device 1730, a smartphone 1740, a home appliance 1750, and/or a head-mount display (HMD) 1770 is connected to a cloud network 1710. The robot 1710, the self-driving vehicle 1720, the XR device 1730, the smartphone 1740, or the home appliance 1750 is referred to as a device. In addition, the XR device 1730 may correspond to a point cloud compressed data (PCC) device according to embodiments or may be operatively connected to the PCC device.

The cloud network 1700 may represent a network that constitutes part of the cloud computing infrastructure or is present in the cloud computing infrastructure. Here, the cloud network 1700 may be configured using a 3G network, 4G or Long Term Evolution (LTE) network, or a 5G network.

The server 1760 may be connected to at least one of the robot 1710, the self-driving vehicle 1720, the XR device 1730, the smartphone 1740, the home appliance 1750, and/or the HMD 1770 over the cloud network 1700 and may assist in at least a part of the processing of the connected devices 1710 to 1770.

The HMD 1770 represents one of the implementation types of the XR device and/or the PCC device according to the embodiments. The HMD type device according to the embodiments includes a communication unit, a control unit, a memory, an I/O unit, a sensor unit, and a power supply unit.

Hereinafter, various embodiments of the devices 1710 to 1750 to which the above-described technology is applied will be described. The devices 1710 to 1750 illustrated in FIG. 17 may be operatively connected/coupled to a point cloud data transmission device and reception according to the above-described embodiments.

<PCC+XR>

The XR/PCC device 1730 may employ PCC technology and/or XR (AR+VR) technology, and may be implemented as an HMD, a head-up display (HUD) provided in a vehicle, a television, a mobile phone, a smartphone, a computer, a wearable device, a home appliance, a digital signage, a vehicle, a stationary robot, or a mobile robot.

The XR/PCC device 1730 may analyze 3D point cloud data or image data acquired through various sensors or from an external device and generate position data and attribute data about 3D points. Thereby, the XR/PCC device 1730 may acquire information about the surrounding space or a real object, and render and output an XR object. For example, the XR/PCC device 1730 may match an XR object including auxiliary information about a recognized object with the recognized object and output the matched XR object.

<PCC+Self-driving+XR>

The self-driving vehicle 1720 may be implemented as a mobile robot, a vehicle, an unmanned aerial vehicle, or the like by applying the PCC technology and the XR technology.

The self-driving vehicle 1720 to which the XR/PCC technology is applied may represent a self-driving vehicle provided with means for providing an XR image, or a self-driving vehicle that is a target of control/interaction in the XR image. In particular, the self-driving vehicle 1720 which is a target of control/interaction in the XR image may be distinguished from the XR device 1730 and may be operatively connected thereto.

The self-driving vehicle 1720 having means for providing an XR/PCC image may acquire sensor information from sensors including a camera, and output the generated XR/PCC image based on the acquired sensor information. For example, the self-driving vehicle 1720 may have an HUD and output an XR/PCC image thereto, thereby providing an occupant with an XR/PCC object corresponding to a real object or an object present on the screen.

When the XR/PCC object is output to the HUD, at least a part of the XR/PCC object may be output to overlap the real object to which the occupant's eyes are directed. On the other hand, when the XR/PCC object is output on a display provided inside the self-driving vehicle, at least a part of the XR/PCC object may be output to overlap an object on the screen. For example, the self-driving vehicle 1720 may output XR/PCC objects corresponding to objects such as a road, another vehicle, a traffic light, a traffic sign, a two-wheeled vehicle, a pedestrian, and a building.

The virtual reality (VR) technology, the augmented reality (AR) technology, the mixed reality (MR) technology and/or the point cloud compression (PCC) technology according to the embodiments are applicable to various devices.

In other words, the VR technology is a display technology that provides only CG images of real-world objects, backgrounds, and the like. On the other hand, the AR technology refers to a technology that shows a virtually created CG image on the image of a real object. The MR technology is similar to the AR technology described above in that virtual objects to be shown are mixed and combined with the real world. However, the MR technology differs from the AR technology in that the AR technology makes a clear distinction between a real object and a virtual object created as a CG image and uses virtual objects as complementary objects for real objects, whereas the MR technology treats virtual objects as objects having equivalent characteristics as real objects. More specifically, an example of MR technology applications is a hologram service.

Recently, the VR, AR, and MR technologies are sometimes referred to as extended reality (XR) technology rather than being clearly distinguished from each other. Accordingly, embodiments of the present disclosure are applicable to any of the VR, AR, MR, and XR technologies. The encoding/decoding based on PCC, V-PCC, and G-PCC techniques is applicable to such technologies.

The PCC method/device according to the embodiments may be applied to a vehicle that provides a self-driving service.

A vehicle that provides the self-driving service is connected to a PCC device for wired/wireless communication.

When the point cloud compression data (PCC) transmission/reception device according to the embodiments is connected to a vehicle for wired/wireless communication, the device may receive/process content data related to an AR/VR/PCC service, which may be provided together with the self-driving service, and transmit the same to the vehicle. In the case where the PCC transmission/reception device is mounted on a vehicle, the PCC transmission/reception device may receive/process content data related to the AR/VR/PCC service according to a user input signal input through a user interface device and provide the same to the user. The vehicle or the user interface device according to the embodiments may receive a user input signal. The user input signal according to the embodiments may include a signal indicating the self-driving service.

Meanwhile, the point cloud video encoder on the transmitting side may further perform a spatial partitioning process of spatially partitioning the point cloud data into one or more 3D blocks before encoding the point cloud data. That is, in order for the encoding and transmission operations of the transmission device and the decoding and rendering operations of the reception device to be performed in real time and processed with low latency, the transmission device may spatially partition the point cloud data into a plurality of regions. In addition, the transmission device may independently or non-independently encode the spatially partitioned regions (or blocks), thereby enabling random access and parallel encoding in the three-dimensional space occupied by the point cloud data. In addition, the transmission device and the reception device may perform encoding and decoding independently or non-independently for each spatially partitioned region (or block), thereby preventing errors from being accumulated in the encoding and decoding process.

Figure 18:
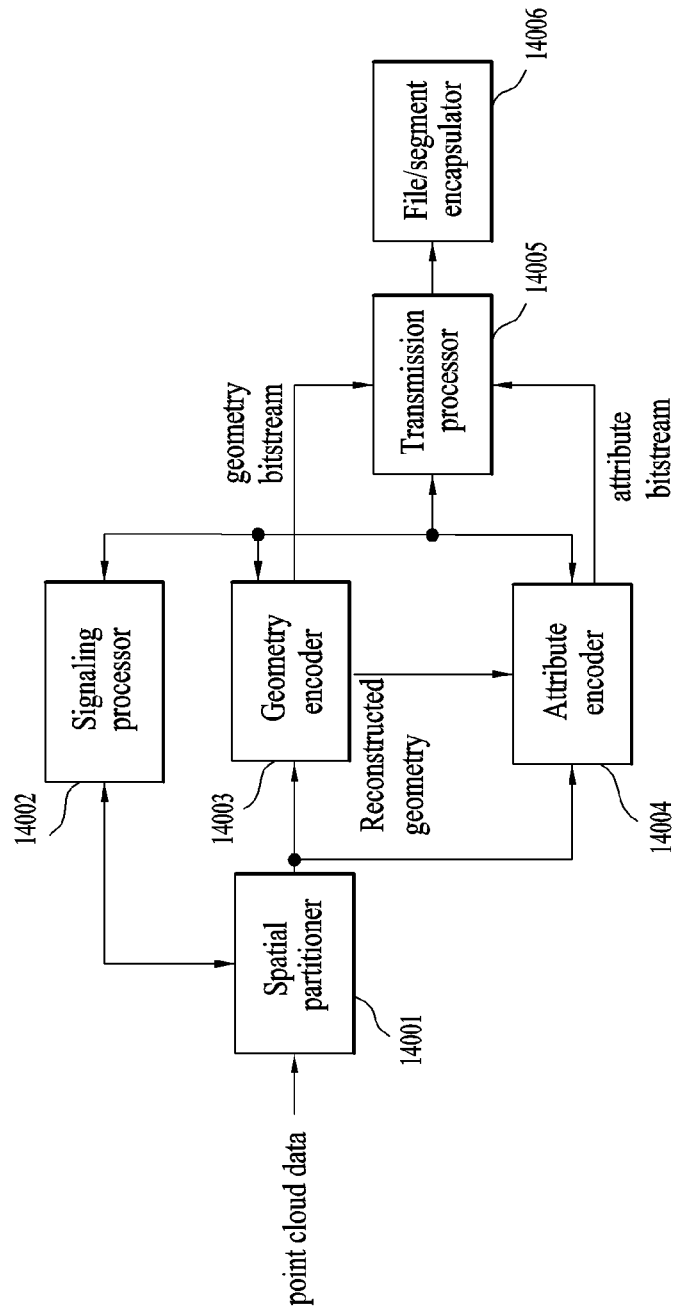
FIG. 18 illustrates an example of a point cloud transmission device according to embodiments.

FIG. 18 is a diagram illustrating another example of a point cloud transmission device according to embodiments, including a spatial partitioner.

The point cloud transmission device according to the embodiments may include a spatial partitioner 14001, a signaling processor 14002, a geometry encoder 14003, an attribute encoder 14004, a transmission processor 14005, and a file/segment encapsulator 14006. According to embodiments, the spatial partitioner 14001, the geometry encoder 14003, and the attribute encoder 14004 may be referred to as point cloud video encoders.

That is, the spatial partitioner 14001 may spatially partition the input point cloud data into one or more 3D blocks based on a bounding box and/or a sub-bounding box. Here, the 3D block may refer to a tile group, a tile, a slice, a coding unit (CU), a prediction unit (PU), or a transform unit (TU). In one embodiment, the signaling information for spatial partition is entropy-encoded by the signaling processor 14002 and then output to the transmission processor 14005 in the form of a bitstream.

FIGS. 19(a) to 19(c) illustrate an embodiment of partitioning a bounding box into one or more tiles. As shown in FIG. 19(a), a point cloud object, which corresponds to point cloud data, may be expressed in the form of a box based on a coordinate system, which is referred to as a bounding box. In other words, the bounding box represents a cube capable of containing all points of the point cloud.

FIGS. 19(b) and 19(c) illustrate an example in which the bounding box of FIG. 19(a) is partitioned into tile 1# and tile 2#, and tile 2# is partitioned again into slice 1 # and slice 2 #.

A tile may represent a partial region of a 3D space occupied by point cloud data according to embodiments. According to embodiments, a tile may include one or more slices. The tile according to the embodiments may be partitioned into one or more slices, and thus the point cloud video encoder may encode point cloud data in parallel.

A slice may mean a data unit in which the point cloud video encoder according to embodiments performs encoding and/or a data unit in which the point cloud video decoder according to embodiments performs decoding. A slice may be a set of data in a 3D space occupied by point cloud data, or a set of some data among the point cloud data. A slice may represent a region or set of points included in a tile according to embodiments. According to embodiments, a tile may be partitioned into one or more slices based on the number of points included in one tile. For example, one tile may be a set of points partitioned by the number of points. According to embodiments, a tile may be partitioned into one or more slices based on the number of points, and some data may be split or merged in the partitioning process. That is, a slice may be a unit that may be independently coded within a corresponding tile.

The point cloud video encoder according to the embodiments may encode point cloud data per slice per tile including one or more slices. In addition, the point cloud video encoder according to the embodiments may perform different quantization and/or transformation for each tile or each slice.

Positions of one or more 3D blocks spatially partitioned by the spatial partitioner 14001 are output to the geometry encoder 14003, and the attribute information (or attributes) is output to the attribute encoder 14004. The positions may be position information about the points included in a partition unit (box or block), and are referred to as geometry information.

The geometry encoder 14003 constructs and encodes an octree based on the positions output from the spatial partitioner 14001 to output a geometry bitstream. Also, the geometry encoder 14003 may reconstruct an octree and/or an approximated octree and output the same to the attribute encoder 14004. The reconstructed octree may be referred to as reconstructed geometry (or restored geometry).

The attribute encoder 14004 encodes the attributes output from the spatial partitioner 14001 based on the reconstructed geometry output from the geometry encoder 14003 and outputs an attribute bitstream.

The geometry encoder 14003 may perform some or all of the operations of the coordinates transformation unit 40000, the quantization unit 40001, the octree analysis unit 40002, the surface approximation analysis unit 40003, the arithmetic encoder 40004, and the geometry reconstruction unit 40005 of FIG. 4, or may perform some or all of the operations of the quantization processor 12001, the voxelization processor 12002, the octree occupancy code generator 12003, and the surface model processor 12004, the intra/inter-coding processor 12005, and the arithmetic coder 12006 of FIG. 12.

The attribute encoder 14004 may perform some or all of the operations of the color transformation unit 40006, the attribute transformation unit 40007, the RAHT transformation unit 40008, the LOD generation unit 40009, the lifting transformation unit 40010, and the coefficient quantization unit 40011, and the arithmetic encoder 40012 of FIG. 4, or perform some or all of the operations of the color transformation processor 12008, the attribute transformation processor 12009, the prediction/lifting/RAHT transformation processor 12010, and the arithmetic coder 12011.

The signaling processor 14002 may generate and/or process signaling information and output the same to the transmission processor 14005 in the form of a bitstream. The signaling information generated and/or processed by the signaling processor 14002 may be provided to the geometry encoder 14003, the attribute encoder 14004, and the transmission processor 14005 for geometry encoding, attribute encoding, and transmission processing. Alternatively, the signaling processor 14002 may receive signaling information generated by the geometry encoder 14003, the attribute encoder 14004, and the transmission processor 14005. In the present specification, the signaling information may be signaled and transmitted per parameter set (sequence parameter set (SPS), geometry parameter set (GPS), attribute parameter set (APS), tile parameter set (TPS) (also referred to as tile inventory), etc.). It may be signaled and transmitted on the basis of a coding unit of each image such as slice or tile. In the present specification, the signaling information may include metadata (for example, a set value, etc.) about point cloud data, and may be provided to the geometry encoder 14003, the attribute encoder 14004, and or the transmission processor 14005 for geometry encoding, attribute encoding, and transmission processing. Depending on the application, the signaling information may also be defined at the system side, such as a file format, dynamic adaptive streaming over HTTP (DASH), and MPEG media transport (MMT), or a wired interface side, such as high definition multimedia interface (HDMI), Display Port, Video Electronics Standards Association (VESA), and CTA.

A method/device according to the embodiments may signal related information to add/perform an operation of the embodiments. The signaling information according to embodiments may be used in a transmission device and/or a reception device.

The transmission processor 14005 may perform an operation and/or a transmission method identical or similar to the operation and/or transmission method of the transmission processor 12012 of FIG. 12, and may perform an operation and/or a transmission method identical or similar to the operation and/or transmission method of the transmitter 1003 of FIG. 1. Description of the details will be omitted, and reference will be made to the description of FIG. 1 or 12.

The transmission processor 14005 may output the geometry bitstream output from the geometry encoder 14003, the attribute bitstream output from the attribute encoder 14004, and the signaling bitstream output from the signaling processor 14002 to the file/segment encapsulator 14006, or may multiplex the same into one bitstream and output the bitstream to the file/segment encapsulator 14006.

According to an embodiment, the file/segment encapsulator 14006 encapsulates and transmits the input bitstream as a file or segment. According to an embodiment, the file is in an ISOBMFF file format.

According to embodiments, a file or segment may be transmitted to the reception device through the file/segment encapsulator 14006 or a delivery unit (not shown), or may be stored in a digital storage medium (e.g., USB, SD, CD, DVD, Blu-ray, HDD, SSD, etc.). The delivery unit according to the embodiments may perform wired/wireless communication with the reception device over a network such as 4G, 5G, or 6G. In addition, the delivery unit may perform a necessary data processing operation according to a network system (for example, a communication network system such as 4G, 5G, or 6G). In addition, the delivery unit may transmit the encapsulated data in an on-demand manner. According to embodiments, a geometry bitstream, an attribute bitstream, and a bitstream containing signaling information may be transmitted through each track, or may be transmitted through one single track. Details will be described later.

Figure 20:
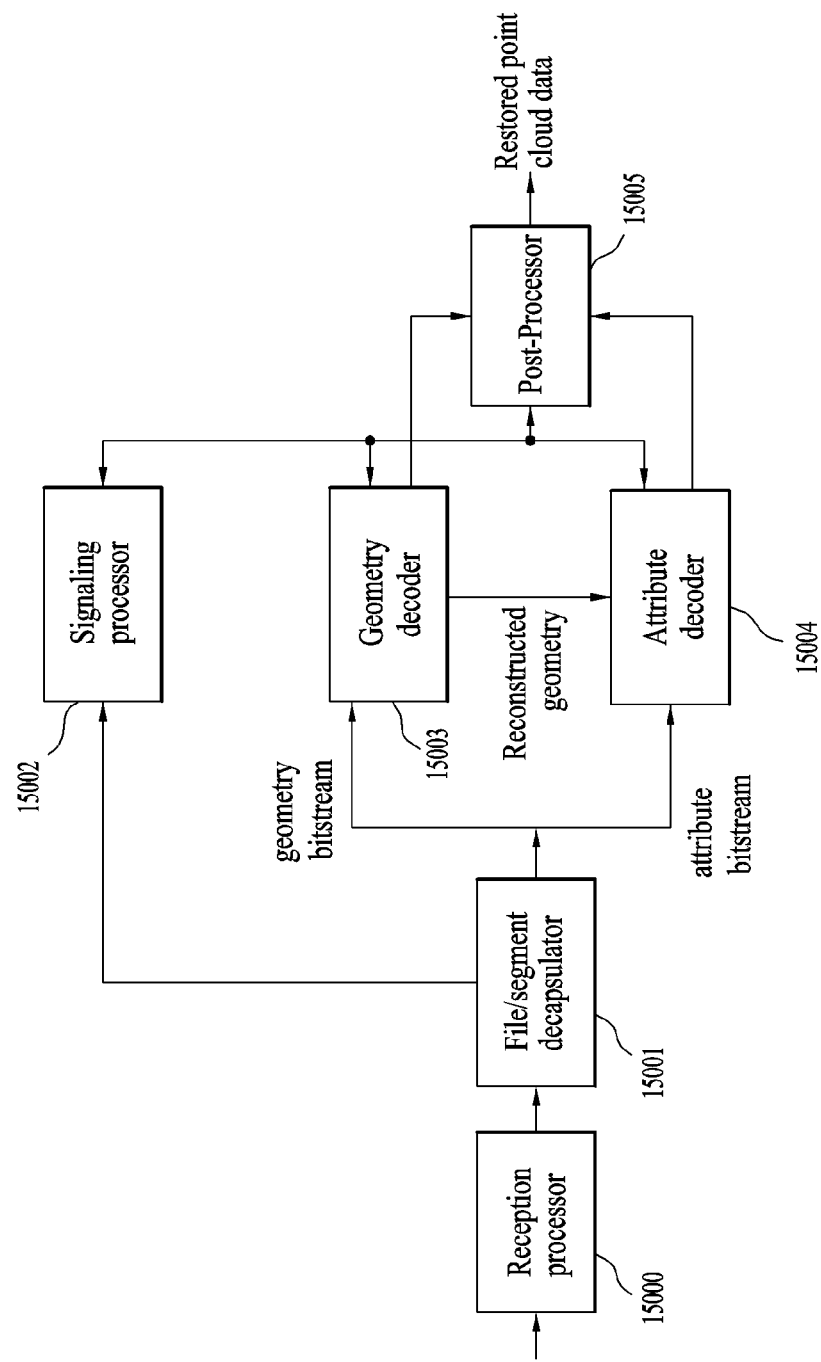
FIG. 20 illustrates an example of a point cloud reception device according to embodiments.

FIG. 20 is a diagram showing another exemplary point cloud reception device according to embodiments.

The point cloud reception device according to the embodiments may include a reception processor 15000, a file/segment decapsulator 15001, a signaling processor 15002, a geometry decoder 15003, an attribute decoder 15004, and a post-processor 15005. According to embodiments, the geometry decoder 15003 and the attribute decoder 15004 may be collectively referred to as a point cloud video decoder. According to embodiments, the point cloud video decoder may be referred to as a PCC decoder, a PCC decoding unit, a point cloud video decoder, a point cloud video decoding unit, or the like.

The reception device according to the embodiments may include a device, a robot, a vehicle, an AR/VR/XR device, a portable device, a home appliance, an Internet of Thing (IoT) device, and an AI device/server which are configured to perform communication with a base station and/or other wireless devices using a radio access technology (e.g., 5G New RAT (NR), Long Term Evolution (LTE)).

The reception processor 15000 according to the embodiments receives a bitstream containing point cloud video data or a file/segment into which the bitstream is encapsulated from a delivery unit or a storage medium. The reception processor 15000 may perform a necessary data processing operation according to a network system (for example, a communication network system such as 4G, 5G, or 6G).

The file/segment decapsulator 15001 according to the embodiments may decapsulate the received file/segment and output a bitstream.

According to embodiments, a geometry bitstream, an attribute bitstream, and a bitstream containing signaling information may be received through respective tracks of the file, or may be received through a single track of the file.

In other words, a single bitstream may be decapsulated by the file/segment decapsulator 15001, or a geometry bitstream, an attribute bitstream, and a signaling bitstream may be decapsulated and output to the geometry decoder 15003, the attribute decoder 15004 and the signaling processor 15002, respectively. When the single bitstream is decapsulated by the file/segment decapsulator 15001, the geometry bitstream, the attribute bitstream, and the signaling bitstream are demultiplexed from the single bitstream. The demultiplexed signaling bitstream is output to the signaling processor 15002, the geometry bitstream is output to the geometry decoder 15003, and the attribute bitstream is output to the attribute decoder 15004.

The signaling processor 15002 May parse and process, from the input signaling bitstream, signaling information, for example, information contained in the SPS, GPS, APS, TPS, metadata, and the like and provide the same to the geometry decoder 15003, the attribute decoder 15004, and the post-processor 15005. That is, when the point cloud data is partitioned into tiles and/or slices at the transmitting side as shown in FIG. 19, the TPS includes the number of slices included in each tile, and accordingly the point cloud video decoder according to the embodiments may check the number of slices and quickly parse information for parallel decoding.

Accordingly, the point cloud video decoder according to the present disclosure may quickly parse a bitstream containing point cloud data as it receives an SPS having a reduced amount of data. The reception device may decode tiles upon receiving the tiles, and may decode each slice based on the GPS and APS included in each tile. Thereby, decoding efficiency may be maximized.

That is, the geometry decoder 15003 may reconstruct the geometry by performing the reverse process of the operation of the geometry encoder 14003 of FIG. 18 on the input geometry bitstream based on signaling information (e.g., geometry related parameters). The geometry restored (or reconstructed) by the geometry decoder 15003 is provided to the attribute decoder 15004. The attribute decoder 15004 may restore the attribute by performing the reverse process of the operation of the attribute encoder 14004 of FIG. 18 on the input attribute bitstream based on signaling information (e.g., attribute related parameters) and the reconstructed geometry. According to embodiments, when the point cloud data is partitioned into tiles and/or slices at the transmitting side as shown in FIG. 19, the geometry decoder 15003 and the attribute decoder 15004 perform geometry decoding and attribute decoding on a tile-by-tile basis and/or slice-by-slice basis.

The geometry decoder 15003 according to the embodiments may perform some or all of the operations of the arithmetic decoder 11000, the octree synthesis unit 11001, the surface approximation synthesis unit 11002, the geometry reconstruction unit 11003, and the coordinates inverse transformation unit 11004 of FIG. 11, or may perform some or all of the operations of the arithmetic decoder 13002, the occupancy code-based octree reconstruction processor 13003, the surface model processor 13004, and the inverse quantization processor 13005 of FIG. 13.

The attribute decoder 15004 according to the embodiments may perform some or all of the operations of the arithmetic decoder 11005, the inverse quantization unit 11006, the RAHT transformation unit 11007, the LOD generation unit 11008, the inverse lifting unit 11009, and the color inverse transformation unit 11010 of FIG. 11, or may perform some or all of the operations of the arithmetic decoder 13007, the inverse quantization processor 13008, the prediction/lifting/RAHT inverse transformation processor 13009, and the color inverse transformation processor 13010 of FIG. 13.

The post-processor 15005 may reconstruct the point cloud data by matching the restored geometry with the restored attributes. In addition, when the reconstructed point cloud data is in a tile and/or slice unit, the post-processor 15005 may perform a reverse process of the spatial partitioning at the transmitting side based on the signaling information. For example, when the bounding box as shown in FIG. 19(*a*) is partitioned into tiles and slices as shown in of FIGS. 19(*b*) and 19(*c*), the tiles and/or slices may be combined based on the signaling information to restore the bounding box as shown in FIG. 19(*a*).

Figure 21:
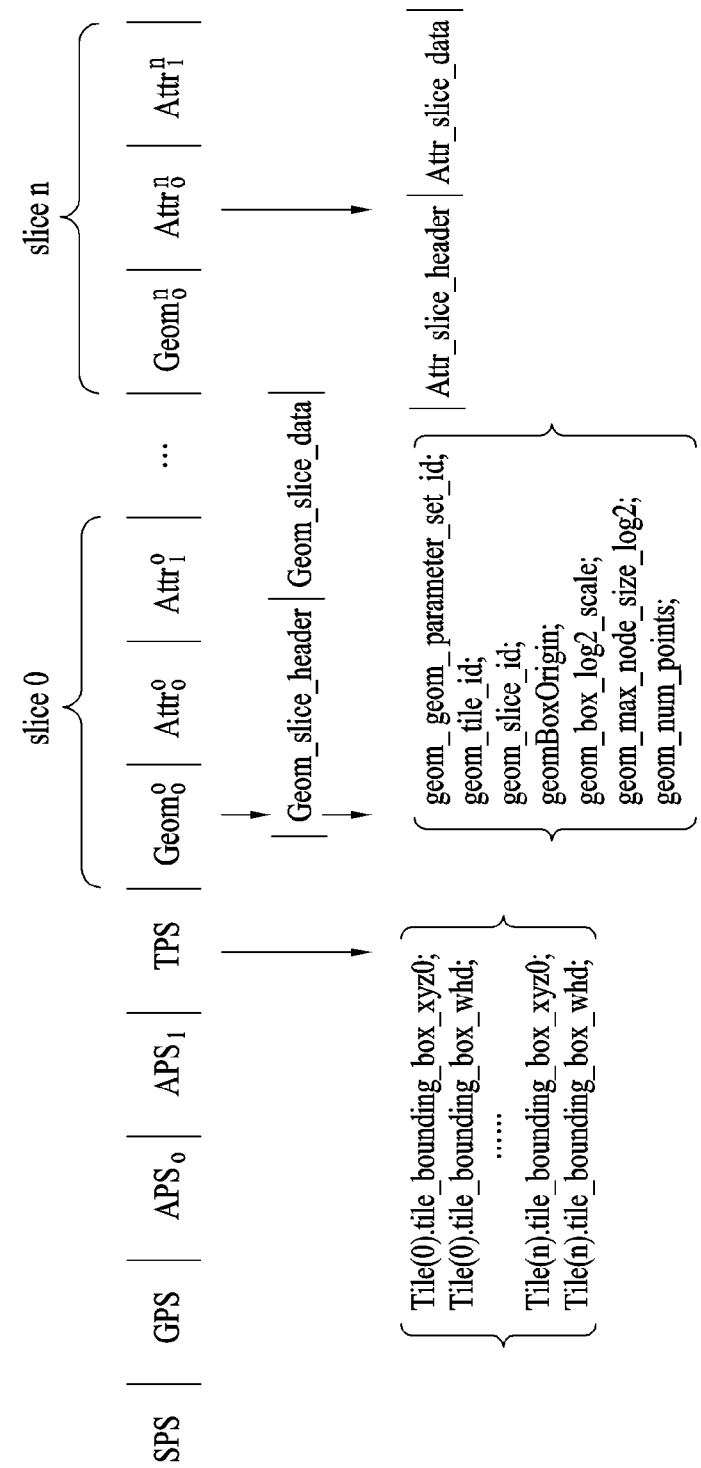
FIG. 21 illustrates an exemplary bitstream structure for point cloud data for transmission/reception according to embodiments.

FIG. 21 shows an exemplary bitstream structure for point cloud data for transmission/reception according to embodiments.

When a geometry bitstream, an attribute bitstream, and a signaling bitstream according to embodiments are configured as one bitstream, the bitstream may include one or more sub-bitstreams. The bitstream according to the embodiments may include a sequence parameter set (SPS) for sequence level signaling, a geometry parameter set (GPS) for signaling of geometry information coding, one or more attribute parameter sets (APSs) (APS$_0$, APS$_1$) for signaling of attribute information coding, a tile parameter set (TPS) (or tile inventory) for tile level signaling, and one or more slices (slice 0 to slice n). That is, a bitstream of point cloud data according to embodiments may include one or more tiles, and each of the tiles may be a group of slices including one or more slices (slice 0 to slice n). The TPS according to the embodiments may contain information about each of the one or more tiles (e.g., coordinate value information and height/size information about the bounding box). Each slice may include one geometry bitstream (Geom0) and one or more attribute bitstreams (Attr0 and Attr1). For example, a first slice (slice 0) may include one geometry bitstream (Geom0$^0$) and one or more attribute bitstreams (Attr0$^0$, Attr1$^0$).

The geometry bitstream in each slice may be composed of a geometry slice header (geom_slice_header) and geometry slice data (geom_slice_data). According to embodiments, geom_slice_header may include identification information (geom_parameter_set_id), a tile identifier (geom_tile_id), and a slice identifier (geom_slice_id) for a parameter set included in the GPS, and information (geomBoxOrigin, geom_box_log 2_scale, geom_max_node_size_log 2, geom_num_points) about data contained in the geometry slice data (geom_slice_data). geomBoxOrigin is geometry box origin information indicating the origin of the box of the geometry slice data, geom_box_log 2_scale is information indicating the log scale of the geometry slice data, geom_max_node_size_log 2 is information indicating the size of the root geometry octree node, and geom_num_points is information related to the number of points of the geometry slice data. According to embodiments, the geom_slice_data may include geometry information (or geometry data) about the point cloud data in a corresponding slice.

Each attribute bitstream in each slice may be composed of an attribute slice header (attr_slice_header) and attribute slice data (attr_slice_data). According to embodiments, the attr_slice_header may include information about the corresponding attribute slice data. The attribute slice data may contain attribute information (or attribute data) about the point cloud data in the corresponding slice. When there is a plurality of attribute bitstreams in one slice, each of the bitstreams may contain different attribute information. For example, one attribute bitstream may contain attribute information corresponding to color, and another attribute stream may contain attribute information corresponding to reflectance.

Figure 22:
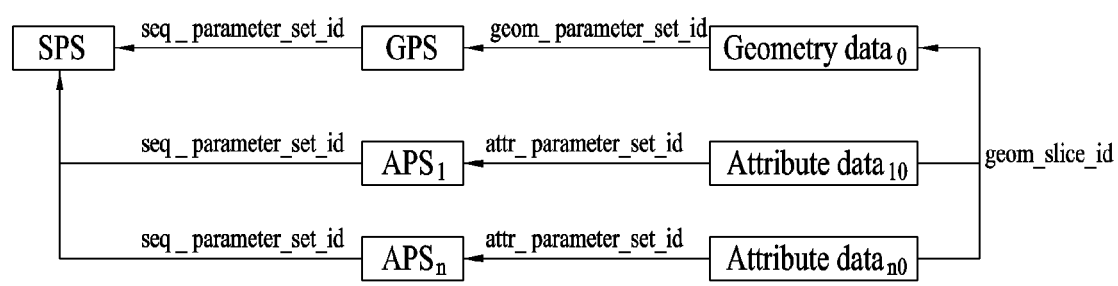
FIG. 22 illustrates an exemplary bitstream structure for point cloud data according to embodiments.

FIG. 22 shows an exemplary bitstream structure for point cloud data according to embodiments.

Figure 23:
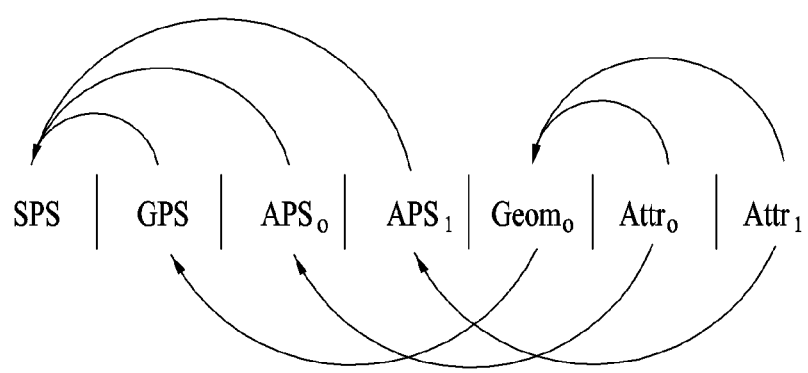
FIG. 23 illustrates a connection relationship between components in a bitstream of point cloud data according to embodiments.

FIG. 23 illustrates a connection relationship between components in a bitstream of point cloud data according to embodiments.

The bitstream structure for the point cloud data illustrated in FIGS. 22 and 23 may represent the bitstream structure for point cloud data shown in FIG. 21.

According to the embodiments, the SPS may include an identifier (seq_parameter_set_id) for identifying the SPS, and the GPS may include an identifier (geom_parameter_set_id) for identifying the GPS and an identifier (seq_parameter_set_id) indicating an active SPS to which the GPS belongs. The APS may include an identifier (attr_parameter_set_id) for identifying the APS and an identifier (seq_parameter_set_id) indicating an active SPS to which the APS belongs. According to embodiments, geometry data may include a geometry slice header and geometry slice data. The geometry slice header may include an identifier (geom_parameter_set_id) of an active GPS to be referred to by a corresponding geometry slice. The geometry slice header may further include an identifier (geom_slice_id) for identifying a corresponding geometry slice and/or an identifier (geom_tile_id) for identifying a corresponding tile. The geometry slice data may include a geometry bitstream belonging to a corresponding slice. According to embodiments, attribute data may include an attribute slice header and attribute slice data. The attribute slice header may include an identifier (attr_parameter_set_id) of an active APS to be referred to by a corresponding attribute slice and an identifier (geom_slice_id) for identifying a geometry slice related to the attribute slice. The attribute slice data may include an attribute bitstream belonging to a corresponding slice.

That is, the geometry slice refers to the GPS, and the GPS refers the SPS. In addition, the SPS lists available attributes, assigns an identifier to each of the attributes, and identifies a decoding method. The attribute slice is mapped to output attributes according to the identifier. The attribute slice has a dependency on the preceding (decoded) geometry slice and the APS. The APS refers to the SPS.

According to embodiments, parameters necessary for encoding of the point cloud data may be newly defined in a parameter set of the point cloud data and/or a corresponding slice header. For example, when encoding of the attribute information is performed, the parameters may be added to the APS. When tile-based encoding is performed, the parameters may be added to the tile and/or slice header.

As shown in FIGS. 21, 22, and 23, the bitstream of the point cloud data provides tiles or slices such that the point cloud data may be partitioned and processed by regions. According to embodiments, the respective regions of the bitstream may have different importances. Accordingly, when the point cloud data is partitioned into tiles, a different filter (encoding method) and a different filter unit may be applied to each tile. When the point cloud data is partitioned into slices, a different filter and a different filter unit may be applied to each slice.

When the point cloud data is partitioned and compressed, the transmission device and the reception device according to the embodiments may transmit and receive a bitstream in a high-level syntax structure for selective transmission of attribute information in the partitioned regions.

The transmission device according to the embodiments may transmit point cloud data according to the bitstream structure as shown in FIGS. 21, 22, and 23. Accordingly, a method to apply different encoding operations and use a good-quality encoding method for an important region may be provided. In addition, efficient encoding and transmission may be supported according to the characteristics of point cloud data, and attribute values may be provided according to user requirements.

The reception device according to the embodiments may receive the point cloud data according to the bitstream structure as shown in FIGS. 21, 22, and 23. Accordingly, different filtering (decoding) methods may be applied to the respective regions (regions partitioned into tiles or into slices), rather than a complexly decoding (filtering) method being applied to the entire point cloud data. Therefore, better image quality in a region important to the user and an appropriate latency to the system may be ensured.

A field, which is a term used in syntaxes of the present disclosure described below, may have the same meaning as a parameter or element.

FIG. 24 shows an embodiment of a syntax structure of a sequence parameter set (SPS) (seq_parameter_set( )) according to the present disclosure. The SPS may contain sequence information about a point cloud data bitstream.

The SPS according to the embodiments may include a reserved_profile_compatibility_23bits field, a unique_point_positions_constraint_flag field, a level_idc field, an sps_bounding_box_present flag field, an sps_source_scale_factor field, an sps_seq_parameter_set_id field, an sps_num_attribute_sets field, an log 2_max_frame_idx field, an axis_coding_order field, an sps_bypass_stream_enabled_flag field, and an sps_extension_present_flag field.

The reserved_profile_compatibility_23bits field having a value equal to 1 may indicate that the bitstream conforms to the profile. In present disclosure, the value of the reserved_profile_compatibility_23bits field is 0 as an embodiment. In this case, the decoders of the reception device ignore the value of the reserved_profile_compatibility_23bits field.

When the value of the unique_point_positions_constraint_ flag field is 1, all output points may have unique positions in each point cloud frame referred to by the current SPS. When the value of the unique_point_positions_constraint_flag field is 0, two or more output points may have the same position in a point cloud frame referred to by the current SPS. For example, even though all points are unique in each slice, slices and other points within a frame may overlap. In this case, the unique_point_positions_constraint_flag field is set to 0.

The level_idc field indicates a level to which the bitstream conforms.

The sps_bounding_box_present_flag field indicates whether source bounding box information is signaled in the SPS. The source bounding box information may include offset and size information about the source bounding box. For example, the sps_bounding_box_present_flag field equal to 1 indicates that the source bounding box information is signaled in the SPS. The sps_bounding_box_present_flag field equal to 0 indicates the source bounding box information is not signaled. The sps_source_scale_factor field indicates the scale factor of the source point cloud.

The sps_seq_parameter_set_id field provides an identifier for the SPS for reference by other syntax elements.

The sps_num_attribute_sets field indicates the number of coded attributes in the bitstream.

The sps_extension_present_flag field specifies whether the sps_extension_data syntax structure is present in the SPS syntax structure. For example, the sps_extension_present_flag field equal to 1 specifies that the sps_extension_data syntax structure is present in the SPS syntax structure. The sps_extension_present_flag field equal to 0 specifies that this syntax structure is not present. When not present, the value of the sps_extension_present_flag field is inferred to be equal to 0.

When the sps_bounding_box_present_flag field is equal to 1, the SPS according to embodiments may further include an sps_bounding_box_offset_x field, an sps_bounding_box_offset_y field, an sps_bounding_box_offset_z field, an sps_bounding_box_scale_factor field, an sps_bounding_box_size_width field, an sps_bounding_box_size_height field, and an sps_bounding_box_size_depth field.

The sps_bounding_box_offset_x field indicates the x offset of the source bounding box in the Cartesian coordinates. When the x offset of the source bounding box is not present, the value of sps_bounding_box_offset_x is 0.

The sps_bounding_box_offset_y field indicates the y offset of the source bounding box in the Cartesian coordinates. When the y offset of the source bounding box is not present, the value of sps_bounding_box_offset_y is 0.

The sps_bounding_box_offset_z field indicates the z offset of the source bounding box in the Cartesian coordinates. When the z offset of the source bounding box is not present, the value of sps_bounding_box_offset_z is 0.

The sps_bounding_box_scale_factor field indicates the scale factor of the source bounding box in the Cartesian coordinates. When the scale factor of the source bounding box is not present, the value of sps_bounding_box_scale_factor may be 1.

The sps_bounding_box_size_width field indicates the width of the source bounding box in the Cartesian coordinates. When the width of the source bounding box is not present, the value of the sps_bounding_box_size_width field may be 1.

The sps_bounding_box_size_height field indicates the height of the source bounding box in the Cartesian coordinates. When the height of the source bounding box is not present, the value of the sps_bounding_box_size_height field may be 1.

The sps_bounding_box_size_depth field indicates the depth of the source bounding box in the Cartesian coordinates. When the depth of the source bounding box is not present, the value of the sps_bounding_box_size_depth field may be 1.

The SPS according to embodiments includes an iteration statement repeated as many times as the value of the sps_num_attribute_sets field. In an embodiment, i is initialized to 0, and is incremented by 1 each time the iteration statement is executed. The iteration statement is repeated until the value of i becomes equal to the value of the sps_num_attribute_sets field. The iteration statement may include an attribute_dimension[i] field, an attribute_instance_id[i] field, an attribute_bitdepth[i] field, an attribute_cicp_colourprimaries[i] field, an attribute_cicp_transfer_characteristics[i] field, an attribute_cicp_matrix_coeffs[i] field, an attribute_cicp_video_full_range_flag[i] field, and a known_attribute_label_flag[i] field.

The attribute_dimension[i] field specifies the number of components of the i-th attribute.

The attribute_instance_id[i] field specifies the instance ID of the i-th attribute.

The attribute_bitdepth[i] field specifies the bitdepth of the i-th attribute signal(s).

The attribute_cicp_colourprimaries[i] field indicates chromaticity coordinates of the color attribute source primaries of the i-th attribute.

The attribute_cicp_transfer_characteristics[i] field either indicates the reference opto-electronic transfer characteristic function of the colour attribute as a function of a source input linear optical intensity with a nominal real-valued range of 0 to 1 or indicates the inverse of the reference electro-optical transfer characteristic function as a function of an output linear optical intensity.

The attribute_cicp_matrix_coeffs[i] field describes the matrix coefficients used in deriving luma and chroma signals from the green, blue, and red, or Y, Z, and X primaries.

The attribute_cicp_video_full_range_flag[i] field indicates the black level and range of the luma and chroma signals as derived from E'Y, E'PB, and E'PR or E'R, E'G, and E'B real-valued component signals.

The known_attribute_label_flag[i] field specifies whether a know_attribute_label field or an attribute_label_four_bytes field is signaled for the i-th attribute. For example, the value of the known_attribute_label_flag[i] field equal to 0 specifies that the known_attribute_label field is signaled for the ith attribute. The known_attribute_label_flag[i] field equal to 1 specifies that the attribute_label_four_bytes field is signaled for the ith attribute.

The known_attribute_label[i] field may specify an attribute type. For example, the known_attribute_label[i] field equal to 0 may specify that the i-th attribute is color. The known_attribute_label[i] field equal to 1 specifies that the i-th attribute is reflectance. The known_attribute_label[i] field equal to 2 may specify that the i-th attribute is frame index.

The attribute_label_four_bytes field indicates the known attribute type with a 4-byte code.

FIG. 25 shows a table listing exemplary attribute types allocated to the attribute_label_four_bytes field.

In this example, the attribute_label_four_bytes field indicates color when equal to 0, indicates reflectance when is equal to 1, and indicates frame index when equal to 2.

The log 2_max_frame_idx field specifies the number of bits used to signal a frame_idx syntax variable.

The axis_coding_order field i specifies the correspondence between the X, Y, and Z output axis labels and the three position components in the reconstructed point cloud RecPic [pointidx] [axis] with axis=0, . . . , 2.

FIG. 26 is a table showing an example of mapping output X, Y, and Z axis labels to indices axis of RecPIC [i] [axis] according to embodiments.

The sps_bypass_stream_enabled_flag field equal to 1 may specify that the bypass coding mode is used on reading the bitstream. As another example, the sps_bypass_stream_enabled_flag field equal to 0 may specify that the bypass coding mode is not used on reading the bitstream.

According to embodiments, when the sps_extension_present_flag field is equal to 1, the SPS may further include a sps_extension_data_flag field.

The sps_extension_data_flag field may have any value.

FIG. 27 shows an embodiment of a syntax structure of the geometry parameter set (GPS) (geometry_parameter_set( )) according to the present disclosure. The GPS according to the embodiments may contain information on a method of encoding geometry information about point cloud data contained in one or more slices.

According to embodiments, the GPS may include a gps_geom_parameter_set_id field, a gps_seq_parameter_set_id field, a gps_box_present_flag field, a unique_geometry_points_flag field, a neighbour_context_restriction_flag_field, an inferred_direct_coding_mode_enabled_flag field, a bitwise_occupancy_coding_flag field, an adjacent_child_contextualization_enabled_flag field, a log 2_neighbour_avail_boundary field, a log 2_intra_pred_max_node_size field, a log 2_trisoup_node_size field, a geom_scaling_enabled_flag field, a gps_implicit_geom_partition_flag field, and a gps_extension_present_flag field.

The gps_geom_parameter_set_id field provides an identifier for the GPS for reference by other syntax elements.

The gps_seq_parameter_set_id field specifies the value of sps_seq_parameter_set_id for the active SPS.

The gps_box_present_flag field specifies whether additional bounding box information is provided in a geometry slice header that references the current GPS. For example, the gps_box_present_flag field equal to 1 may specify that additional bounding box information is provided in a geometry header that references the current GPS. Accordingly, when the gps_box_present_flag field is equal to 1, the GPS may further include a gps_gsh_box_log 2_scale_present_flag field.

The gps_gsh_box_log 2_scale_present_flag field specifies whether the gps_gsh_box_log 2_scale field is signaled in each geometry slice header that references the current GPS. For example, the gps_gsh_box_log 2_scale_present_flag field equal to 1 may specify that the gps_gsh_box_log 2_scale field is signaled in each geometry slice header that references the current GPS. As another example, the gps_gsh_box_log 2_scale_present_flag field equal to 0 may specify that the gps_gsh_box_log 2_scale field is not signaled in each geometry slice header and a common scale for all slices is signaled in the gps_gsh_box_log 2_scale field of the current GPS.

When the gps_gsh_box_log 2_scale_present_flag field is equal to 0, the GPS may further include a gps_gsh_box_log 2_scale field.

The gps_gsh_box_log 2_scale field indicates the common scale factor of the bounding box origin for all slices that refer to the current GPS.

The unique geometry_points_flag field indicates whether, in all slices that refer to the current GPS, all output points have unique positions within a slice. For example, the unique_geometry_points_flag field equal to 1 indicates that in all slices that refer to the current GPS, all output points have unique positions within a slice. The unique_geometry_points_flag field equal to 0 indicates that in all slices that refer to the current GPS, the two or more of the output points may have the same position within a slice.

The geometry_planar_mode_flag field indicates whether the planar coding mode is activated. For example, the geometry_planar_mode_flag field equal to 1 indicates that the planar coding mode is activated. geometry_planar_mode_flag equal to 0 indicates that the planar coding mode is not activated.

The geom_planar_mode_th_IDCM field may specify the value of the threshold of activation for the direct coding mode.

When the geometry_planar_mode_flag field is equal to 1, the geom_planar_mode_th[i] field specifies, for i in the range 0 . . . 2, the value of the threshold of activation for the planar coding mode along the i-th most probable direction for the planar coding mode to be efficient.

The neighbor_context_restriction_flag field indicates contexts used for octree occupancy coding. For example, the neighbour_context_restriction_flag_field equal to 0 indicates that octree occupancy coding uses contexts determined from six neighboring parent nodes. The neighbour_context_restriction_flag_field equal to 1 indicates that octree occupancy coding uses contexts determined from sibling nodes only.

The inferred_direct_coding_mode_enabled_flag field indicates whether the direct_mode_flag field is present in the geometry node syntax. For example, the inferred_direct_coding_mode_enabled_flag field equal to 1 indicates that the direct_mode_flag field may be present in the geometry node syntax. For example, the inferred_direct_coding_mode_enabled_flag field equal to 0 indicates that the direct_mode_flag field is not present in the geometry node syntax.

The bitwise_occupancy_coding_flag field indicates whether geometry node occupancy is encoded using bitwise contextualization of the syntax element occupancy map. For example, the bitwise_occupancy_coding_flag field equal to 1 indicates that geometry node occupancy is encoded using bitwise contextualisation of the syntax element ocupancy_map. For example, the bitwise_occupancy_coding_flag field equal to 0 indicates that geometry node occupancy is encoded using the dictionary encoded syntax element occupancy_byte.

The adjacent_child_contextualization_enabled_flag field indicates whether the adjacent children of neighboring octree nodes are used for bitwise occupancy contextualization. For example, the adjacent_child_contextualization_enabled_flag field equal to 1 indicates that the adjacent children of neighboring octree nodes are used for bitwise occupancy contextualization. For example, adjacent_child_contextualization_enabled_flag equal to 0 indicates that the children of neighbouring octree nodes are not used for the occupancy contextualization.

The log 2_neighbour_avail_boundary field specifies the value of the variable NeighbAvailBoundary that is used in the decoding process as follows:

$$NeighbAvailBoundary = 2^{log2\_neighbour\_avail\_boundary}$$

For example, when the neighbour_context_restriction_flag_field is equal to 1, NeighbAvailabilityMask may be set equal to 1. For example, when the neighbour_context_restriction_flag_field is equal to 0, NeighbAvailabilityMask may be set equal to 1<<log 2_neighbour_avail_boundary.

The log 2_intra_pred_max_node_size field specifies the octree node size eligible for occupancy intra prediction.

The log 2_trisoup_node_size field specifies the variable TrisoupNodeSize as the size of the triangle nodes as follows.

TrisoupNodeSize=1<<log 2_trisoup_node_size

When the value of the log 2_trisoup_node_size field is equal to 0, the geometry bitstream includes only the octree coding syntax. When the value of the log 2_trisoup_node_size field is greater than 0, the value of the inferred_direct_coding_mode_enabled_flag field must be 0, and the value of the unique_geometry_points_flag field must be 1.

The geom_scaling_enabled_flag field indicates whether a scaling process for geometry positions is invoked during the geometry slice decoding process. For example, the geom_scaling_enabled_flag field equal to 1 specifies that a scaling process for geometry positions is invoked during the geometry slice decoding process. The geom_scaling_enabled_flag equal to 0 specifies that geometry positions do not require scaling.

The geom_base_qp field specifies the base value of the geometry position quantization parameter. When not present, geom_base_qp may be inferred to be equal to 4.

The gps_implicit_geom_partition_flag field specifies whether the implicit geometry partition is enabled for the sequence or slice. For example, gps_implicit_geom_partition_flag equal to 1 specifies that the implicit geometry partition is enabled for the sequence or slice. gps_implicit_geom_partition_flag equal to 0 specifies that the implicit geometry partition is disabled for the sequence or slice. When gps_implicit_geom_partition_flag field is equal to 1, the following two fields, that is, gps_max_num_implicit_qtbt_before_ot and gps_min_size_implicit_qtbt are signaled.

The gps_max_num_implicit_qtbt_before_ot field specifies the maximal number of implicit QT and BT partitions before OT partitions. The variable K is then initialized by the gps_max_num_implicit_qtbt_before_ot field as follows:

K=gps_max_num_implicit_qtbt_before_ot.

The gps_min_size_implicit_qtbt field specifies the minimal size of implicit QT and BT partitions. The variable M is then initialized by the gps_min_size_implicit_qtbt field as follows:

M=gps_min_size_implicit_qtbt.

The gps_extension_present_flag field specifies whether the gps_extension_data syntax structure is present in the GPS syntax structure. For example, gps_extension_present_flag equal to 1 specifies that the gps_extension_data syntax structure is present in the GPS syntax. For example, gps_extension_present_flag equal to 0 specifies that this syntax structure is not present in the GPS syntax.

When the value of the gps_extension_present_flag field is equal to 1, the GPS according to the embodiments may further include a gps_extension_data_flag field.

The gps_extension_data_flag field may have any value. Its presence and value do not affect the decoder conformance to profiles.

FIG. 28 shows an embodiment of a syntax structure of the attribute parameter set (APS) (attribute_parameter_set( )) according to the present disclosure. The APS according to the embodiments may contain information on a method of encoding attribute information about point cloud data contained in one or more slices.

The APS according to the embodiments may include an aps_attrparameter_set_id field, an aps_seq_parameter_set_id field, an attr_coding_type field, an aps_attr_initial_qp field, an aps_attr_chroma_qp_offset field, an aps_slice_qp_deltapresent_flag field, and an aps_flag field.

The aps_attr_parameter_set_id field provides an identifier for the APS for reference by other syntax elements.

The aps_seq_parameter_set_id field specifies the value of sps_seq_parameter_set_id for the active SPS.

The attr_coding_type field indicates the coding type for the attribute.

FIG. 29 is a table showing exemplary attribute coding types allocated to the attr_coding_type field.

In this example, the attr_coding_type field equal to 0 indicates predicting weight lifting as the coding type. The attr_coding_type field equal to 1 indicates RAHT as the coding type. The attr_coding_type field equal to 2 indicates fix weight lifting.

The aps_attr_initial_qp field specifies the initial value of the variable SliceQp for each slice referring to the APS.

The aps_attr_chroma_qp_offset field specifies the offsets to the initial quantization parameter signaled by the syntax aps_attr_initial_qp.

The aps_slice_qp_delta_present_flag field specifies whether the ash_attr_qp_delta_luma and ash_attr_qp_delta_chroma syntax elements are present in the attribute slice header (ASH). For example, the aps_slice_qp_delta_present_flag field equal to 1 specifies that the ash_attr_qp_delta_luma and ash_attr_qp_delta_chroma syntax elements are present in the ASH. For example, the aps_slice_qp_delta_present_flag field specifies that the ash_attr_qp_delta_luma and ash_attr_qp_delta_chroma syntax elements are not present in the ASH.

When the value of the attr_coding_type field is 0 or 2, that is, the coding type is predicting weight lifting or fix weight lifting, the APS according to the embodiments may further include a lifting_num_pred_nearest_neighbours field, a lifting_search_range_minus1 field, a lifting_num_detail_levels_minus1 field, and a lifting_neighbour_bias[k] field.

The lifting_num_pred_nearest_neighbours field specifies the maximum number of nearest neighbors to be used for prediction.

The lifting lifting_search_range_minus1 field specifies the search range used to determine nearest neighbors to be used for prediction and to build distance-based levels of detail.

The lifting_num_detail_levels_minus1 field specifies the number of levels of detail for the attribute coding.

The lifting_neighbour_bias[k] field specifies a bias used to weight the k-th components in the calculation of the Euclidean distance between two points as part of the nearest neighbor derivation process.

When the value of the attr_coding_type field is 2, that is, when the coding type indicates fix weight lifting, the APS according to the embodiments may further include a lifting_scalability_enabled_flag field.

The lifting_scalability_enabled_flag field specifies whether the attribute decoding process allows the pruned octree decode result for the input geometry points. For example, the lifting_scalability_enabled_flag field equal to 1 specifies that the attribute decoding process allows the pruned octree decode result for the input geometry points. The lifting_scalability_enabled_flag field equal to 0 specifies that that the attribute decoding process requires a complete octree decode result for the input geometry points. When not present, the value of lifting_scalability_enabled_flag is inferred to be equal to 0. When the value of the log 2_trisoup_node_size field is greater than 0, the value of the lifting_scalability_enabled_flag field shall be 0.

When the value of the lifting_scalability_enabled_flag field is false, the APS according to the embodiments may further include a lifting_lod_regular_sampling_enabled_flag field.

The lifting_lod_regular_sampling_enabled_flag field specifies whether levels of detail (LOD) are built by a regular sampling strategy. For example, the lifting_lod_regular_sampling_enabled_flag equal to 1 specifies that levels of detail (LOD) are built by using a regular sampling strategy. The lifting_lod_regular_sampling_enabled_flag equal to 0 specifies that a distance-based sampling strategy is used instead.

The APS according to embodiments includes an iteration statement repeated as many times as the value of the lifting_num_detail_levels_minus1 field. In an embodiment, the index (idx) is initialized to 0 and incremented by 1 every time the iteration statement is executed, and the iteration statement is repeated until the index (idx) is greater than the value of the lifting_num_detail_levels_minus1 field. This iteration statement may include a lifting_sampling_period [idx] field when the value of the lifting_lod_decimation_enabled_flag field is true (e.g., 1), and may include a lifting_sampling_distance_squared[idx] field when the value of the lifting_lod_decimation_enabled_flag field is false (e.g., 0).

The lifting_sampling_period[idx] field specifies the sampling period for the level of detail idx.

The lifting_sampling_distance_squared[idx] field specifies the square of the sampling distance for the level of detail idx.

When the value of the attr_coding_type field is 0, that is, when the coding type is predicting weight lifting, the APS according to the embodiments may further include a lifting_adaptive_prediction_threshold field, a lifting_intra_lod_prediction_num_layers field, a lifting_max_num_direct_predictors field, and an inter_component_prediction_enabled_flag field.

The lifting_adaptive_prediction_threshold field specifies the threshold to enable adaptive prediction.

The lifting_intra_lod_prediction_num_layers field specifies the number of LOD layers where decoded points in the same LOD layer could be referred to generate a prediction value of a target point. For example, the lifting_intra_lod_prediction_num_layers field equal to num_detail_levels_minus1 plus 1 indicates that target point could refer to decoded points in the same LOD layer for all LOD layers. For example, the lifting_intra_lod_prediction_num_layers field equal to 0 indicates that target point could not refer to decoded points in the same LoD layer for any LoD layers. The lifting_max_num_direct_predictors field specifies the maximum number of predictors to be used for direct prediction. The value of the lifting_max_num_direct_predictors field shall be in the range of 0 to lifting_num_pred_nearest_neighbours. In addition, the value of the variable MaxNumPredictors that is used in the point cloud data decoding process according to the embodiments may be expressed as follows.

MaxNumPredictors=lifting_max_num_direct_predictors field+1

The inter_component_prediction_enabled_flag field specifies whether the primary component of a multi component attribute is used to predict the reconstructed value of non-primary components. For example, if the inter_component_prediction_enabled_flag field equal to 1 specifies that the primary component of a multi component attribute is used to predict the reconstructed value of non-primary components. The inter_component_prediction_enabled_flag field equal to 0 specifies that all attribute components are reconstructed independently.

When the value of the attr_coding_type field is 1, that is, when the coding type is RAHT, the APS according to the embodiments may further include an raht_prediction_enabled_flag field and an raht_depth_minus1 field.

The raht_prediction_enabled_flag field specifies whether the transform weight prediction from the neighbor points is enabled in the RAHT decoding process. For example, the raht_prediction_enabled_flag field equal to 1 specifies the transform weight prediction from the neighbor points is enabled in the RAHT decoding process. raht_prediction_enabled_flag equal to 0 specifies that the transform weight prediction is disabled in the RAHT decoding process.

The raht_depth_minus1 field specifies the number of LODs for RAHT.

The aps_extension_present_flag field specifies whether the aps_extension_data syntax structure is present in the APS syntax structure. For example, the aps_extension_present_flag field equal to 1 specifies that the aps_extension_data syntax structure is present in the APS syntax structure. For example, the aps_extension_present_flag field equal to 0 specifies that this syntax structure is not present in the APS syntax structure.

When the value of the aps_extension_present_flag field is 1, the APS according to the embodiments may further include an aps_extension_data_flag field.

The aps_extension_data_flag field may have any value. Its presence and value do not affect decoder conformance to profiles.

FIG. 30 shows an embodiment of a syntax structure of the tile inventory (tile inventory( )) according to the present disclosure. According to embodiments, the tile inventory may be referred to as a tile parameter set (TPS).

The tile inventory according to the embodiments includes a num_tiles field.

The num_tiles field specifies the number of tiles signaled for a corresponding attribute.

The tile inventory according to the embodiments includes an iteration statement repeated as many times as the value of the num_tiles field. In an embodiment, i is initialized to 0, and is incremented by 1 each time the iteration statement is executed. The iteration statement is repeated until the value of i becomes equal to the value of the num_tiles field. The iteration statement may include a tile_id[i] field, a tile_bounding_box_offset_x[i] field, a tile_bounding_box_offset_y[i] field, a tile_bounding_box_offset_z[i] field, a tile_bounding_box_size_width[i] field, a tile_bounding_box_size_height[i] field, and a tile_bounding_box_size_depth[i] field.

The tile_id[i] field indicates the identifier of the i-th tile in the Cartesian coordinates. The tile_bounding_box_offset_x[i] field indicates the x offset of the i-th tile in the Cartesian coordinates. When not present, the value of tile_bounding_box_offset_x[0] is inferred to be sps_bounding_box_offset_x.

The tile_bounding_box_offset_y[i] field indicates the y offset of the i-th tile in the Cartesian coordinates. When not present, the value of tile_bounding_box_offset_y[0] is inferred to be sps_bounding_box_offset_y.

The tile_bounding_box_offset_z[i] field indicates the z offset of the i-th tile in the Cartesian coordinates. When not present, the value of tile_bounding_box_offset_z[0] is inferred to be sps_bounding_box_offset_z.

The tile_bounding_box_size_width[i] field indicates the width of the i-th tile in the Cartesian coordinates. When not present, the value of tile_bounding_box_size_width[0] is inferred to be sps_bounding_box_size_width.

The tile_bounding_box_size_height[i] field indicates the height of the i-th tile in the Cartesian coordinates. When not present, the value of tile_bounding_box_size_height[0] is inferred to be sps_bounding_box_size_height.

The tile_bounding_box_size_depth[i] field indicates the depth of the i-th tile in the Cartesian coordinates. When not present, the value of tile_bounding_box_size_depth[0] is inferred to be sps_bounding_box_size_depth.

FIG. 31 shows an embodiment of a syntax structure of frame boundary marker( ) according to the present disclosure, wherein the syntax structure is internally empty.

FIG. 32 shows an embodiment of a syntax structure of a geometry slice bitstream( ) according to the present disclosure.

The geometry slice bitstream (geometry_slice_bitstream( )) according to the embodiments may include a geometry slice header (geometry_slice_header( )) and geometry slice data (geometry_slice_data( )). The geometry_slice_bitstream may be referred to as a geometry slice. Also, the attribute slice bitstream may be referred to as an attribute slice.

FIG. 33 shows an embodiment of a syntax structure of the geometry slice header (geometry_slice_header( ) according to the present disclosure.

A bitstream transmitted by the transmission device (or a bitstream received by the reception device) according to the embodiments may contain one or more slices. Each slice may include a geometry slice and an attribute slice. The geometry slice includes a geometry slice header (GSH). The attribute slice includes an attribute slice header (ASH).

The geometry slice header (geometry_slice_header( )) according to embodiments may include a gsh_geometry_parameter_set_id field, a gsh_tile_id field, a gsh_slice_id field, a frame_idx field, a gsh_num_points field, and a byte_alignment( ) field.

When the value of the gps_box_present_flag field included in the GPS is 'true' (e.g., 1), and the value of the gps_gsh_box_log 2_scale_present_flag field is 'true' (e.g., 1), the geometry_slice_header (geometry_slice_header( )) according to the embodiments may further include a gsh_box_log 2_scale field, a gsh_box_origin_x field, a gsh_box_origin_y field, and a gsh_box_origin_z field.

The gsh_geometry_parameter_set_id field specifies the value of the gps_geom_parameter_set_id of the active GPS.

The gsh_tile_id field specifies the value of the tile_id that is referred to by the GSH.

The gsh_slice_id specifies id of the slice for reference by other syntax elements.

The frame_idx field specifies the log 2_max_frame_idx+1 least significant bits of a notional frame number counter. Consecutive slices with differing values of frame_idx form parts of different output point cloud frames. Consecutive slices with identical values of frame_idx without an intervening frame boundary marker data unit form parts of the same output point cloud frame.

The gsh_box_log 2_scale field specifies the scaling factor of the bounding box origin for the slice.

The gsh_box_origin_x field specifies the x value of the bounding box origin scaled by the value of the gsh_box_log 2_scale field.

The gsh_box_origin_y field specifies the y value of the bounding box origin scaled by the value of the gsh_box_log 2_scale field.

The gsh_box_origin_z field specifies the z value of the bounding box origin scaled by the value of the gsh_box_log 2_scale field.

In this case, the variables slice_origin_x, slice_origin_y, and slice_origin_z may be derived as follows.

If the gps_gsh_box_log 2_scale_present_flag field is equal to 0, origin_scale is set equal to gsh_box_log 2_scale.

If the gps_gsh_box_log 2_scale_present_flag field is equal to 1, origin_scale is set equal to gps_gsh_box_log 2_scale.

If the gps_box_present_flag field is equal to 0, the values of the variables slice_origin_x, slice_origin_y, and slice_origin_z are inferred to be 0.

If the gps_box_present_flag field is equal to 1, the following equations will be applied to the variables slice_origin_x, slice_origin_y, and slice_origin_z.

```
slice_origin_x = gsh_box_origin_x << origin_scale
slice_origin_y = gsh_box_origin_y << origin_scale
slice_origin_z = gsh_box_origin_z << origin_scale
```

When the value of the gps_implicit_geom_partition_flag field is 'true' (i.e., 0), the geometry_slice_header ((geometry_slice_header( ))) may further include a gsh_log 2_max_nodesize_x field, a gsh_log 2_max nodesize_y_minus_x field, and a gsh_log 2_max_nodesize_z_minus field. When the value of the gps_implicit_geom_partition_flag field is 'false' (i.e., 1), the geometry_slice_header may further include a gsh_log 2_max_nodesize field.

The gsh_log 2_max_nodesize_x field specifies the bounding box size in the x dimension, i.e., MaxNodesizeXLog2 that is used in the decoding process as follows.

```
MaxNodeSizeXLog2 = gsh_log2_max_nodesize_x
MaxNodeSizeX = 1 << MaxNodeSizeXLog2
```

The gsh_log 2_max_nodesize_y_minus_x field specifies the bounding box size in the y dimension, i.e., MaxNodesizeYLog2 that is used in the decoding process as follows.

```
MaxNodeSizeYLog2=gsh_log2_max_nodesize_y_minus_x +
MaxNodeSizeXLog2.
MaxNodeSizeY = 1 << MaxNodeSizeYLog2.
```

The gsh_log 2_max_nodesize_z_minus_y field specifies the bounding box size in the z dimension, i.e., MaxNodesizeZLog2 that is used in the decoding process as follows.

```
MaxNodeSizeZLog2=gsh_log2_max_nodesize_z_minus_y +
MaxNodeSizeYLog2
MaxNodeSizeZ = 1 << MaxNodeSizeZLog2
```

When the value of the gps_implicit_geom_partition_flag field is 1, the gsh_log 2_max_nodesize field is obtained as follows.

```
gsh_log2_max_nodesize=max{MaxNodeSizeXLog2,
MaxNodeSizeYLog2, MaxNodeSizeZLog2}
```

The gsh_log 2_max_nodesize field specifies the size of the root geometry octree node when the gps_implicit_geom_partition_flag field is equal to 0.

Here, the variables MaxNodeSize and MaxGeometryOctreeDepth are derived as follows.

```
MaxNodeSize = 1 << gsh_log2_max_nodesize
MaxGeometryOctreeDepth=gsh_log2_max_nodesize-log2_trisoup_node_size
```

Then, the variables K and M are updated as follows.

```
gsh_log2_min_nodesize=min{MaxNodeSizeXLog2,
    MaxNodeSizeYLog2, MaxNodeSizeZLog2}
    if (K > (gsh_log2_max_nodesize - gsh_log2_min_nodesize))
        K = gsh_log2_max_nodesize - gsh_log2_min_nodesize;
    if (M > gsh_log2_min_nodesize)
        M = gsh_log2_min_nodesize;
    if (gsh_log2_max_nodesize == gsh_log2_min_nodesize)
        M = 0;
    if (log2_trisoup_node_size != 0) {
        K = gsh_log2_max_nodesize - gsh_log2_min_nodesize;
        M = 0;
    }
```

The gsh_num_points field specifies the number of coded points in the slice.

When the value of the geom_scaling_enabled_flag field is 'true', the geometry slice header (geometry_slice_header( )) according to the embodiments may further include a geom_slice_qp_offset field and a geom_octree_qp_offsets_enabled_flag field.

The geom_slice_qp_offset field specifies an offset to the base geometry quantization parameter geom_base_qp.

The geom_octree_qp_offsets_enabled_flag field specifies whether the geom_octree_qp_ofsets_depth field is present in the geometry_slice_header. For example, the geom_octree_qp_offsets_enabled_flag field equal to 1 specifies that the geom_octree_qp_offsets_depth field is present in the geometry_slice_header. The geom_octree_qp_offsets_enabled_flag field equal to 0 specifies that the geom_octree_qp_ofsets_depth field is not present.

The geom_octree_qp_offsets_depth field specifies the depth of the geometry octree. FIG. 34 shows an embodiment of a syntax structure of geometry_slice_data (geometry_slice_data( )) according to the present disclosure. The geometry_slice_data (geometry_slice_data( )) according to the embodiments may carry a geometry bitstream belonging to a corresponding slice.

The geometry_slice_data( ) according to the embodiments may include a first iteration statement repeated as many times as by the value of MaxGeometryOctreeDepth. In an embodiment, the depth is initialized to 0 and is incremented by 1 each time the iteration statement is executed, and the first iteration statement is repeated until the depth becomes equal to MaxGeometryOctreeDepth. The first iteration statement may include a second loop statement repeated as many times as the value of NumNodesAtDepth. In an embodiment, nodeidx is initialized to 0 and is incremented by 1 each time the iteration statement is executed. The second iteration statement is repeated until nodeidx becomes equal to NumNodesAtDepth. The second iteration statement may include xN=NodeX[depth][nodeIdx], yN=NodeY[depth][nodeIdx], zN=NodeZ[depth][nodeIdx], and geometry_node(depth, nodeIdx, xN, yN, zN). MaxGeometryOctreeDepth indicates the maximum value of the geometry octree depth, and NumNodesAtDepth[depth] indicates the number of nodes to be decoded at the corresponding depth. The variables NodeX[depth] [nodeIdx], NodeY[depth] [nodeIdx], and NodeZ[depth] [nodeIdx] indicate the x, y, z coordinates of the Idx-th node in decoding order at a given depth. The geometry bitstream of the node of the depth is transmitted through geometry node(depth, nodeIdx, xN, yN, zN).

The geometry_slice_data (geometry_slice_data( )) according to the embodiments may further include geometry trisoup data( ) when the value of the log 2_trisoup_node_size field is greater than 0. That is, when the size of the triangle nodes is greater than 0, a geometry bitstream subjected to trisoup geometry encoding is transmitted through geometry_trisoup_data( ).

FIG. 35 shows an embodiment of a syntax structure of attribute_slice_bitstream( ) according to the present disclosure.

The attribute_slice_bitstream (attribute_slice_bitstream( )) according to the embodiments may include an attribute slice header (attribute_slice_header( )) and attribute slice data (attribute_slice_data( )).

FIG. 36 shows an embodiment of a syntax structure of an attribute_slice_header (attribute_slice_header( )) according to the present disclosure.

The attribute_slice_header (attribute_slice_header( )) according to the embodiments may include an ash_attr_parameter_set_id field, an ash_attr_sps_attr_idx field, an ash_attr_geom_slice_id field, an ash_attr_layer_qp_delta_present_flag field, and an ash_attr_region_qp_delta_present_flag field.

When the value of the aps_slice_qp_delta_present_flag field of the APS is 'true' (e.g., 1), the attribute_slice_header (attribute_slice_header( )) according to the embodiments may further include an ash_attr_qp_delta_luma field and an ash_attr_qp_delta_chroma field.

The ash_attr_parameter_set_id field specifies the value of the aps_attr_parameter_set_id field of the current active APS.

The ash_attr_sps_attr_idx field specifies an attribute set in the currently active SPS.

The ash_attr_geom_slice_id field specifies the value of the gsh_slice_id field of the current geometry_slice_header.

The ash_attr_qp_delta_luma field specifies a luma delta quantization parameter (qp) derived from the initial slice qp in the active attribute parameter set.

The ash_attr_qp_delta_chroma field specifies the chroma delta qp derived from the initial slice qp in the active attribute parameter set.

The variables InitialSliceQpY and InitialSliceQpC are derived as follows.

```
InitialSliceQpY = aps_attrattr_initial_qp +
    ash_attr_qp_delta_luma
InitialSliceQpC = aps_attrattr_initial_qp +
    aps_attr_chroma_qp_offset+ ash_attr_qp_delta_chroma
```

The ash_attr_layer_qp_delta_present_flag field specifies whether the ash_attr_layer_qp_delta luma field and the ash_attr_layer_qp_delta chroma field are present in the ASH for each layer.

The ash_attr_layer_qp_delta luma field specifies a luma delta quantization parameter from the InitialSliceQpY in each layer. When the ash_attr_layer_qp_delta luma field is not signaled, the value of ash_attr_layer_qp_delta luma of all layers is inferred to be 0.

The ash_attr_layer_qp_delta chroma field specifies the chroma delta qp from the InitialSliceQpC in each layer. When the ash_attr_layer_qp_delta chroma is not signaled, the value of ash_attr_layer_qp_delta chroma of all layers is inferred to be 0.

The variables SliceQpY[i] and SliceQpC[i] with i=0, ..., num_layer-1 are derived as follows.

```
for ( i = 0; i < num_layer; i++) {
    SliceQpY[i] = InitialSliceQpY + ash_attr_layer_qp_delta_luma[i]
    SliceQpC[i] = InitialSliceQpC + ash_attr_layer_qp_delta_chroma[i]
}
```

Here, the variable of num layer may be derived using the attr_coding_type field, the num_detail_levels_minus1 field, and the raht_depth_minus1 field in the APS as follows.

```
if (ash_attr_layer_qp_delta_present_flag )
    num_layer = (attr_coding_type == 0 || attr_coding_type == 2 ) ?
        num_detail_levels_minus1 + 1 : raht_depth_minus1 + 1;
    else
        num_layer = 1;
```

The value of SliceQpY[i] and SliceQpC[i] with i=0, ..., num layer-1 is in the range of 4 to 51, inclusive.

The variables SliceQstepY[i] and SliceQstepC[i] with i=0, ..., num layer-1 may be derived as follows.

```
SliceQstepY[i] = QpToQstep( SliceQpY[i])
SliceQstepC[i] = QpToQstep( SliceQpC[i])
```

When the value of the ash_attr_region_qp_delta_present_flag field is equal to 1, the attribute_slice_header (attribute_slice_header( )) according to the embodiments indicates that ash_attr_region_qp_delta, region bounding box origin, and size are present in the current attribute_slice_header. The ash_attr_region_qp_delta_present_flag field equal to 0 indicates the ash_attr_region_qp_delta, region bounding box origin and size are not present in the current ASH.

In other words, when ash_attr_layer_qp_delta_present_flag is equal to 1, the attribute slice header may further include an ash_attr_qp_region_box_origin_x field, an ash_attr_qp_region_box_origin_y field, an ash_attr_qp_region_box_origin_z field, an ash_attr_qp_region_box_width field, an ash_attr_qp_region_box_height field, an ash_attr_qp_region_box_depth field, and an ash_attr_region_qp_delta field.

The ash_attr_qp_region_box_origin_x field indicates the x offset of the region bounding box relative to slice_origin_x. When not present, the value of ash_attr_qp_region_box_origin_x is inferred to be 0.

The ash_attr_qp_region_box_origin_y field indicates the y offset of the region bounding box relative to slice_origin_y. When not present, the value of ash_attr_qp_region_box_origin_y is inferred to be 0.

The ash_attr_qp_region_box_origin_z field i indicates the z offset of the region bounding box relative to slice_origin_z. When not present, the value of ash_attr_qp_region_box_origin_z is inferred to be 0.

```
regionboxX = ash_attr_qp_region_box_origin_x
regionboxY = ash_attr_qp_region_box_origin_y
regionboxZ = ash_attr_qp_region_box_origin_z
```

The ash_attr_qp_region_box_size_width field indicates the width of the region bounding box. When not present, the value of ash_attr_qp_region_box_size_width is inferred to be 0.

The ash_attr_qp_region_box_size_height field indicates the height of the region bounding box. When not present, the value of ash_attr_qp_region_box_size_height is inferred to be 0.

The ash_attr_qp_region_box_size_depth field indicates the depth of the region bounding box. When not present, the value of ash_attr_qp_region_box_size_depth is inferred to be 0.

```
regionboxWidth = ash_attr_qp_region_box_size_width
regionboxHeight = ash_attr_qp_region_box_size_height
regionboxDepth = ash_attr_qp_region_box_size_depth
```

The ash_attr_region_qp_delta field specifies the delta qp from the SliceQpY[i] and SliceQpC[i] (with i=0, ..., num layer-1) of the region specified by ash_attr_qp_region_box. When not present, the value of ash_attr_region_qp_delta is inferred to be 0.

```
regionboxDeltaQp=ash_attr_region_qp_delta
```

FIG. 37 shows an embodiment of a syntax structure of the attribute slice data (attribute_slice_data( ) according to the present disclosure. The attribute slice data (attribute_slice_data( ) according to the embodiments may carry an attribute bitstream belonging to a corresponding slice.

In FIG. 37, the zerorun field specifies the number of 0 prior to predIndex or residual.

In addition, the predIndex[i] field specifies a predictor index for decoding the value of the i-th point of the attribute. The value of the predIndex[i] field ranges from 0 to the value of the max numpredictors field.

As described above, a bitstream of point cloud data output from the transmission processor 14005 may include an SPS, a GPS, one or more APSs, tile inventory, and one or more slices. The one or more slices may include a geometry slice, one or more attribute slices, and one or more metadata slices. The geometry slice according to the embodiments consists of a geometry_slice_header and geometry_slice_data, and each of the attribute slices includes an attribute slice header and attribute slice data. Each of the metadata slices includes a metadata slice header and metadata slice data. For example, in the point cloud transmission device of FIG. 18, a geometry slice structure, an attribute slice structure, and a metadata slice structure may be generated by the geometry encoder 14003, the attribute encoder 14004, and the signaling processor 14002, respectively, may be generated by the transmission processor 14005, or may be generated using a separate module/component.

FIG. 38 shows an embodiment of a syntax structure of metadata_slice_bitstream( ) according to the present disclosure.

The metadata slice bitstream (metadata_slice_bitstream( )) according to the embodiments may include a metadata slice header (metadata_slice_header( )) and metadata slice data (metadata_slice_data( )).

FIG. 39 shows an embodiment of a syntax structure of a metadata slice header (metadata_slice_header( )) according to the present disclosure.

The metadata slice header (metadata_slice_header( )) according to the embodiments may include an msh_slice_id field, an msh_geom_slice_id field, an msh_attr_id field, and an msh_attr_slice_id field.

The msh_slice_id field indicates an identifier for identifying the metadata slice bitstream.

The msh_geom_slice_id field indicates an identifier for identifying a geometry slice related to the metadata carried in the metadata slice.

The msh_attr_id field indicates an identifier for identifying an attribute related to the metadata carried in the metadata slice.

The msh_attr_slice_id field indicates an identifier for identifying an attribute slice related to the metadata carried in the metadata slice.

FIG. 40 shows an embodiment of a syntax structure of metadata slice data (metadata_slice_data( )) according to the present disclosure.

The metadata slice data (metadata_slice_data( )) according to the embodiments includes a metadata bitstream (metadata_bitstream( )) including a metadata slice.

According to an embodiment of the present disclosure, a bitstream of point cloud data as shown in FIG. 21 is made into a G-PCC bitstream including a sequence of Type-Length-Value (TLV) structures. The TLV structures according to the embodiments will be referred to as TLV encapsulation structures, G-PCC TLV encapsulation structures, or G-PCC TLV structures. Each TLV structure includes one of a sequence parameter set, a geometry parameter set, an attribute parameter set, a geometry slice, and an attribute slice according to type information. In one embodiment, the TLV encapsulation structures may be transmitted to the receiving side as they are. In another embodiment, the TLV encapsulation structures may be encapsulated in the form of a file/segment and transmitted to the receiving side by the file/segment encapsulator of FIG. 14, 15, or 18.

According to embodiments, the transmission processor 14005 or a separate module/component may generate TLV encapsulation structures including a bitstream of point cloud data.

Figure 41:
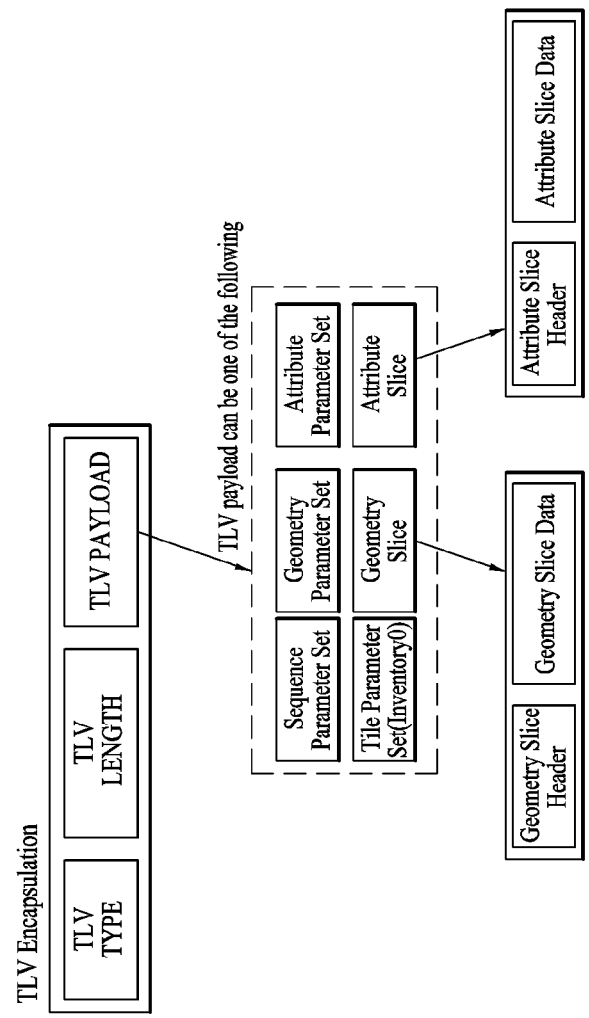
FIG. 41 illustrates an example of a TLV encapsulation structure according to embodiments.

FIG. 41 shows an example of TLV encapsulation structures according to embodiments. Each TLV encapsulation structure consists of a TLV type, a TLV length, and a TLV payload. In present disclosure, the TLV type may be referred to as type information about the TLV payload, a TLV length may be referred to as length information about the TLV payload, and the TLV payload may be referred to as a payload (or payload bytes). In the present disclosure, data contained in the TLV payload is distinguished through the type information about the TLV payload. In addition, the length of the TLV payload is indicated through the length information about the TLV payload. TLV payloads of the TLV encapsulation structures may include an SPS, a GPS, one or more APSs, tile inventory, a geometry slice, one or more attribute slices, and one or more metadata slices. According to embodiments, the TLV payload of each TLV encapsulation structure may contain one of an SPS, a GPS, one or more APSs, tile inventory, a geometry slice, one or more attribute slices, and one or more metadata slices according to the type information about the TLV payload.

The information contained in the SPS may include part or all of the information contained in the SPS of FIG. 24, and accordingly refer to the description of FIG. 24 for details. The information contained in the tile inventory may include part or all of the information contained in the tile inventory of FIG. 30, and accordingly refer to the description of FIG. 30 for details. The information contained in the GPS may include part or all of the information contained in the GPS of FIG. 27, and accordingly refer to the description of FIG. 27 for details. The information contained in the APS may include part or all of the information contained in the APS of FIG. 28, and accordingly refer to the description of FIG. 28 for details.

For details of the geometry slice, refer to the description of FIGS. 32 to 34. For details of the attribute slice, refer to the description of FIGS. 35 to 37.

The metadata may be used by the receiver to decode a geometry or attribute slice or to render reconstructed point clouds. According to embodiments, metadata may be contained in the G-PCC bitstream.

For example, when the point cloud has different color values according to the viewing orientation (or viewpoint) as shown in FIG. 2 or 14, the metadata may be a viewing orientation (or viewpoint) associated with information about each color among the attribute values of the point cloud. For example, when the color of the points constituting the point cloud displayed when viewed from (0, 0, 0) is rendered differently from the color thereof displayed when viewed from (0, 90, 0), there may be two kinds of color information associated with each point. In addition, in order to render appropriate color information according to the user's viewing orientation (or viewpoint) in the rendering operation, the viewing orientation (or viewpoint) associated with corresponding color information should be transmitted. To this end, each metadata slice may contain one or more viewing orientations (or viewpoints), and may contain information on a slice containing attribute information associated therewith. Thereby, the player may find an associated attribute slice based on the information contained in the appropriate metadata slice according to the user's viewing orientation (or viewpoint), decode the same, and perform rendering based on the decoding result. Accordingly, attribute values according to the user's viewing orientation (viewpoint) may be rendered and provided.

FIG. 42 shows an exemplary syntax structure of tlv_encapsulation( ) according to embodiments. In an embodiment, tlv_encapsulation( ) of FIG. 42 includes a tlv_type field, a tlv_num_payload_bytes field, and a tlv_payload byte field.

The tlv_type field indicates the type of data contained in the tlv_payload byte field.

The tlv_num_payload_bytes field indicates the length of the tlv_payload byte field.

The tlv_payload byte field is repeated as many times as the value of the tlv_num_payload_bytes field, and contains data indicated by the tlv_type field.

In one embodiment, the tlv_type field corresponds to the TLV type of FIG. 41, the tlv_num_payload_bytes field corresponds to the TLV length of FIG. 41, and the tlv_payload byte field corresponds to the TLV payload of FIG. 41.

FIG. 43 exemplarily shows payload types for a TLV encapsulation structure allocated to the tlv_type field according to embodiments.

Referring to FIG. 43, in one embodiment, the tlv_type field equal to 0 indicates that data contained in the payload of the TLV encapsulation structure is a sequence parameter set. The tlv_type field equal to 1 indicates that the data is a geometry parameter set. The tiv_type field equal to 2 indicates that the data is a geometry slice. The tlv_type field equal to 3 indicates that the data is an attribute parameter set. The tlv_type field equal to 4 indicates that the data is an attribute slice. The tlv_type field equal to 5 indicates that the data is tile inventory (or a tile parameter set). The tlv_type field equal to 6 indicates that the data is a frame boundary marker. The tlv_type field equal to 7 indicates that the data is a metadata slice. The geometry slice according to the embodiments contains geometry data that is decoded independently from another slice. The attribute slice according to the embodiments contains attribute data that is decoded independently from another slice. The metadata slice according to the embodiments contains metadata that is decoded independently from another slice.

The meaning, order, deletion, addition, and the like of values assigned to the tlv_type field may be easily changed by those skilled in the art, and accordingly the present invention will not be limited to the above-described embodiment.

In an embodiment, the payload of the TLV encapsulation structure conforms to the format of a High Efficiency Video Coding (HEVC) Network Abstraction Layer (NAL) unit.

As described above, the G-PCC bitstream composed of TLV encapsulation structures may be transmitted to the receiving side as it is, or may be encapsulated in the form of a file/segment and transmitted to the receiving side by the file/segment encapsulator of FIG. 14, 15, or 18.

According to embodiments, the file/segment encapsulator of the transmission device of FIG. 14, 15, or 18 may encapsulate the G-PCC bitstream into a file and transmit the file. According to embodiments, the file may be decapsulated into the G-PCC bitstream by the file/segment decapsulator of the reception device of FIG. 14, 16, or 20.

For example, the G-PCC bitstream composed of TLV encapsulation structures carrying parameter sets, a geometry slice, and zero or more attribute slices may be encapsulated in a file format by the segment encapsulator of FIG. 14, 15 or 18 based on (SO Base Media File Format (ISOBMFF).

In this case, according to an embodiment, the G-PCC bitstream composed of TLV encapsulation structures is stored in a single track or multiple tracks in the file.

Figure 44:
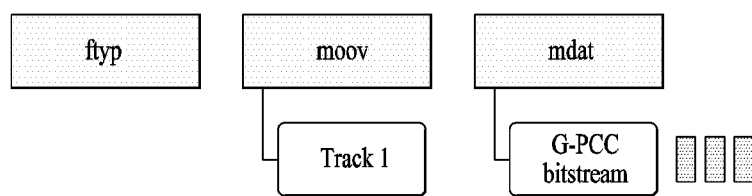
FIG. 44 is a diagram illustrating a structure of a single track G-PCC file according to embodiments.

FIG. 44 is a diagram illustrating a structure of a single track G-PCC file according to embodiments. That is, the figure shows an example of the layout of an ISOBMFF-based file including a single track.

An ISOBMFF-based file according to embodiments may be referred to as a container, a container file, a media file, a G-PCC file, or the like. Specifically, the file may be composed of a box and/or information that may be referred to as ftyp, moov, or mdat.

The ftyp box (file type box) may provide information related to a file type or file compatibility for the file. The receiver may identify the file by referring to the ftyp box.

The mdat box, which is also referred to as a media data box, contains actual media data. According to embodiments, a geometry slice (or referred to as a coded geometry bitstream) and zero or more attribute slices (or referred to as coded attribute bitstreams) are contained in a sample of the mdat box in the file. According to embodiments, the sample may be referred to as a G-PCC sample.

The moov box, which is also referred to as a movie box, may contain metadata about the media data of the file. For example, it may contain information necessary for decoding and playback of the media data, and information about tracks and samples of the file. The moov box may serve as a container for all metadata. The moov box may be a box of the highest layer among the metadata related boxes.

According to embodiments, a sequence parameter set, a geometry parameter set, an attribute parameter set, and a tile inventory may be included in a sample entry of the moov box or a sample of the mdat box in the file.

When a G-PCC bitstream is stored in a single track of a file according to embodiments, each sample contains multiple G-PCC components. That is, each sample is composed of one or more TLV encapsulation structures. According to embodiments, the sequence parameter set, the geometry parameter set, the attribute parameter set, the tile inventory, the geometry slice, and the attribute slice are each referred to as a G-PCC component.

FIG. 45 is a diagram illustrating an exemplary sample structure of an mdat box when a G-PCC bitstream composed of TLV encapsulation structures according to embodiments is stored in a single track in a file.

Specifically, the sample in FIG. 45 includes a geometry TLV encapsulation structure including a geometry slice (i.e., a coded geometry bitstream). In addition, the sample, if present, may further include parameter set TLV encapsulation structures including one or more parameter sets. The sample, if present, may further include attribute TLV encapsulation structures including one or more attribute slices (i.e., coded attribute bitstreams).

When each sample is composed of multiple G-PCC TLV encapsulation structures, it is necessary to access each TLV encapsulation structure in the sample. This is because the geometry slice is decoded first by the reception device, and the attribute slice needs to be decoded based on the decoded geometry.

In addition, when one sample is composed of multiple G-PCC TLV encapsulation structures, each of the multiple G-PCC TLV encapsulation structures may be stored as a sub-sample. According to embodiments, a sub-sample may be referred to as a G-PCC sub-sample. For example, when a sample contains a parameter set TLV encapsulation structure including a parameter set, a geometry TLV encapsulation structure including a geometry slice, and an attribute TLV encapsulation structure including an attribute slice, the parameter set TLV encapsulation structure, the geometry TLV encapsulation structure, and the attribute TLV encapsulation structure are stored as respective sub-samples. In an embodiment of the present disclosure, a sub-sample includes only one G-PCC TLV encapsulation structure.

Here, in order to enable access to each G-PCC component in the sample, the type of a TLV encapsulation structure carried in the sub-sample is indicated.

Next, the syntax of a sample format given when a G-PCC bitstream is stored in a single track will be described.

In the syntax below, each G-PCC sample corresponds to a single point cloud frame, and may be composed of one or more TLV encapsulation structures belonging to the same presentation time. Each TLV encapsulation structure may contain a single type of TLV payload (or referred to as G-PCC payload), for example, a geometry slice or an attribute slice. In addition, a sample may be self-contained (e.g., a sync sample). In the syntax below, the parameter GPCCLength indicates the length of the sample, and gpcc_unit contains an instance of a G-PCC TLV encapsulation structure containing a single G-PCC component (e.g., geometry slice).

```
aligned(8) class GPCCSample
{
    unsigned int GPCCLength = sample_size; //Size of Sample
    for (i=0; i< GPCCLength; )      // to end of the sample
    {
        tlv_encapsulation  gpcc_unit;   //as defined in 23090-9
        i += (1+4)+ gpcc_unit.tlv_num_payload_bytes;
    }
}
```

Next, the syntax of a subsample will be described.

The G-PCC sub-sample may contain one or more G-PCC TLV encapsulation structures. Exactly one SubSampleInformation in SampleTableBox, or in the TrackFragmentBox of each of its MovieFragmentBoxes shall be present.

If SubSampleInformationBox is present, the 8-bit type value of the TLV encapsulation structure and the TLV encapsulation structure contain the attribute payload, the 6-bit value of the attribute index may be included in the 32-bit codec_specific_parameters field of the sub-sample entry in the SubSampleInformationBox. According to embodiments, the type of each subsample may be identified by parsing the codec_specific_parameters field of the sub-sample entry in the SubSampleInformationBox.

The codec_specific_parameters field of the SubSampleInformationBox may be defined as follows.

```
unsigned int(8) PayloadType;
if (PayloadType == 2) { // geometry payload
    unsigned int(8) TileIdx;
    bit(16) reserved = 0;
}
else if(PayloadType == 4) { // attribute payload
    unsigned int(6) AttrIdx;
    unsigned int(8) Attrtype;
    bit(18) reserved = 0;
}
else
    bit(24) reserved = 0;
```

In the sub-sample syntax above, the parameter PayloadType indicates tlv_type of the TLV encapsulation structure in the sub-sample. For example, the parameter PayloadType equal to 2 may indicate the geometry slice (i.e., geometry payload). PayloadType equal to 4 may indicate the attribute slice (i.e., attribute payload).

The parameter TileIdx indicates the identifier of a tile (sub region of 2D space) associated with the TLV encapsulation structure containing geometry payload in the sub-sample. It may be equal to gsh_tile_id of the TLV encapsulation structure containing geometry payload in the sub-sample.

The parameter AttrIdx indicates the identifier of attribute information of the TLV encapsulation structure containing attribute payload in the sub-sample. It may be equal to the ash_attr_sps_attr_idx of the TLV encapsulation structure containing attribute payload in the sub-sample.

The parameter AttrType indicates the attribute type of the TLV encapsulation structure containing attribute payload in the sub-sample. It may be equal to the ash_attr_sps_attr_idx of the TLV encapsulation structure containing attribute payload in the sub-sample.

The moov box in a file according to embodiments may include a trak box for providing information related to a track of the file. The trak box may include a mdia box for providing media information about the track and a track reference container (tref) box for referencing the track and a sample of the file corresponding to the track.

The mdia box may include a media information container (minf) box for providing information on the media data. The minf box may include a sample table (stbl) box for providing metadata related to a sample of the mdat box.

The stbl box may include a sample description (stsd) box for providing information on an applied coding type and initialization information necessary for the coding type.

The stsd box may include a sample entry for a single track storing a G-PCC bitstream according to embodiments. In the present disclosure, this sample entry may be referred to as a G-PCC sample entry. The syntax of the G-PCC sample entry according to the embodiments is given below.

Sample Entry Type: 'gpe1', 'gpeg'
Container: SampleDescriptionBox ('stsd')
Mandatory: A 'gpe1' or 'gpeg' sample entry is mandatory
Quantity: One or more sample entries may be present The sample entry type 'gpe1' or 'gpeg' is essential, and there may be one or more sample entries.

In one embodiment, the sample entry includes a GPCC configuration box (GPCCConfigurationBox). The GPCCConfigurationBox includes a GPCC decoder configuration record (GPCCDecoderConfigurationRecord) as described below.

In addition, G-PCC tracks may use VolumetricVisualSampleEntry having a sample entry type of 'gpe1' or 'gpeg'.

According to embodiments, the VolumetricVisualSampleEntry may include GPCCConfigurationBox containing GPCCDecoderConfigurationRecord as follows.

```
class GPCCConfigurationBox extends Box('gpcC') {
    GPCCDecoderConfigurationRecord( ) GPCCConfig;
}
aligned(8) class GPCCSampleEntry( )
    extends VolumetricVisualSampleEntry ('gpe1') {
    GPCCConfigurationBox        config; //mandatory
    // optional boxes
}
```

The GPCCDecoderConfigurationRecord according to embodiments provides decoder configuration information for geometry-based point cloud content.

At least one of the sequence parameter set, the geometry parameter set, the attribute parameter set, and the tile inventory according to embodiments may be included in the GPCCDecoderConfigurationRecord in the sample entry.

The syntax of GPCCDecoderConfigurationRecord according to the embodiments is given below.

```
aligned(8) class GPCCDecoderConfigurationRecord {
    unsigned int(8) configurationVersion = 1;
    unsigned int(8) profile_idc;
    unsigned int(24) profile_compatibility_flags;
    unsigned int(8) level_idc;
    unsigned int(8) numOfSetupUnits;
    for (i=0; i<numOfSetupUnits; i++) {
        tlv_encapsulation setupUnit;
    }
    // additional fields
}
```

Here, configurationVersion is a version field. Incompatible changes to the record are indicated by a change of the version number. Also, compatible extensions to this record will extend it and will not change the configuration version code.

The values for the profile_idc, profile_compatibility_flags, and level_idc shall be valid for all parameter sets that are activated when the stream described by this record is decoded.

The profile_idc includes a profile code to indicate a specific profile of G-PCC.

The profile_compatibility_flags equal to 1, indicates that the bitstream conforms to the profile indicated by the profile_idc. According to embodiments, each bit in profile_compatibility_flags may only be set if all the parameter sets set that bit.

The level_idc includes a profile level code. According to embodiments, the level indication level_idc shall indicate a level of capability equal to or greater than the highest level indicated for the highest tier in all the parameter sets.

The numOfSetupUnits indicates the number of G-PCC setup units included in GPCCDecoderConfigurationRecord.

The setupUnit is an instance of a TLV encapsulation structure carrying a sequence parameter set, a geometry parameter set, an attribute parameter set, and a tile inventory (or tile parameter set).

For example, when the sequence parameter set, the geometry parameter set, the attribute parameter set, and the tile inventory (or tile parameter set) are all carried, the value of numOfSetupUnits may be 4.

That is, there is the setupUnit array to carry G-PCC TLV encapsulation structures that are constant for the stream referred to by the sample entry in which the GPCC decoder configuration record is present. The type of G-PCC encapsulation structures is restricted to indicate one of sequence parameter set, geometry parameter set, attribute parameter set, and tile inventory.

According to embodiments, the setupUint arrary includes a sequence parameter set.

According to embodiments, when the sample entry type is 'gpe1', all geometry parameter sets, attribute parameter sets or tile inventories are included in the setupUint arrary.

According to embodiments, when the sample entry type is 'gpeg', geometry parameter sets, attribute parameter sets, or tile inventories may be included in the setupUint arrary in the sample entry or in the sample of the mdat box.

A G-PCC bitstream composed of TLV encapsulation structures as shown in FIGS. 41 to 43 may be stored in a single track or multiple tracks of a file.

FIG. 44 shows an example of a single track in which a G-PCC bitstream composed of TLV encapsulation structures is stored, and FIG. 45 shows a sample structure when the bitstream is stored in a single track.

Figure 46:
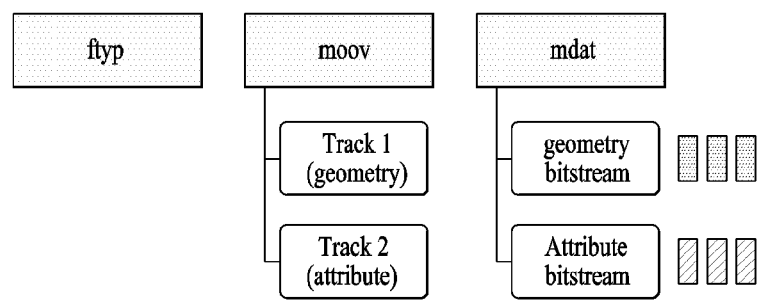
FIG. 46 is a diagram illustrating a structure of a multi-track G-PCC file according to embodiments.

FIG. 46 is a diagram illustrating a structure of a multi-track G-PCC file according to embodiments. That is, an example of the layout of an ISOBMFF-based file including multiple tracks is shown.

In FIG. 46, the ISOBMFF-based file according to the embodiments may be referred to as a container, a container file, a media file, a G-PCC file, or the like. Specifically, the file may be composed of a box and/or information, which may be referred to as ftyp, moov, or mdat.

As shown in FIG. 46, when a G-PCC bitstream is stored in multiple tracks of an ISOBMFF-based file, geometry slices (i.e., geometry bitstreams or geometry slice bitstreams) and attribute slices (i.e., attribute bitstreams or attribute slice bitstreams) are stored in separate tracks (e.g., track 1, track 2), respectively.

When a G-PCC bitstream composed of TLV encapsulation structures is carried in multiple tracks, each sample contains a single G-PCC component data, not both of geometry and attribute or multiple attributes.

Figure 47:
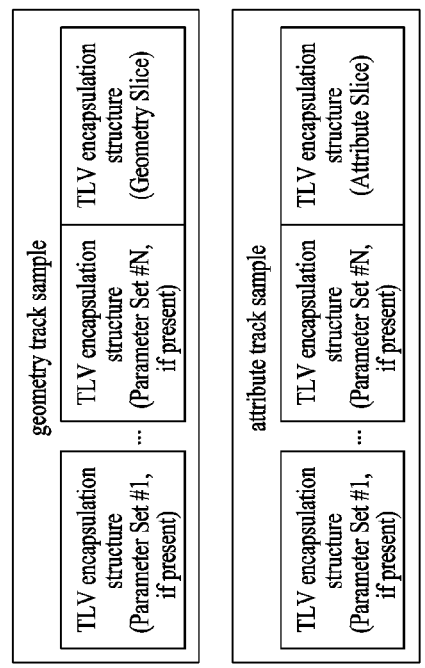
FIG. 47 is a diagram illustrating an exemplary sample structure when a bitstream composed of TLV encapsulation structures is stored in multiple tracks of a file according to embodiments.

FIG. 47 is a diagram illustrating an exemplary sample structure of a mdat box when a bitstream composed of TLV encapsulation structures is stored in multiple tracks of a file according to embodiments.

In FIG. 47, a sample of a geometry track (or G-PCC geometry track) includes a geometry TLV encapsulation structure including a geometry slice, but does not include an attribute TLV encapsulation structure including an attribute slice. Similarly, a sample of an attribute track (or G-PCC attribute track) includes an attribute TLV encapsulation structure including an attribute slice, but does not include a geometry TLV encapsulation structure including a geometry slice. However, when parameter sets are present, the parameter serts may be included in the sample of the geometry track or the sample of the attribute track in form of TLV encapsulation structure.

According to embodiments, when the G-PCC bitstream composed of TLV encapsulation structures is carried in multiple tracks, a track carrying a geometry bitstream (or geometry slice) may be an entry point.

It also needs to enable for a G-PCC player to access one of G-PCC components effectively. For example, the geometry is decoded first and attribute coding depends on the decoded geometry. It needs to enable the G-PCC player to access the track carrying the geometry bitstream before attribute bitstreams.

To achieve to carry the G-PCC bitstream in multiple tracks according to the embodiments and to enable the G-PCC player to access one of the G-PCC components effectively, the followings are specified.

That is, it needs to define a new box to indicate a type of the G-PCC component, and to define a track to carry a single G-PCC component with a new sample entry and sample format.

A new box (i.e., GPCCComponentTypeBox) may indicate a type of G-PCC components (for example, geometry, attribute). For example, when GPCCComponentTypeBox is present in the sample entry of tracks carrying a G-PCC component bitstream, it may indicate a type of G-PCC components carried in each track.

```
aligned(8) class GPCCComponentTypeBox extends FullBox('gtyp',
version = 0, 0) {
    unsigned int(8) gpcc_type;
}
```

The parameter gpcc_type indicates the type of the G-PCC component.

FIG. 48 is a table showing an example of G-PCC component types allocated to the gpcc_type parameter.

In the example, when the value of the parameter gpcc_type is 2, the G-PCC component type indicates geometry data. When the value of the parameter gpcc_type is 4, attribute data is indicated.

As described above, when a G-PCC bitstream is carried in multiple tracks, each G-PCC component elementary stream is mapped to an individual track in the file based on the type thereof. There are two types of tracks. One is a G-PCC geometry track and the other is a G-PCC attribute track. According to embodiments, the G-PCC geometry track is a track carrying a geometry element stream, and the G-PCC attribute track is a track carrying a single type attribute elementary stream.

According to embodiments, the following conditions must be satisfied for G-PCC component tracks. That is, in the sample entry, a new box indicating the role of the stream contained in this track may be added. One geometry track may be an entry point. In addition, a new track reference may be introduced from G-PCC geometry tracks to one or more attribute tracks.

In the present disclosure, tracks belonging to the same G-PCC sequence are time-aligned. Samples that contribute to the same point cloud frame across different tracks shall have the same presentation time. In addition, all tracks belonging to the same G-PCC sequence shall have the same implied or explicit edit lists.

Synchronization between the elementary streams in the tracks are handled by the ISOBMFF track timing structures (stts, ctts, and cslg), or equivalent mechanisms in movie fragments.

When the G-PCC bitstream is carried in multiple tracks, the syntax of the sample entry is configured as follows.

Sample Entry Type: 'gpc1'
Container: SampleDescriptionBox ('stsd')
Mandatory: 'gpc1', 'gpeg' sample entry is mandatory
Quantity: One or more sample entries may be present The sample entry type may be 'gpc1', and there may be one or more sample entries.

In addition, G-PCC geometry or attribute tracks may use VolumetricVisualSampleEntry with a sample entry type of 'gpc1'.

In one embodiment, one G-PCC sample entry includes GPCCConfigurationBox, and the GPCCConfigurationBox includes a GPCCDecoderConfigurationRecord.

In another embodiment, the VolumetricVisualSampleEntry may include GPCCConfigurationBox including GPCCDecoderConfigurationRecord as follows.

```
class GPCCConfigurationBox extends Box('gpcC') {
    GPCCDecoderConfigurationRecord( ) GPCCConfig;
}
aligned(8) class GPCCSampleEntry( )
    extends VolumetricVisualSampleEntry ('gpe1') {
    GPCCConfigurationBox config; //mandatory
    GPCCComponentTypeBox( );
}
```

In the base class VolumetricVisualSampleEntry, compressor name indicates the name of the compressor.

The GPCCComponentTypeBox indicates the type of a G-PCC component carried in the track.

The GPCCDecoderConfigurationRecord according to embodiments provides decoder configuration information for geometry-based point cloud content.

At least one of the sequence parameter set, the geometry parameter set, the attribute parameter set, and the tile inventory according to the embodiments may be included in the GPCCDecoderConfigurationRecord in the sample entry.

The syntax of GPCCDecoderConfigurationRecord according to the embodiments is configured as follows.

```
aligned(8) class GPCCDecoderConfigurationRecord {
    unsigned int(8) configurationVersion = 1;
    unsigned int(8) profile_idc;
    unsigned int(24) profile_compatibility_flags;
    unsigned int(8) level_idc;
    unsigned int(8) numOfSetupUnits;
    for (i=0; i<numOfSetupUnits; i++) {
        tlv_encapsulation setupUnit;
    }
    // additional fields
}
```

The parameters included in the syntax of GPCCDecoderConfigurationRecord have been described in detail above regarding the single track, and thus a detailed description thereof will be omitted.

In one embodiment, all data in both the array of setup units and the samples in this track are stored in a TLV encapsulation structure. Multiple sample entries may be used to indicate sections of G-PCC video that use different configurations or parameter sets.

In one embodiment, when the sample entry type is 'gpc1', GPCCComponentTypeBox is present in the sample entry. All sequence parameter sets, geometry parameter sets, and tile inventories may be included in the setupUint array of the geometry track. Also, all attribute parameter sets are included in the setupUint arrary of attribute tracks.

In one embodiment, when the sample entry type is 'gpeg', sequence parameter sets, geometry parameter sets, attribute parameter sets, and tile inventories may be included in the setupUint arrary of the sample entry of the track or included in the sample of the track.

Next, description will be given of the syntax of a sample format when a G-PCC bitstream is stored in multiple tracks.

In the syntax below, each G-PCC sample may correspond to a single point cloud frame, and may be composed of one or more TLV encapsulation structures belonging to the same presentation time. Each TLV encapsulation structure contains a single type of TLV payload (or referred to as G-PCC payload), for example, a geometry slice or an attribute slice.

When GPCCComponentTypeBox is present in the sample entry, each sample contains one TLV encapsulation structure carrying one geometry or attribute slice. In addition, each sample may optionally contain zero or more TLV encapsulation structure carrying parameter sets. In one embodiment, a sample may be self-contained (e.g., a sync sample).

When a sample is composed of multiple G-PCC TLV encapsulation structures, each of the multiple G-PCC TLV encapsulation structures may be stored as a sub-sample. For example, when a sample contains a parameter set TLV encapsulation structure including a parameter set and a geometry TLV encapsulation structure including a geometry slice, the parameter set TLV encapsulation structure and the geometry TLV encapsulation structure are stored as respective sub-samples. As another example, when a sample contains a parameter set TLV encapsulation structure including a parameter set and an attribute TLV encapsulation structure including an attribute slice, the parameter set TLV encapsulation structure and the attribute TLV encapsulation structure are stored as respective sub-samples. According to an embodiment of the present disclosure, the sub-sample contains only one G-PCC TLV encapsulation structure.

In the syntax below, the parameter GPCCLength indicates the length of the sample, and gpcc_unit contains an instance of a G-PCC TLV encapsulation structure containing a single G-PCC component (e.g., geometry slice).

```
aligned(8) class GPCCSample
{
    unsigned int GPCCLength = sample_size; //Size of Sample
    for (i=0; i< GPCCLength; )    // to end of the sample
    {
        tlv_encapsulation gpcc_unit;  //as defined in 23090-9
        i += (1+4)+ gpcc_unit.tlv_num_payload_bytes;
    }
}
```

Next, a method of referring to the G-PCC component track will be described. To link a G-PCC geometry track to other tracks, a track reference tool may be used. In one embodiment, one TrackReferenceTypeBoxes may be added to TrackReferenceBox in the TrackBox of the G-PCC geometry track. The TrackReferenceTypeBox shall contain an array of track_IDs designating tracks referred to by the G-PCC geometry track. The parameter reference_type of TrackReferenceTypeBox identifies attribute tracks. The 4CCs of these track reference types are as follows.

'gpca': the referenced track(s) contain the coded bitstream of G-PCC attribute bitstream 'gpcm': the referenced track(s) contain the coded bitstream of G-PCC metadata bitstream Description has been given of an example of storing the G-PCC bitstream in a single track or multiple tracks of a file when the G-PCC bitstream is composed of TLV encapsulation structures configured according to type-length-value as shown in FIGS. 41 to 43.

In another embodiment, the G-PCC bitstream may be composed of one or more G-PCC units.

Figure 49:
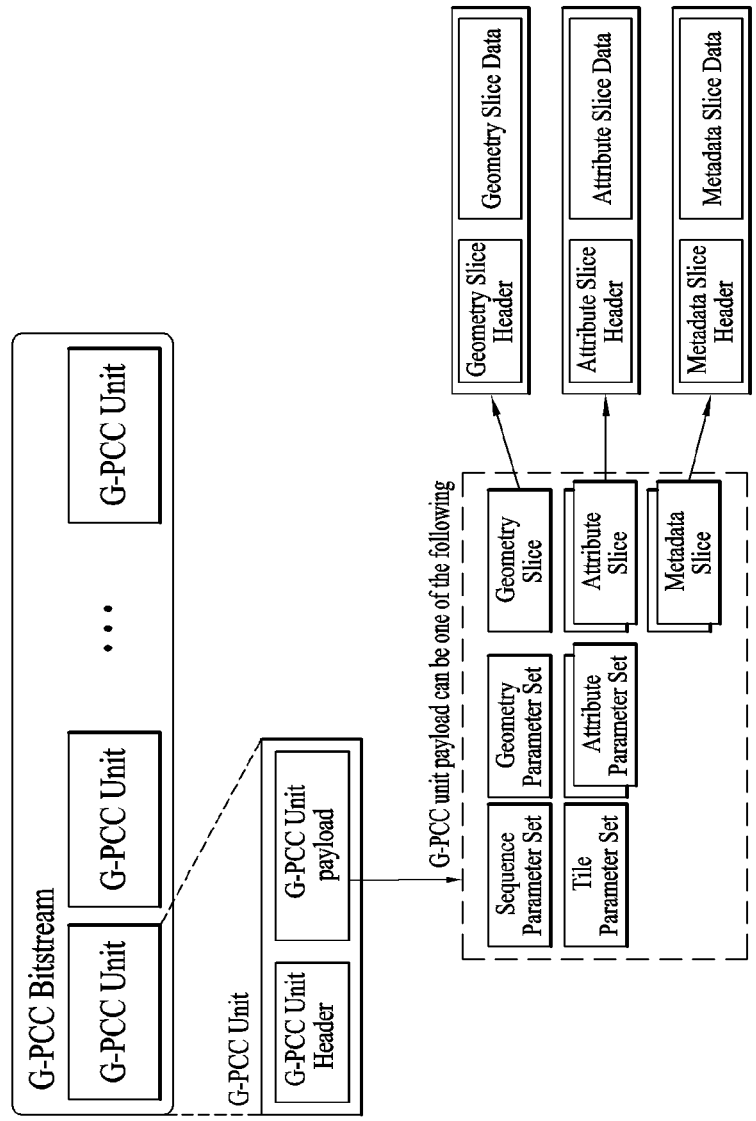
FIG. 49 illustrates an example of a G-PCC bitstream structure composed of G-PCC units according to embodiments.

FIG. 49 shows an example of a G-PCC bitstream structure according to other embodiments. In other embodiments, the G-PCC bitstream is a set of G-PCC units. Each G-PCC unit includes a G-PCC unit header and a G-PCC unit payload. In the present disclosure, data contained in the G-PCC unit payload is distinguished through the G-PCC unit header. To this end, the G-PCC unit header contains type information indicating the type of the G-PCC unit. G-PCC unit payloads of G-PCC units contain an SPS, a GPS, one or more APSs, a TPS (or tile inventory), a geometry slice, one or more attribute slices, and one or more metadata slices. According to embodiments, each G-PCC unit payload may contain one of an SPS, a GPS, one or more APSs, TPS, a geometry slice, one or more attribute slices, and one or more metadata slices according to the type information.

For the syntax structure of the SPS and detailed information contained in the SPS, refer to the detailed description of FIG. 24. For the syntax structure of the TPS and detailed information contained in the TPS, refer to the detailed description of FIG. 30. For the syntax structure of the GPS and detailed information contained in the GPS, refer to the detailed description of FIG. 27. For the syntax structure of the APS and detailed information included in the APS, refer to the detailed description of FIG. 28.

For details of the geometry slice, refer to the detailed description of FIGS. 32 to 34. For details of the attribute slice, refer to the detailed description of FIGS. 35 to 37. For details of the metadata slice, refer to the detailed description of FIGS. 38 to 40.

FIG. 50 shows an exemplary syntax structure of each G-PCC unit according to embodiments. Each G-PCC unit consists of a G-PCC unit header and a G-PCC unit payload. In another embodiment, the G-PCC unit may include only the G-PCC unit payload. Whether the G-PCC unit includes the G-PCC unit header is identified by a gpcc_unit_header_not_included field. For example, when gpcc_unit_header_not_included is equal to 0, gpcc_unit_header( ) is included in gpcc_unit( ). When gpcc_unit_header_not_included is equal to 1, gpcc_unit_header( ) is not included in gpcc_unit( ).

FIG. 51 shows an exemplary syntax structure of a G-PCC unit header according to embodiments. In an embodiment, the G-PCC unit header (gpcc_unit_header( ) of FIG. 51 includes a gpcc_unit_type field. The gpcc_unit_type field indicates the G-PCC unit type or the type of data contained in the G-PCC unit payload.

FIG. 52 shows an example of G-PCC unit types allocated to the gpcc_unit_type field according to embodiments.

Referring to FIG. 52, according to an embodiment, gpcc_unit_type field equal to 0 indicates that the data contained in the G-PCC unit payload of the G-PCC unit is a sequence parameter set (GPCC_SPS), and gpcc_unit_type field equal to 1 indicates that the data is a geometry parameter set (GPCC_GPS). gpcc_unit_type field equal to 2 indicates that the data is an attribute parameter set (GPCC_APS). gpcc_unit_type field equal to 3 indicates that the data is a tile parameter set (GPCC_TPS). gpcc_unit_type field equal to 4 indicates that the data is a geometry slice (GPCC_GS). gpcc_unit_type field equal to 5 indicates that the data is an attribute slice (GPCC_AS). gpcc_unit_type field equal to 6 indicates that the data is a metadata slice (GPCC_MS). The geometry slice according to the embodiments contains geometry data which is decoded independently from another slice. The attribute slice according to the embodiments contains attribute data which is decoded independently from another slice. The metadata slice according to the embodiments contains metadata which is decoded independently from another slice.

In addition, in FIG. 51, when the gpcc_unit_type field equal 5, that is, when it indicates an attribute slice (GPCC_AS), the G-PCC unit header (gpcc_unit_header( ) may further include an attribute_id field.

The attribute_id field may specify an identifier for identifying the attribute slice.

The meaning, order, deletion, addition, or the like of values assigned to the gpcc_unit_type field may be easily changed by those skilled in the art, and accordingly the present invention shall not be limited to the above embodiment.

The G-PCC unit payload conforms to the format of the HEVC NAL unit.

FIG. 53 shows an exemplary syntax structure of a G-PCC unit payload (gpcc_unit_payload( )) according to embodiments.

The G-PCC unit payload of FIG. 53 includes one of is a sequence parameter set (SPS), a geometry parameter set (GPS), an attribute parameter set (APS), a tile parameter set (TPS), a geometry_slice_bitstream, an attribute slice bitstream, and a metadata slice bitstream according to the value of the gpcc_unit_type field in the G-PCC unit header.

When the value of the gpcc_unit_type field in the G-PCC unit header of FIG. 52 indicates sequence parameter set (GPCC_SPS), the G-PCC unit payload (gpcc_unit_payload( )) may contain a sequence parameter set (seq_parameter_set( )). For detailed information contained in seq_parameter_set( ) refer to the description of FIG. 24.

When the value of the gpcc_unit_type field indicates geometry parameter set (GPCC_GPS), the G-PCC unit payload (gpcc_unit_payload( )) may contain a geometry parameter set (geometry_parameter_set( )). For detailed information contained in the geometry_parameter_set( ), refer to the description of FIG. 27.

When the value of the gpcc_unit_type field indicates attribute parameter set (GPCC_APS), the G-PCC unit payload (gpcc_unit_payload( )) may contain an attribute parameter set (attribute parameter set( )). For detailed information contained in the attribute parameter set( ), refer to the description of FIG. 28.

When the value of the gpcc_unit_type field indicates tile parameter set (GPCC_TPS), the G-PCC unit payload (gpcc_unit_payload( )) may contain a tile parameter set (tile_parameter_set( )). For detailed information contained in the tile_parameter_set( ), refer to the description of FIG. 30.

When the value of the gpcc_unit_type field indicates geometry slice (GPCC_GS), the G-PCC unit payload (gpcc_unit_payload( ) may contain a geometry_slice_bitstream (geometry_slice_bitstream( )). For detailed information contained in the geometry_slice_bitstream( ), refer to the description of FIGS. 32 to 34.

When the value of the gpcc_unit_type field indicates attribute slice (GPCC_AS), the G-PCC unit payload (gpcc_unit_payload( ) may contain an attribute slice bitstream (attribute_slice_bitstream( ). For detailed information contained in the attribute_slice_bitstream( ) refer to the description of FIGS. 35 to 37.

When the value of the gpcc_unit_type field indicates metadata slice (GPCC_MS), the G-PCC unit payload (gpcc_unit_payload( ) may contain a metadata slice bitstream (metadata_slice_bitstream( )). For detailed information contained in the metadata_slice_bitstream( ) refer to the description of FIGS. 38 to 40.

In an embodiment, sample_stream_gpcc_unit may be defined as shown in FIG. 54 in order to store the GPCC unit in a sample in a track of a file.

FIG. 54 shows an exemplary syntax structure of sample_stream_gpcc_unit according to embodiments.

In FIG. 54, the ss_gpcc_unit_size field may indicate the length (or size) of a subsequent GPCC unit (G-PCC unit( )). As described above, the G-PCC unit may contain one of a sequence parameter set, a geometry parameter set, an attribute parameter set, a tile parameter set, a geometry slice (or referred to as a geometry_slice_bitstream), an attribute slice (or referred to as an attribute slice bitstream), a metadata slice (or referred to as a metadata slice bitstream).

As described above, the G-PCC bitstream composed of G-PCC units may be transmitted to the receiving side as it is, or may be encapsulated in the form of file/segment and transmitted to the receiving side through any one of the file/segment encapsulators of FIGS. 14, 15, and 18.

According to embodiments, the file/segment encapsulator of the transmission device of FIG. 14, 15 or 18 may encapsulate the G-PCC bitstream into a file and transmit the file. According to embodiments, the file may be decapsulated into a G-PCC bitstream by the file/segment decapsulator of the reception device of FIG. 14, 16 or 20.

For example, a G-PCC bitstream composed of G-PCC units carrying parameter sets, geometry slices, and zero or more attribute slices may be encapsulated in ISOBMFF (ISO Base Media File Format)-based file format by the file/segment encapsulator.

In one embodiment, the G-PCC bitstream composed of G-PCC units is stored in a single track or multiple tracks in the file.

Figure 55:
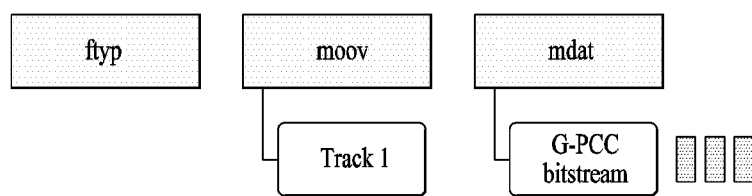
FIG. 55 is a diagram illustrating a structure of a single track G-PCC file according to embodiments.

FIG. 55 is a diagram illustrating a structure of a single track G-PCC file according to embodiments. That is, it shows an example of the layout of an ISOBMFF-based file containing a single track.

The ISOBMFF-based file according to the embodiments may be referred to as a container, a container file, a media file, a G-PCC file, or the like. Specifically, the file may be composed of a box and/or information, which may be referred to as ftyp, moov, or mdat.

The ftyp box (file type box) may provide information related to a file type or file compatibility for the file. The receiver may identify the file by referring to the ftyp box.

The mdat box, which is also referred to as a media data box, contains actual media data. According to embodiments, a geometry slice (or referred to as a coded geometry bitstream) and zero or more attribute slices (or referred to as coded attribute bitstreams) are contained in a sample of the mdat box in the file. According to embodiments, the sample may be referred to as a G-PCC sample.

The moov box, which is also referred to as a movie box, may contain metadata about the media data of the file. For example, it may contain information necessary for decoding and playback of the media data, and information about tracks and samples of the file. The moov box may serve as a container for all metadata. The moov box may be a box of the highest layer among the metadata related boxes.

According to embodiments, a sequence parameter set, a geometry parameter set, an attribute parameter set, and a tile parameter set may be included in a sample entry of the moov box or a sample of the mdat box in the file.

When a G-PCC bitstream is stored in a single track of a file according to embodiments, each sample contains multiple G-PCC components. That is, each sample is composed of one or more G-PCC units. According to embodiments, the sequence parameter set, the geometry parameter set, the attribute parameter set, the tile inventory, the geometry slice, and the attribute slice may each be referred to as a G-PCC component.

In order to store a G-PCC bitstream composed of G-PCC units according to embodiments in a single track in the file, Volumetric visual tracks, Volumetric visual media header, Volumetric sample entry, Volumetric samples, and samples and sample entries of a G-PCC track may be defined. According to embodiments, G-PCC data specifies volumetric encoding of a point cloud consisting of a sequence of point cloud frames. Each point cloud frame contains the number of points, positions thereof, and attributes thereof, which varies from frame to frame.

That is, the minf box in the trak box of the moov box may further include a volumetric visual media header (vvhd) box. The vvhd box contains information about a volumetric visual track containing a volumetric visual scene. Each volumetric visual scene may be represented by a unique volumetric visual track. An ISOBMFF file may contain multiple scenes and therefore multiple tracks may be present in the file.

According to the embodiments, a volumetric visual track may be identified by the volumetric visual media handler type 'vols' in the HandlerBox of the MediaBox.

The syntax of the vvhd box according to the embodiments is as follows.

Box Type: 'vvhd'
Container: MediaInformationBox
Mandatory: Yes
Quantity: Exactly one Volumetric tracks according to embodiments may use the VolumetricVisualMediaHeaderBox in the MediaInformationBox as follows.

```
aligned(8) class VolumetricVisualMediaHeaderBox
    extends FullBox('vvhd', version = 0, 1) {
}
```

In the syntax above, 'version' may be an integer value indicating the version of the corresponding box.

Volumetric visual tracks according to embodiments may use a volumetric visual sample entry as follows.

```
class VolumetricVisualSampleEntry(codingname)
    extends SampleEntry (codingname) {
    string Compressorname;
    // other boxes
}
```

The syntax of the G-PCC track sample entry in the G-PCC track, which is a single track according to the embodiments, is configured as follows.

Sample Entry Type: 'gpc1', 'gpcg'
Container: SampleDescriptionBox ('stsd')
Mandatory: A 'gpc1' or 'gpcg' sample entry is mandatory
Quantity: One or more sample entries may be present G-PCC tracks according to embodiments may use VolumetricVisualSampleEntry having a sample entry type of 'gpc1' or 'gpcg'.

The G-PCC volumetric sample entry according to the embodiments may include GPCCConfigurationBox as follows. The GPCCConfigurationBox may include GPCCDecoderConfigurationRecord. In one embodiment, when the sample entry type is 'gpc1', all parameter sets (e.g., SPS, GPS, APS, TPS) may be present in the sample entry. When the sample entry type is 'gpcg', the parameter sets may be present in the bitstream.

```
class GPCCConfigurationBox extends Box('gpcC') {
    GPCCDecoderConfigurationRecord( ) GPCCConfig;
}
aligned(8) class GPCCSampleEntry( ) extends
VolumetricVisualSampleEntry ('gpc1') {
    GPCCConfigurationBox config;
}
```

In one embodiment, the GPCCDecoderConfigurationRecord contained in the sample entry of the G-PCC track may be defined as follows. Parameter sets may be contained in the GPCCDecoderConfigurationRecord of the sample entry of the track as follows.

```
aligned(8) class GPCCDecoderConfigurationRecord {
        unsigned int(8) configurationVersion = 1;
        unsigned int(8) profile_idc;
        unsigned int(24) profile_compatibility_flags
        unsigned int(8) level_idc;
        unsigned int(8) num_attributes;
        unsigned int(8) numOfSequenceParameterSets;
        for (i=0; i<numOfSequenceParameterSets; i++) {
            unsigned int(16) sequenceParameterSetLength ;
            bit(8* sequenceParameterSetLength)
            sequence_parameter_set( );
        }
        unsigned int(8) numOfGeometryParameterSets;
        for (i=0; numOfGeometryParameterSets; i++) {
            unsigned int(16) geometryParameterSetLength ;
            bit(8* geometryParameterSetLength)
            geometry_parameter_set( );
        }
        unsigned int(8) numOfAttributeParameterSets;
        for (i=0; i<numOfAttributeParameterSets; i++) {
            unsigned int(16) attributeParameterSetLength ;bit(8*
            attributeParameterSetLength ) attribute_parameter_set( );
        }
        // additional fields
        bit(1) sps_in_sample_flag;
        bit(1) gps_in_sample_flag;
        bit(1) aps_in_sample_flag;
        bit(1) tps_in_sample_flag;
}
```

In the syntax above, the configurationVersion field is a version field. Incompatible changes to the GPCCDecoderConfigurationRecord may be indicated by a change of the version number in the configurationVersion field.

The profile_idc, profile_compatibility_flags, and level_idc fields may indicate information on a codec profile capable of decoding a G-PCC bitstream contained in the file.

The num_attributes field indicates the number of attributes related to the point cloud carried in this track.

The numOfSequenceParameterSets field, the numOfGeometryParameterSets field, and the numOfAttributeParameterSets field indicate the number of sequence parameter sets, the number of geometry parameter sets, and the number of attribute parameter sets, respectively. These may be used as an initial set of SPSs to decode the G-PCC bitstream carried in the track.

The sequenceParameterSetLength field indicates the length in bytes of the following sequence parameter set( ), the geometryParameterSetLength field indicates the length in bytes of the following geometry_parameter_set( ), and the attributeParameterSetLength field indicates the length in bytes of the following APSs.

The sps_in_sample_flag field indicates that the SPSs are carried in samples in this track).

The gps_in_sample_flag field indicates that the GPSs are carried in samples in the track.

The aps_in_sample_flag field indicates that the APSs are carried in samples in the track.

The tps_in_sample_flag field indicates that the TPSs are carried in samples in the track.

The G-PCC sample format of the G-PCC track, which is a single track according to the embodiments, may be defined as follows. Each sample in the G-PCC track corresponds to a single point cloud frame.

```
aligned(8) class GPCCSample
{
    unsigned int GPCCLength = sample_size; //Size of Sample from
    SampleSizeBox
    for (i=0; i<GPCCLength; ) // to end of the picture
    {
        unsigned int(32)              gpcc_unit_len;
        bit(gpcc_unit_len *8)         gpcc_unit;
        i += gpcc_unit_len;
    }
}
```

In the syntax above, the gpcc_unit_len field provides the number of bytes for the following G-PCC unit.

The following shows an exemplary syntax when zero or more parameter sets, for example, SPS, GPS, APS, and TPS, are carried in samples in the track.

```
aligned(8) class GPCCSample
{
    unsigned int GPCCLength = sample_size; //Size of Sample from
    SampleSizeBox
    unsigned int parameterSetLen =0;
    if(sps_in_sample_flag){
        unsigned int(16) sps_len;
        sequence_parameter_set( );
        parameterSetLen += sps_len;
    }
    if(gps_in_sample_flag){
        unsigned int(16) gps_len;
        geometry_parameter_set( );
        parameterSetLen += gps_len;
    }
    if(tps_in_sample_flag){
        unsigned int(16) tps_len;
        tile_parameter_set( );
        parameterSetLen += tps_len;
    }
    if(aps_in_sample_flag){
        for(i=0; i< num_attributes;i++){
            unsigned int(16) aps_len;
            attribute_parameter_set( );
            parameterSetLen += aps_len;
        }
    }
    for (i=0; i<(GPCCLength-parameterSetLen); ) // to end of the picture
    {
        unsigned int(32) gpcc_unit_len;
        bit(gpcc_unit_len *8) gpcc_unit;
        i += gpcc_unit_len;
    }
}
```

Referring to the syntax above, it may be seen that the SPS, GPS, APS, and TPS may be carried in samples in the track depending on the value of the sps_in_sample_flag field, the value of the gps_in_sample_flag field, the value of the aps_in_sample_flag field, and the value of the tps_in_sample_flag field contained in the GPCCDecoderConfigurationRecord of the sample entry of the track.

In this case, the sps_len field provides the number of bytes for a subsequent sequence parameter set( ). The gps_len field provides the number of bytes for a subsequent geometry parameter set( ). The aps_len field provides the number of bytes for a subsequent attribute parameter set( ). The tps_len field provides the number of bytes for a subsequent tile parameter set( ).

In another embodiment, the GPCCDecoderConfigurationRecord contained in the sample entry of the G-PCC track may be defined as follows.

```
aligned(8) class GPCCDecoderConfigurationRecord {
    unsigned int(8) configurationVersion = 1;
    unsigned int(8)         profile_idc;
        unsigned int(24)    profile_compatibility_flags;
    unsigned int(8)         level_idc;
    unsigned int(8)         numOfSetupUnits;
    for (i=0; i<numOfSetupUnits; i++) {
        sample_stream_gpcc_unit setupUnit;
    }
    // additional fields
}
```

In the syntax above, the configurationVersion field is a version field. Incompatible changes to the GPCCDecoderConfigurationRecord may be indicated by a change of the version number in the configurationVersion field.

The profile_idc, profile_compatibility_flags, and level_idc fields may indicate information on a codec profile capable of decoding a G-PCC bitstream contained in the file.

The numOfSetupUnits field specifies the number of G-PCC parameter sets signaled in the GPCCDecoderConfigurationRecord.

The setupUnit array field may include one or more SPS(s), one or more GPS(s), one or more TPS(s), or one or more APS(s).

In one embodiment, when the G-PCC track contains a geometry bitstream, the setupUnit array may contain SPS, TPS, and GPS. In another embodiment, when the G-PCC track contains an attribute bitstream, the setupUnit array may contain SPS, TPS, and APS.

The G-PCC sample format of the G-PCC track according to the embodiments may be defined as shown below. Each sample in the G-PCC track corresponds to a single point cloud frame.

```
aligned(8) class GPCCSample
{
    unsigned int GPCCLength = sample_size; //Size of Sample from SampleSizeBox
    for (i=0; i<GPCCLength; ) // to end of the picture
    {
        unsigned int(32) gpcc_unit_len;
        bit(gpcc_unit_len *8) gpcc_unit;
        i += gpcc_unit_len;
    }
}
```

In the syntax above, the gpcc_unit_len field provides the number of bytes for a subsequent G-PCC unit. In one embodiment, when the G-PCC track contains a geometry bitstream, gpcc_unit may contain SPS, TPS, GPS, and a geometry slice. In another embodiment, when the G-PCC track contains an attribute bitstream, gpcc_unit may contain SPS, TPS, GPS, and an attribute slice. In another embodiment, when the G-PCC track contains a metadata bitstream, gpcc_unit may contain SPS, TPS, and a metadata slice.

Next, when sample_stream_gpcc_unit is defined as shown in FIG. 54, the G-PCC sample format of the G-PCC track may be defined as follows.

```
aligned(8) class GPCCSample
{
    unsigned int GPCCLength = sample_size; //Size of Sample from SampleSizeBox
    for (i=0; i<GPCCLength; )
    {
        sample_stream_gpcc_unit unit;
        i += unit.ss_gpcc_unit_size;
    }
}
```

In one embodiment, when the G-PCC track contains a geometry bitstream, the unit may contain SPS, TPS, GPS, and a geometry slice. In another embodiment, when the G-PCC track contains an attribute bitstream, the unit may contain SPS, TPS, GPS, and an attribute slice. In another embodiment, when the G-PCC track contains a metadata bitstream, the unit may contain SPS, TPS, and a metadata slice.

Figure 56:
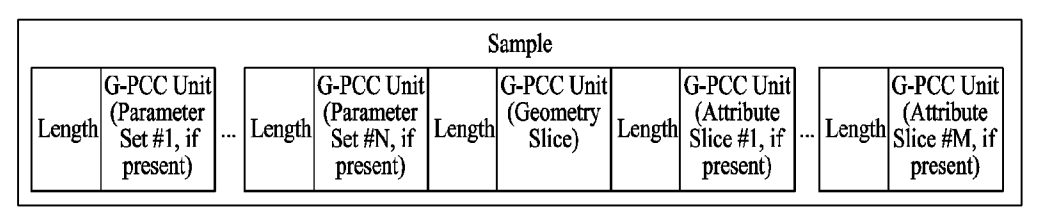

FIG. 56 is a diagram illustrating an exemplary sample structure of an mdat box when a G-PCC bitstream composed of G-PCC units is stored in a single track according to embodiments.

In FIG. 56, a sample includes a geometry G-PCC unit containing a geometry slice (i.e., a coded geometry bitstream). In addition, if present, the sample may further include G-PCC units containing one or more parameter sets. If present, the sample may further include G-PCC units containing one or more attribute slices (i.e., coded attribute bitstreams). In addition, length information indicating the length of the corresponding G-PCC unit is further included in front of each G-PCC unit.

According to an embodiment, the value of the length information is indicated by the ss_gpcc_unit_size field of FIG. 54.

Figure 57:
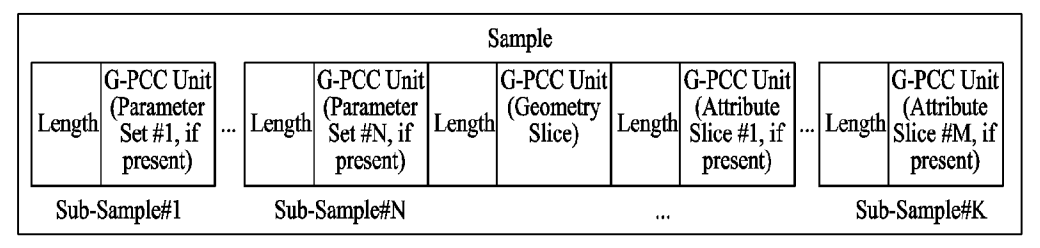

In addition, when one sample is composed of multiple G-PCC units, each of the multiple G-PCC units is stored as a sub-sample as shown in FIG. 57. According to embodiments, the sub-sample may be referred to as a G-PCC sub-sample.

FIG. 57 is a diagram illustrating an exemplary sub-sample structure of an mdat box when a G-PCC bitstream composed of G-PCC units is stored in a single track in a file according to embodiments.

For example, when a sample contains a parameter set G-PCC unit containing a parameter set, a geometry G-PCC unit containing a geometry slice, and an attribute G-PCC unit containing an attribute slice, each of the parameter set G-PCC unit, the geometry G-PCC unit, and the attribute G-PCC unit is stored as a sub-sample together with length information thereabout. In the present disclosure, according to an embodiment, the sub-sample contains only one G-PCC unit.

As shown in FIG. 57, in order to efficiently access the G-PCC units carried as sub-samples in each sample, signaling may be added to the SampleTableBox or TrackFragmentBox of the moov box as follows.

Box Type: 'subs'
Container: SampleTableBox or TrackFragmentBox
Mandatory: No
Quantity: Zero or more The syntax structure of SubSampleInformationBox contained in the SampleTableBox or TrackFragmentBox may be defined as follows.

```
aligned(8) class SubSampleInformationBox extends FullBox('subs',
version, flags) {
    unsigned int(32) entry_count;
    int i,j;
    for (i=0; i < entry_count; i++) {
        unsigned int(32) sample_delta;
        unsigned int(16) subsample_count;
        if (subsample_count > 0) {
            for (j=0; j < subsample_count; j++) {
                if(version == 1)
                {
                    unsigned int(32) subsample_size;
                }
                else
                {
                    unsigned int(16) subsample_size;
                }
                unsigned int(8) subsample_priority;
                unsigned int(8) discardable;
                unsigned int(32) codec_specific_parameters;
            }
        }
    }
}
```

G-PCC sub-samples may be defined as G-PCC units that are consecutive to each other in the G-PCC bitstream. In addition, the G-PCC sub-samples correspond to the same presentation time (i.e. belong to the same G-PCC sample), and each G-PCC unit is comprised of a G-PCC unit header (optionally) and a payload. An approach could be to utilize the 32 bit codec_specific_parameters field in the above which is defined per sub-sample.

In an embodiment, the codec_specific_parameters field may include the gpcc_unit_type field of FIG. 52. In another embodiment, the codec_specific_parameters field may include gpcc_unit_header of FIG. 51. In another embodiment, exactly one SubSampleInformation box may be present in the SampleTableBox as well as in the TrackFragment boxes of the G-PCC track.

FIG. 55 shows an example of a single track in which a G-PCC bitstream composed of G-PCC units is stored, FIG. 56 shows a sample structure when at least one G-PCC unit is stored in a single track, and FIG. 57 shows a sub-sample structure when one or more G-PCC units are stored in a single track.

A G-PCC bitstream composed of G-PCC units may be stored in multiple tracks in a file. In this case, each track may contain a geometry bitstream, an attribute bitstream, and a metadata stream of a point cloud.

Figure 58:
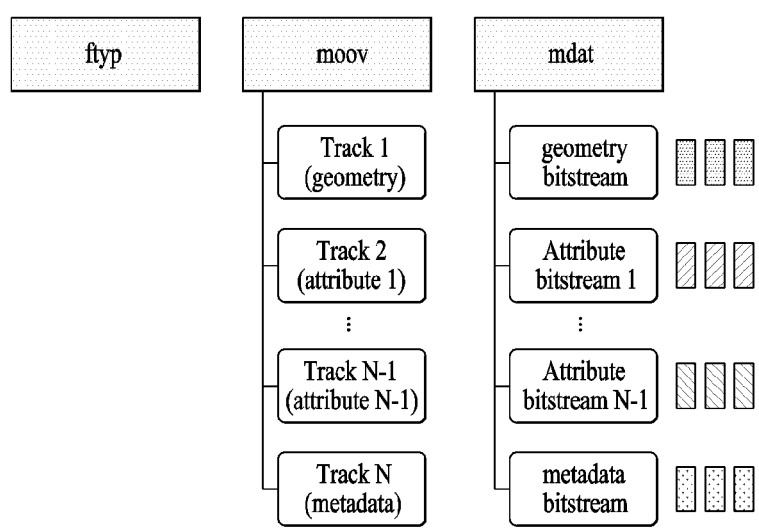
FIG. 58 is a diagram illustrating a structure of a multi track G-PCC file according to embodiments.

FIG. 58 is a diagram illustrating a structure of a multiple track G-PCC file according to embodiments. That is, the figure shows an example of the layout of an ISOBMFF-based file containing multiple tracks.

In FIG. 58, the ISOBMFF-based file may be referred to as a container, a container file, a media file, a G-PCC file, or the like. Specifically, the file may be composed of a box and/or information, which may be referred to as ftyp, moov, or mdat.

FIG. 58 illustrates an exemplary case where when a G-PCC bitstream is stored in multiple tracks of an ISOBMFF-based file, a geometry bitstream (i.e., geometry slice) is stored in track 1, attribute bitstream #1 (i.e., attribute slice #1) is stored in track 2, attribute bitstream #2 (i.e., attribute #2) is stored in track N−1, and a metadata bitstream (i.e., metadata slice) is stored in track N.

According to embodiments, when the tracks in the file contains a geometry bitstream, an attribute bitstream, and a metadata bitstream of a point cloud, respectively, the sequence parameter set (SPS) and the tile parameter set (TPS) may be contained in a sample entry or a sample of at least one of the track containing the geometry bitstream, the track containing the attribute bitstream, and the track containing the metadata bitstream. In one embodiment, when a track contains the geometry bitstream of the point cloud, the geometry parameter set (GPS) may be contained in the sample entry or sample of the track. In one embodiment, when a track contains the attribute bitstream of the point cloud, the attribute parameter set (APS) may be contained in the sample entry or sample of the track.

Figure 59:
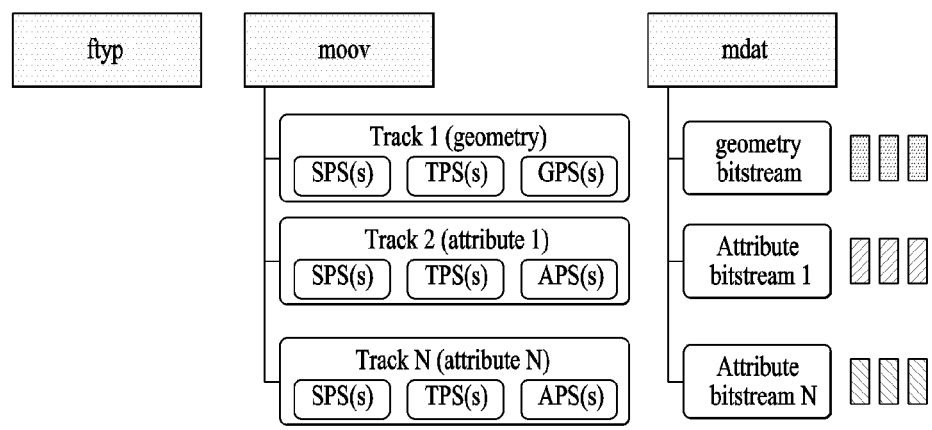
FIG. 59 is a diagram illustrating a structure of a multi track G-PCC file according to embodiments.

FIG. 59 shows an example in which the SPS, TPS, GPS, and APS are contained in the sample entries of the corresponding tracks when a G-PCC bitstream composed of G-PCC units according to embodiments is contained in multiple tracks of a file. In this case, the geometry bitstream is contained in the sample of the geometry track, the attribute bitstream is contained in the sample of the attribute track, and the metadata bitstream is contained in the sample of the metadata track.

Figure 60:
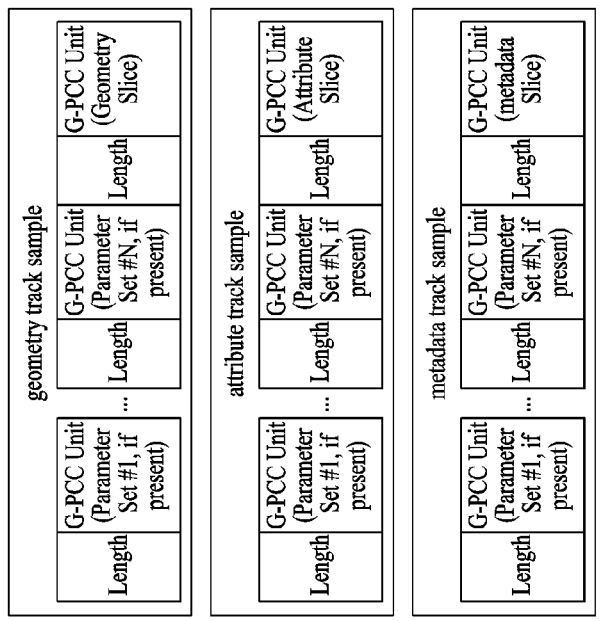
FIG. 60 is a diagram illustrating an exemplary sub-sample structure when a G-PCC bitstream composed of G-PCC units is stored in multiple tracks according to embodiments.

FIG. 60 is a diagram illustrating an exemplary structure of samples of an mdat box when a G-PCC bitstream composed of G-PCC units according to embodiments is stored in multiple tracks of a file.

In FIG. 60, a sample of a geometry track (or referred to as a G-PCC geometry track) contains a G-PCC unit containing a geometry slice, but does not contain either a G-PCC unit containing an attribute slice or a G-PCC unit containing a metadata slice. Similarly, a sample of an attribute track (or referred to as a G-PCC attribute track) contains a G-PCC unit containing an attribute slice, but does not contain either a G-PCC unit containing a geometry slice or a G-PCC unit containing a metadata slice. However, when parameter sets are present, the parameter sets may be contained in a sample of a geometry track, and/or a sample of an attribute track and/or a sample of a metadata track as G-PCC units. In an embodiment, the sequence parameter set and the tile parameter set may be contained in at least one of the sample of the geometry track, the sample of the attribute track, and the sample of the metadata track. On the other hand, the geometry parameter set is contained in the sample of the geometry track, and the attribute parameter set is contained in the sample of the attribute track.

In one embodiment, when a G-PCC bitstream composed of G-PCC units is carried in multiple tracks, a track carrying a geometry bitstream becomes an entry point.

In this case, when one sample is composed of multiple G-PCC units, each of the multiple G-PCC units may be stored as a sub-sample. For example, when one sample contains a parameter set G-PCC unit containing a parameter set and a geometry G-PCC unit containing a geometry slice, each of the parameter set G-PCC unit and the geometry G-PCC unit is stored as a sub-sample together with length information thereabout. As another example, when one sample contains a parameter set G-PCC unit containing a parameter set and an attribute G-PCC unit containing an attribute slice, each of the parameter set G-PCC unit and the attribute G-PCC unit is stored as a sub-sample together with length information thereabout. In the present disclosure, according to an embodiment, the sub-sample contains only one G-PCC unit.

The definition and syntax structure of the volumetric visual tracks, volumetric visual media header, volumetric sample entry, and volumetric samples for storing a G-PCC bitstream composed of G-PCC units according to the embodiments in multiple tracks of a file are the same as or similar to the definition and syntax structure of the volumetric visual tracks, volumetric visual media header, volumetric sample entry, and volumetric samples for storing the G-PCC bitstream composed of G-PCC units in a single track of the file describe above, and thus a detailed description thereof is omitted.

The volumetric sample entry (i.e., the sample entry of the G-PCC track) according to the embodiments may contain a GPCCConfigurationBox as described above. The GPCCConfigurationBox may contain GPCCDecoderConfigurationRecord.

The GPCCDecoderConfigurationRecord contained in the sample entry of the G-PCC track may be defined as follows.

```
aligned(8) class GPCCDecoderConfigurationRecord {
    unsigned int(8)     configurationVersion = 1;
    unsigned int(8)     profile_idc;
    unsigned int(24)    profile_compatibility_flags;
    unsigned int(8)     level_idc;
    unsigned int(8)     numOfSetupUnits;
    for (i=0; i<numOfSetupUnits; i++) {
        sample_stream_gpcc_unit setupUnit;
    }
    // additional fields
}
```

In the syntax above, the configurationVersion field is a version field. Incompatible changes to the GPCCDecoderConfigurationRecord may be indicated by a change of the version number in the configurationVersion field.

The profile_idc, profile_compatibility_flags, and level_idc fields may indicate information on a codec profile capable of decoding a G-PCC bitstream contained in the file.

The numOfSetupUnits field specifies the number of G-PCC parameter sets signaled in the GPCCDecoderConfigurationRecord.

The setupUnit array field may include one or more SPS(s), one or more GPS(s), one or more TPS(s), or one or more APS(s).

In one embodiment, when the G-PCC track contains a geometry bitstream, the setupUnit array may contain SPS, TPS, and GPS. In another embodiment, when the G-PCC track contains an attribute bitstream, the setupUnit array may contain SPS, TPS, and APS.

The G-PCC sample format of the G-PCC track according to the embodiments may be defined as shown below. Each sample in the G-PCC track corresponds to a single point cloud frame.

```
aligned(8) class GPCCSample
{
    unsigned int GPCCLength = sample_size; //Size of Sample
    from SampleSizeBox
    for (i=0; i<GPCCLength; ) // to end of the picture
    {
        unsigned int(32)    gpcc_unit_len;
        bit(gpcc_unit_len *8) gpcc_unit;
        i += gpcc_unit_len;
    }
}
```

In the syntax above, the gpcc_unit_len field provides the number of bytes for a subsequent G-PCC unit.

In one embodiment, when the G-PCC track contains a geometry bitstream, gpcc_unit may contain SPS, TPS, GPS, and a geometry slice. When the G-PCC track contains an attribute bitstream, gpcc_unit may contain SPS, TPS, GPS, and an attribute slice. In another embodiment, when the G-PCC track contains a metadata bitstream, gpcc_unit may contain SPS, TPS, and a metadata slice.

The following shows an example of a syntax for storing a GPCC unit in a file when sample_stream_gpcc_unit is defined as shown in FIG. 54.

```
aligned(8) class GPCCSample
{
    unsigned int GPCCLength = sample_size; //Size of Sample from
    SampleSizeBox
    for (i=0; i<GPCCLength; )
    {
        sample_stream_gpcc_unit unit;
        i += unit.ss_gpcc_unit_size;
    }
}
```

In one embodiment, when the G-PCC track contains a geometry bitstream, the unit may contain SPS, TPS, GPS, and a geometry slice. In another embodiment, when the G-PCC track contains an attribute bitstream, the unit may contain SPS, TPS, GPS, and an attribute slice. In another embodiment, when the G-PCC track contains a metadata bitstream, the unit may contain SPS, TPS, and a metadata slice.

Next, a method of referring to a track of a G-PCC bitstream in a file will be described. To link tracks to reconstruct the same point cloud frame, the track reference tool of the ISOBMFF standard is used. In one embodiment, three TrackReferenceTypeBoxes may be added to a TrackReferenceBox within the TrackBox of the G-PCC track, one for each component. The TrackReferenceTypeBox shall contain an array of track_IDs designating tracks referred to by the G-PCC track. The parameter reference_type of TrackReferenceTypeBox identifies the type of a component (i.e., geometry, attribute). The 4CCs of these track reference types are as follows.

'gpca': the referenced track(s) contain the attribute G-PCC component

'gpcg': the referenced track(s) contain the geometry G-PCC component

'gpcm': the referenced track(s) contain the metadata G-PCC component

An ISOBMFF container may contain multiple contents, which may be different versions of the same content or may be different contents.

All tracks which are alternatives of each other may be indicated by the track alternate mechanism defined in ISOBMFF, for example, the alternate_group field of TrackHeaderBox ('tkhd'). Tracks that have the same alternate_group value may be different encoded versions of the same G-PCC component. Therefore, a volumetric visual scene may be coded in alternatives. Each of these may be represented by the main patch data track. These tracks may form an alternate group defined by the TrackHeader.

In one embodiment, the G-PCC bitstream may be carried in the separate video tracks, not in the same track. In this case, to enable the point cloud points to be reconstructed properly, the same point cloud component is used. Tracks belonging to the same point cloud component have the same value of track_group_id for track_group_type 'gpccg', and the track_group_id of tracks from one component differs from the track_group_id of tracks from any other component. By default, when this track grouping is not indicated for any track in a file, the file does not include only one G-PCC component.

```
aligned(8) class PCMTrackGroupBox extends
TrackGroupTypeBox('gpcg') {
    unsigned int(4)    data_type;
}
```

In the syntax above, the data_type field indicates the type of PCC data associated with the referenced track group. For example, data_type equal to 2 may indicate geometry, data_type equal to 3 may indicate attribute, and data_type equal to 4 may indicate metadata.

This may be used to restore point cloud data necessary according to a function or the like by notifying a player or a renderer of the type of point cloud data that may be restored using data of tracks belonging to the same track group.

Figure 61:
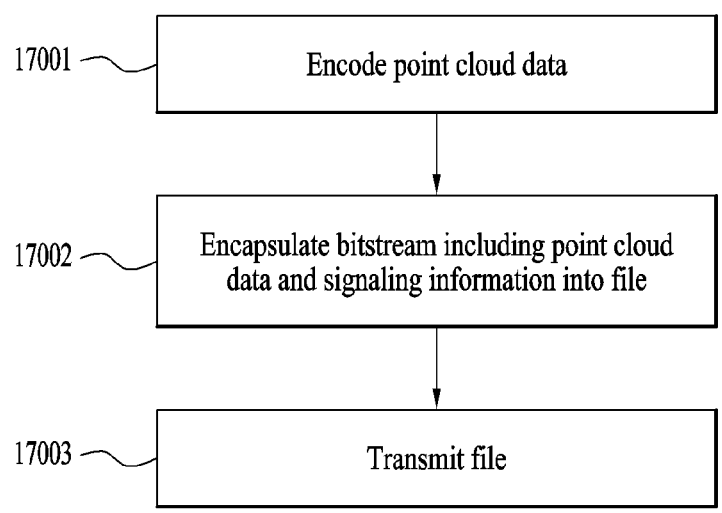
FIG. 61 is a flowchart of a method of transmitting point cloud data according to embodiments.

FIG. 61 is a flowchart of a method of transmitting point cloud data according to embodiments.

The point cloud data transmission method according to the embodiments may include an operation 17001 of encoding point cloud data, an operation 17002 of encapsulating a bitstream containing the encoded point cloud data and signaling information into a file, and an operation 17003 of transmitting the file.

In the operation 17001 of encoding the point cloud data, some or all of the operations of the point cloud video encoder 10002 of FIG. 1, the encoding 20001 of FIG. 2, the point cloud video encoder of FIG. 4, the point cloud video encoder of FIG. 12, the point cloud video encoding of FIG. 14, the point cloud video encoding of FIG. 15, and the point cloud video encoder of FIG. 18.

According to embodiments, the operation 17001 of encoding the point cloud data may include encoding geometry data (or referred to as geometry information) about the point cloud data and encoding attribute data (or referred to as attribute information) about the point cloud data. In the encoding operation according to the embodiments, encoding may be performed on the basis of a slice or a tile containing one or more slices.

The operation 17002 of encapsulating the bitstream containing the encoded point cloud data and the signaling information into a file represents an operation of encapsulating the G-PCC bitstream structure of FIG. 41 or the G-PCC bitstream structure of FIG. 49 into an ISOBMFF file. The operation 17002 of encapsulating the bitstream containing the encoded point cloud data and the signaling information into a file according to the embodiments may be performed by the file/segment encapsulator of FIG. 14, 15 or 18.

The bitstream containing the encoded point cloud data and the signaling information according to the embodiments may refer to one of a G-PCC bitstream composed of TLV encapsulation structures or a G-PCC bitstream composed of G-PCC units. In this case, the point cloud data may include geometry data (or referred to as geometry information) and attribute data (or referred to as attribute information), and the signaling information may include parameter sets such as SPS, GPS, APS, and TPS, and/or metadata.

The G-PCC bitstream of FIG. 41 and/or the G-PCC bitstream of FIG. 49 according to embodiments may contain signaling information such as SPS, GPS, APS, and TPS, geometry data (e.g., a geometry slice), and attribute data (e.g., an attribute slice), and metadata (e.g., a metadata slice). The metadata may also be referred to as signaling information.

Description of each TLV encapsulation structure and each G-PCC unit will be omitted. For each TLV encapsulation, refer to FIGS. 41 to 43. For each G-PCC unit, refer to FIGS. 49 to 53.

When the G-PCC bitstream according to the embodiments is encapsulated into a file, the G-PCC bitstream may be stored in a single track or multiple tracks of the file.

For a file structure given when a G-PCC bitstream composed of TLV encapsulation structures according to the embodiments is stored in a single track or multiple tracks of the file, refer to the description of FIGS. 44 to 47.

A file structure given when a G-PCC bitstream composed of G-PCC units according to the embodiments is stored in a single track or multiple tracks of the file will be described with reference to the description of FIGS. 55 to 60.

When a bitstream composed of TLV encapsulation structures or G-PCC units is transmitted in a single track or multiple tracks of a file, a sequence parameter set, a geometry parameter set, an attribute parameter set, a tile parameter set (or tile inventory) may be contained in the sample entry or sample of the track. However, a geometry bitstream (i.e., a geometry slice), an attribute bitstream (i.e., an attribute slice), and a metadata bitstream (i.e., a metadata slice) are contained in the samples of the track.

In this case, when one sample is composed of multiple TLV encapsulation structures, each of the multiple TLV encapsulation structures may be stored as a sub-sample. In addition, when one sample is composed of multiple G-PCC units, each of the multiple G-PCC units may be stored as a sub-sample together with length information thereabout.

Figure 62:
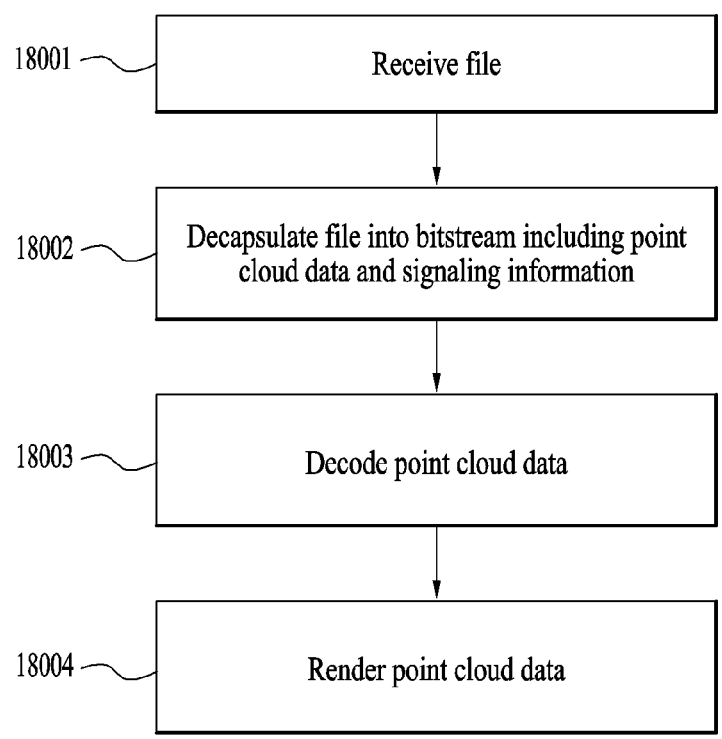
FIG. 62 is a flowchart of a method of receiving point cloud data according to embodiments.

FIG. 62 is a flowchart of a method of receiving point cloud data according to embodiments.

The point cloud data reception method according to the embodiments may include an operation 18001 of receiving a file, an operation 18002 of decapsulating the received file into a bitstream containing point cloud data and signaling information, and an operation 18003 of decoding the point cloud data, and an operation 18004 of rendering the decoded point cloud data.

The G-PCC bitstream of FIG. 41 or the G-PCC bitstream of FIG. 49 may be stored in a single track or multiple tracks of an ISOBMFF-based file received in the reception operation 18001 according to the embodiments.

In the decapsulation operation 18002 according to the embodiments, decapsulation is performed to acquire the G-PCC bitstream composed of TLV encapsulation structures of FIG. 41 or the G-PCC bitstream composed of G-PCC units of FIG. 49 from a single track or multiple tracks of the received file.

The G-PCC bitstream of FIG. 41 and/or the G-PCC bitstream of FIG. 49 according to embodiments may contain signaling information such as SPS, GPS, APS, and TPS, geometry data (e.g., a geometry slice), and attribute data (e.g., an attribute slice), and metadata (e.g., a metadata slice). The metadata may also be referred to as signaling information.

According to embodiments, the G-PCC bitstream composed of TLV encapsulation structures or the G-PCC bitstream composed of G-PCC units may be referred to as a bitstream containing point cloud data and signaling information. In this case, the point cloud data may include geometry data (or referred to as geometry information) and attribute data (or attribute information), and the signaling information may include parameter sets such as SPS, GPS, APS, and TPS, and/or metadata.

The operation 18002 of decapsulating the file according to embodiments into a bitstream containing point cloud data and signaling information may be performed by the file/segment decapsulator of FIG. 14, 16 or 20.

The operation 18003 of decoding the point cloud data according to the embodiments may include decoding geometry data (or geometry information) about the point cloud data and attribute data (or attribute information) about the point cloud data based on the signaling information. Here, in the decoding operation according to embodiments, decoding may be performed on the basis of a slice or a tile containing one or more slices.

In the operation 18003 of decoding the point cloud data according to the embodiments, some or all of the operations of the point cloud video decoder 10006 of FIG. 1, the decoding 20003 of FIG. 2, the point cloud video decoder of FIG. 11, and the point cloud video decoder of FIG. 13, the point cloud video decoding of FIG. 14, the point cloud video decoding of FIG. 16, and the point cloud video decoder of FIG. 20.

In the operation 18004 of rendering the point cloud data according to the embodiments, the decoded point cloud data may be rendered according to various rendering methods. For example, the points of the point cloud content may be rendered onto a vertex having a certain thickness, a cube of a specific minimum size centered on the vertex position, or a circle centered on the vertex position. All or part of the rendered point cloud content is provided to the user through a display (e.g. a VR/AR display, a general display, etc.).

The operation 18004 of rendering the point cloud data according to the embodiments may be performed by the renderer 10007 of FIG. 1, the rendering 20004 of FIG. 2, the renderer 13011 of FIG. 13, the rendering unit of FIG. 14, or the point cloud rendering unit of FIG. 16.

Each part, module, or unit described above may be a software, processor, or hardware part that executes successive procedures stored in a memory (or storage unit). Each of the steps described in the above embodiments may be performed by a processor, software, or hardware parts. Each module/block/unit described in the above embodiments may operate as a processor, software, or hardware. In addition, the methods presented by the embodiments may be executed as code. This code may be written on a processor readable storage medium and thus read by a processor provided by an apparatus.

In the specification, when a part "comprises" or "includes" an element, it means that the part further comprises or includes another element unless otherwise mentioned. Also, the term " . . . module(or unit)" disclosed in the specification means a unit for processing at least one function or operation, and may be implemented by hardware, software or combination of hardware and software.

Although embodiments have been explained with reference to each of the accompanying drawings for simplicity, it is possible to design new embodiments by merging the embodiments illustrated in the accompanying drawings. If a recording medium readable by a computer, in which programs for executing the embodiments mentioned in the foregoing description are recorded, is designed by those skilled in the art, it may fall within the scope of the appended claims and their equivalents.

The apparatuses and methods may not be limited by the configurations and methods of the embodiments described above. The embodiments described above may be configured by being selectively combined with one another entirely or in part to enable various modifications.

Although preferred embodiments have been described with reference to the drawings, those skilled in the art will appreciate that various modifications and variations may be made in the embodiments without departing from the spirit or scope of the disclosure described in the appended claims. Such modifications are not to be understood individually from the technical idea or perspective of the embodiments.

Various elements of the apparatuses of the embodiments may be implemented by hardware, software, firmware, or a combination thereof. Various elements in the embodiments may be implemented by a single chip, for example, a single hardware circuit. According to embodiments, the components according to the embodiments may be implemented as separate chips, respectively. According to embodiments, at least one or more of the components of the apparatus according to the embodiments may include one or more processors capable of executing one or more programs. The one or more programs may perform any one or more of the operations/methods according to the embodiments or include instructions for performing the same. Executable instructions for performing the method/operations of the apparatus according to the embodiments may be stored in a non-transitory CRM or other computer program products configured to be executed by one or more processors, or may be stored in a transitory CRM or other computer program products configured to be executed by one or more processors. In addition, the memory according to the embodiments may be used as a concept covering not only volatile memories (e.g., RAM) but also nonvolatile memories, flash memories, and PROMs. In addition, it may also be implemented in the form of a carrier wave, such as transmission over the Internet. In addition, the processor-readable recording medium may be distributed to computer systems connected over a network such that the processor-readable code may be stored and executed in a distributed fashion.

In this document, the term "/" and "," should be interpreted as indicating "and/or." For instance, the expression "A/B" may mean "A and/or B." Further, "A, B" may mean "A and/or B." Further, "A/B/C" may mean "at least one of A, B, and/or C." "A, B, C" may also mean "at least one of A, B, and/or C." Further, in the document, the term "or" should be interpreted as "and/or." For instance, the expression "A or B" may mean 1) only A, 2) only B, and/or 3) both A and B. In other words, the term "or" in this document should be interpreted as "additionally or alternatively."

Terms such as first and second may be used to describe various elements of the embodiments. However, various components according to the embodiments should not be limited by the above terms. These terms are only used to distinguish one element from another. For example, a first user input signal may be referred to as a second user input signal. Similarly, the second user input signal may be referred to as a first user input signal. Use of these terms should be construed as not departing from the scope of the various embodiments. The first user input signal and the second user input signal are both user input signals, but do not mean the same user input signal unless context clearly dictates otherwise. The terminology used to describe the embodiments is used for the purpose of describing particular embodiments only and is not intended to be limiting of the embodiments. As used in the description of the embodiments and in the claims, the singular forms "a", "an", and "the" include plural referents unless the context clearly dictates otherwise. The expression "and/or" is used to include all possible combinations of terms. The terms such as "includes" or "has" are intended to indicate existence of figures, numbers, steps, elements, and/or components and should be understood as not precluding possibility of existence of additional existence of figures, numbers, steps, elements, and/or components.

As used herein, conditional expressions such as "if" and "when" are not limited to an optional case and are intended to be interpreted, when a specific condition is satisfied, to perform the related operation or interpret the related definition according to the specific condition. Embodiments may include variations/modifications within the scope of the claims and their equivalents. It will be apparent to those skilled in the art that various modifications and variations can be made in the present invention without departing from the spirit and scope of the invention. Thus, it is intended that the present invention cover the modifications and variations of this invention provided they come within the scope of the appended claims and their equivalents.

MODE FOR INVENTION

As described above, related contents have been described in the best mode for carrying out the embodiments.

INDUSTRIAL APPLICABILITY

As described above, the embodiments may be fully or partially applied to the point cloud data transmission/reception device and system. It will be apparent to those skilled in the art that variously changes or modifications can be made to the embodiments within the scope of the embodiments. Thus, it is intended that the embodiments cover the modifications and variations of this disclosure provided they come within the scope of the appended claims and their equivalents.

The invention claimed is:

1. A point cloud data transmission method performed by an apparatus, the method comprising:
   acquiring point cloud data;
   encoding geometry data including positions of points of the point cloud data;
   encoding attribute data including attribute values of the points of the point cloud data based on the geometry data;
   encapsulating a geometry-based point cloud compression (G-PCC) bitstream that includes the encoded geometry data, the encoded attribute data and signaling data into a file; and
   transmitting the file,
   wherein the signaling data includes parameter sets,
   wherein the G-PCC bitstream is comprised of type-length-value (TLV) encapsulation structures,
   wherein each of the TLV encapsulation structures consists of type information, length information and a payload,
   wherein the type information indicates a type of data in the payload, the length information indicates a length of the payload and the payload includes one of the encoded geometry data, the encoded attribute data, and each of the parameter sets, and
   wherein the G-PCC bitstream is stored either in a single track or in multiple tracks of the file by the TLV encapsulation structure.

2. The method of claim 1,
   wherein, when the G-PCC bitstream is stored in the single track, a TLV encapsulation structure including the geometry data and a TLV encapsulation structure including the attribute data are stored in a sample of the single track and TLV encapsulation structures including the parameter sets are stored in at least one of a sample entry and the sample of the single track.

3. The method of claim 1,
   wherein, when the G-PCC bitstream is stored in the multiple tracks, a TLV encapsulation structure including the geometry data and a TLV encapsulation structure including the attribute data are stored in a sample of a separate track, respectively, and TLV encapsulation structures including the parameter sets are stored in at least one of a sample entry and the sample of the separate track, respectively.

4. The method of claim 3,
   wherein the sample entry of the separate track, respectively, further includes a box for indicating whether a corresponding track carries the TLV encapsulation structure including the geometry data or the TLV encapsulation structure including the attribute data.

5. A point cloud data reception method performed by an apparatus, the method comprising:
   receiving a file;
   decapsulating the file into a geometry-based point cloud compression (G-PCC) bitstream that includes geometry data, attribute data and signaling data, the signaling data including parameter sets, wherein the G-PCC bitstream is comprised of type-length-value (TLV) encapsulation structures, wherein the G-PCC bitstream is stored either in a single track or in multiple tracks of the file by the TLV encapsulation structure, wherein each of the TLV encapsulation structures consists of type information, length information and a payload, and wherein the type information indicates a type of data in the payload, the length information indicates a length of the payload and the payload includes one of the geometry data, the attribute data, and each of the parameter sets;
   decoding the geometry data included in one of the TLV encapsulation structures;
   decoding the attribute data included in one of the TLV encapsulation structures based on the decoded geometry data; and
   restoring point cloud data based on the decoded geometry data including positions of points of the point cloud data, the decoded attribute data including attribute values of the points of the point cloud data, and the signaling data.

6. The method of claim 5,
   wherein, when the G-PCC bitstream is stored in the single track, the TLV encapsulation structure including the geometry data and the TLV encapsulation structure including the attribute data are stored in a sample of the single track and TLV encapsulation structures including the parameter sets are stored in at least one of a sample entry and the sample of the single track.

7. The method of claim 5,
   wherein, when the G-PCC bitstream is stored in the multiple tracks, the TLV encapsulation structure including the geometry data and the TLV encapsulation structure including the attribute data are stored in a sample of a separate track, respectively, and TLV encapsulation structures including the parameter sets are stored in at least one of a sample entry and the sample of the separate track, respectively.

8. The method of claim 7,
   wherein the sample entry of the separate track, respectively, further includes a box for indicating whether a corresponding track carries the TLV encapsulation structure including the geometry data or the TLV encapsulation structure including the attribute data.

9. A point cloud data reception apparatus, the apparatus comprising:
a receiver to receive a file;
a decapsulator to decapsulate the file into a geometry-based point cloud compression (G-PCC) bitstream that includes geometry data, attribute data and signaling data, the signaling data including parameter sets, wherein the G-PCC bitstream is comprised of a sequence of type-length-value (TLV) encapsulation structures, wherein the G-PCC bitstream is stored either in a single track or in multiple tracks of the file by the TLV encapsulation structure, wherein each of the TLV encapsulation structures consists of type information, length information and a payload, and wherein the type information indicates a type of data in the payload, the length information indicates a length of the payload and the payload includes one of the geometry data, the attribute data, and each of the parameter sets;
a geometry decoder to decode the geometry data included in one of the TLV encapsulation structures;
an attribute decoder to decode the attribute data included in one of the TLV encapsulation structures based on the decoded geometry data; and
a processor to restore point cloud data based on the decoded geometry data including positions of points of the point cloud data, the decoded attribute data including attribute values of the points of the point cloud data, and the signaling data.

10. The apparatus of claim 9,
wherein, when the G-PCC bitstream is stored in the single track, the TLV encapsulation structure including the geometry data and the TLV encapsulation structure including the attribute data are stored in a sample of the single track and TLV encapsulation structures including the parameter sets are stored in at least one of a sample entry and the sample of the single track.

11. The apparatus of claim 9,
wherein, when the G-PCC bitstream is stored in the multiple tracks, the TLV encapsulation structure including the geometry data and the TLV encapsulation structure including the attribute data are stored in a sample of a separate track, respectively, and TLV encapsulation structures including the parameter sets are stored in at least one of a sample entry and the sample of the separate track, respectively.

12. The apparatus of claim 11,
wherein the sample entry of the separate track, respectively, further includes a box for indicating whether a corresponding track carries the TLV encapsulation structure including the geometry data or the TLV encapsulation structure including the attribute data.

13. A point cloud data transmission apparatus, the apparatus comprising:
an acquirer to acquire point cloud data;
a geometry encoder to encode geometry data including positions of points of the point cloud data;
an attribute encoder to encode attribute data including attribute values of the points of the point cloud data based on the geometry data;
an encapsulator to encapsulate a geometry-based point cloud compression (G-PCC) bitstream that includes the encoded geometry data, the encoded attribute data and signaling data into a file; and
a transmitter to transmit the file,
wherein the signaling data includes parameter sets,
wherein the G-PCC bitstream is comprised of type-length-value (TLV) encapsulation structures,
wherein each of the TLV encapsulation structures consists of type information, length information and a payload,
wherein the type information indicates a type of data in the payload, the length information indicates a length of the payload and the payload includes one of the encoded geometry data, the encoded attribute data, and each of the parameter sets, and
wherein the G-PCC bitstream is stored either in a single track or in multiple tracks of the file by the TLV encapsulation structure.

14. The apparatus of claim 13,
wherein, when the G-PCC bitstream is stored in the single track, a TLV encapsulation structure including the geometry data and a TLV encapsulation structure including the attribute data are stored in a sample of the single track and TLV encapsulation structures including the parameter sets are stored in at least one of a sample entry and the sample of the single track.

15. The apparatus of claim 13,
wherein, when the G-PCC bitstream is stored in the multiple tracks, a TLV encapsulation structure including the geometry data and a TLV encapsulation structure including the attribute data are stored in a sample of a separate track, respectively, and TLV encapsulation structures including the parameter sets are stored in at least one of a sample entry and the sample of the separate track, respectively.

16. The apparatus of claim 15,
wherein the sample entry of the separate track, respectively, further includes a box for indicating whether a corresponding track carries the TLV encapsulation structure including the geometry data or the TLV encapsulation structure including the attribute data.

* * * * *